United States Patent
Agarwal et al.

(10) Patent No.: US 12,073,024 B1
(45) Date of Patent: Aug. 27, 2024

(54) SYSTEMS AND METHODS OF CONTROLLING ACTIVATION OF PHYSICAL OR VIRTUAL KEYBOARD KEYS USING AN ADJUSTABLE ELECTROSTATICALLY-CONTROLLED ACTUATOR, AND METHODS OF MANUFACTURING ELECTROSTATICALLY-CONTROLLED ACTUATORS FOR USE THEREWITH

(71) Applicant: META PLATFORMS TECHNOLOGIES, LLC, Menlo Park, CA (US)

(72) Inventors: Priyanshu Agarwal, Kirkland, WA (US); Nicholas Colonnese, Kirkland, WA (US); Li Yao, Bothell, WA (US); Harsha Prahlad, Bellevue, WA (US); Tianshu Liu, Redmond, WA (US); Felippe Jose Pavinatto, Lynnwood, WA (US); Daniele Piazza, Redmond, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 18/115,697

(22) Filed: Feb. 28, 2023

Related U.S. Application Data

(60) Provisional application No. 63/315,490, filed on Mar. 1, 2022.

(51) Int. Cl.
*G06F 3/023* (2006.01)
*G06F 3/01* (2006.01)
*H03K 17/955* (2006.01)

(52) U.S. Cl.
CPC .............. *G06F 3/016* (2013.01); *G06F 3/014* (2013.01); *G06F 3/023* (2013.01); *H03K 17/955* (2013.01)

(58) Field of Classification Search
CPC .......... G06F 3/016; G06F 3/014; G06F 3/023; H03K 17/955
See application file for complete search history.

(56) References Cited

U.S. PATENT DOCUMENTS

2009/0096746 A1* 4/2009 Kruse .................... G06F 3/016
 340/407.1
2011/0007035 A1* 1/2011 Shai ..................... G06F 3/0304
 345/179

(Continued)

*Primary Examiner* — Temesghen Ghebretinsae
*Assistant Examiner* — Sosina Abebe
(74) *Attorney, Agent, or Firm* — Morgan, Lewis & Bockius LLP

(57) ABSTRACT

Systems and methods of controlling activation of different input elements using an actuator are disclosed herein. An example method includes in response to detecting that a representation of a finger is located by a first input element: obtaining information regarding a first amount of force to actuate the first input element, and causing adjustment of a physical characteristic of an actuator so that a first amount of force directed to a component of the actuator activates the first input element. In response to detecting that the representation of the finger is located by a second input element, the method also includes: obtaining information regarding a second amount of force distinct from the first amount of force, and causing adjustment of the physical characteristic of the actuator so that the second amount of force directed to the component of the actuator activates the second input element.

20 Claims, 26 Drawing Sheets

(56) References Cited

U.S. PATENT DOCUMENTS

| | | | |
|---|---|---|---|
| 2015/0277559 A1* | 10/2015 | Vescovi | G06F 3/017 |
| | | | 345/173 |
| 2016/0077587 A1* | 3/2016 | Kienzle | G06F 3/033 |
| | | | 345/156 |
| 2017/0003762 A1* | 1/2017 | Ishii | G04G 21/02 |
| 2017/0024008 A1* | 1/2017 | Kienzle | G06F 3/017 |
| 2017/0285848 A1* | 10/2017 | Rosenberg | G06F 3/04883 |
| 2020/0026352 A1* | 1/2020 | Wang | G06F 3/044 |
| 2020/0142497 A1* | 5/2020 | Zhu | G06F 1/163 |
| 2020/0379593 A1* | 12/2020 | de Vries | G06F 3/04883 |
| 2022/0113800 A1* | 4/2022 | Liu | G06F 3/014 |

\* cited by examiner

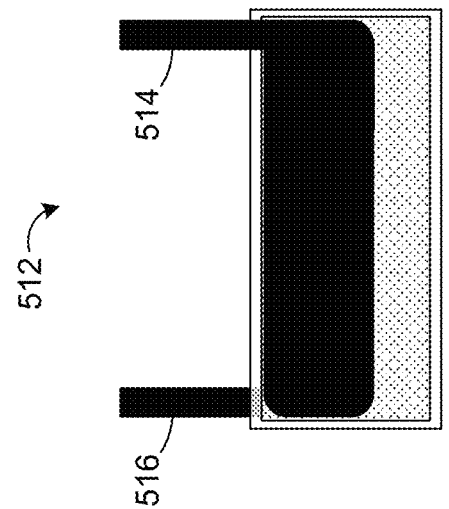
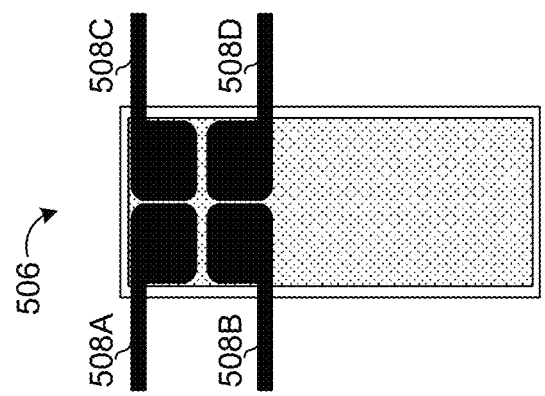
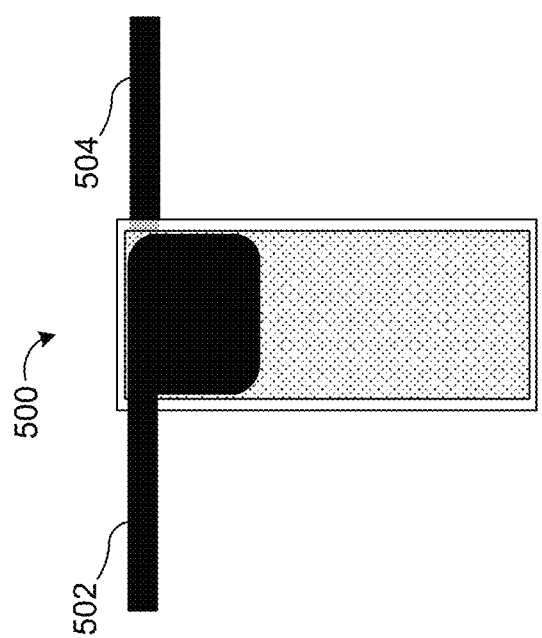
Figure 5C
Figure 5B
Figure 5A

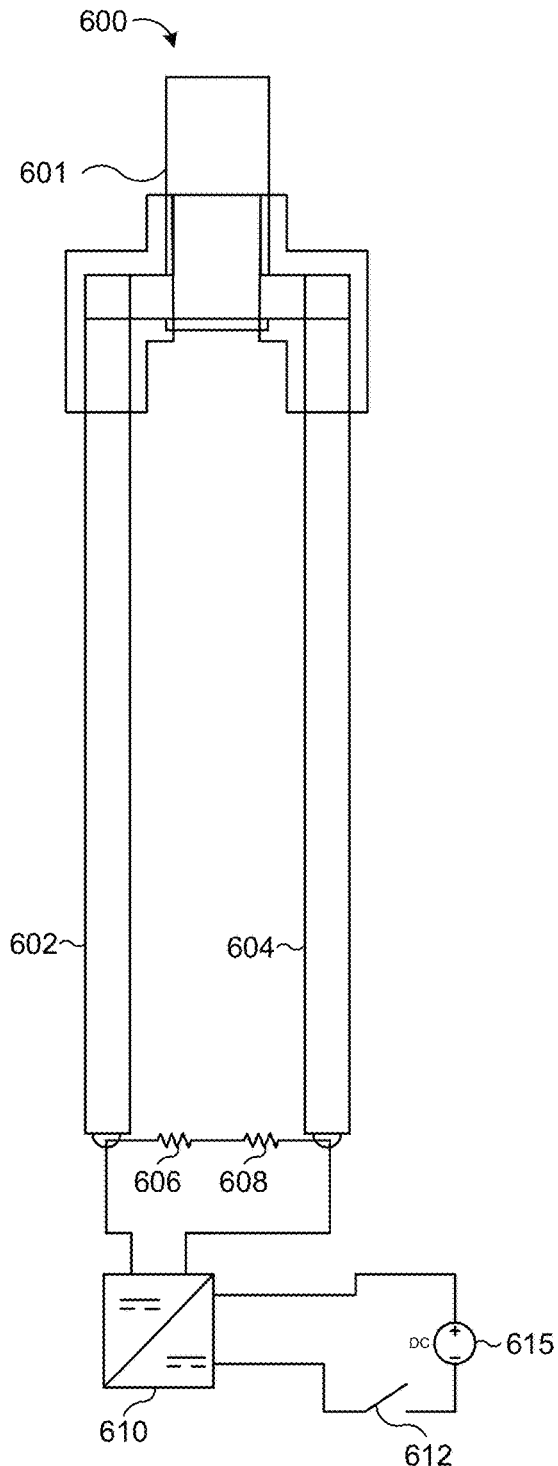
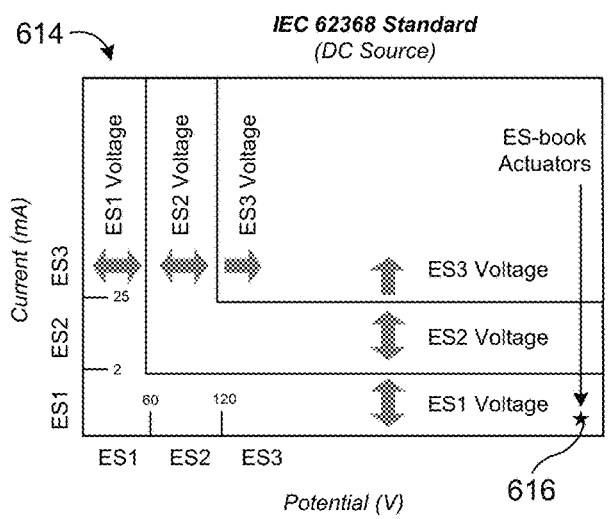
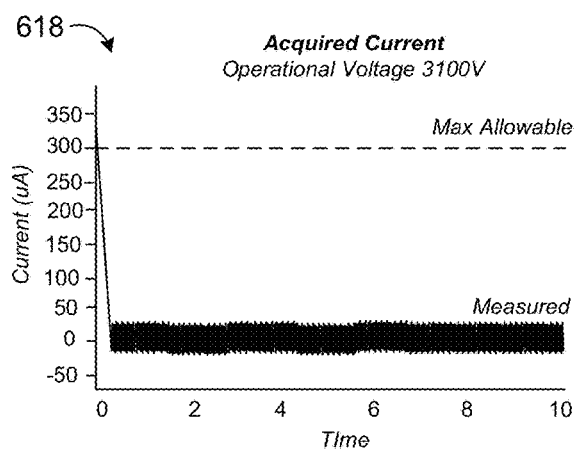
Figure 6B
Figure 6A

SYSTEMS AND METHODS OF CONTROLLING ACTIVATION OF PHYSICAL OR VIRTUAL KEYBOARD KEYS USING AN ADJUSTABLE ELECTROSTATICALLY-CONTROLLED ACTUATOR, AND METHODS OF MANUFACTURING ELECTROSTATICALLY-CONTROLLED ACTUATORS FOR USE THEREWITH

RELATED APPLICATIONS

This application claims priority to U.S. Provisional Application Ser. No. 63/315,490, filed Mar. 1, 2022, which is hereby incorporated herein by reference in its entirety.

TECHNICAL FIELD

The present disclosure relates generally to controlling activation of physical or virtual keyboard keys using actuators (e.g., using an electrostatically-controlled actuator in lieu of a electro-mechanical switch), and more particularly to controlling activation of physical or virtual keyboard keys using electrostatically-controlled actuators (coupled with components of wearable devices) that can be adjusted to simulate various characteristics (including input-recognition characteristics, such as an amount of force needed to active a key, and input-response characteristics, such as a haptic response generated after a key has been activated) of different objects in an artificial-reality environment (e.g., the same electrostatically-controlled actuator can be configured to simulate characteristics of a key on a computer keyboard in an artificial reality environment, or can be configured simulate characteristics of other switchable objects (e.g., a virtual mouse, a virtual light switch, etc.)).

BACKGROUND

Many interactions with artificial-reality environments place a heavy reliance on a user's visual sense, including for some interactions with pressable objects such as keyboard keys. As such, some interactions with pressable objects often fail to simulate real-world interactions that would occur in the physical world as a user's sense of touch is not fully utilized to produce a real-world-like simulation. Further, the ability to make dynamic adjustments to either or both of input-recognition and input-response characteristics (e.g., a single actuator used to simulate characteristics of different types of keyboard keys having different input-recognition and input-response characteristics) requires further exploration to achieve fully immersive interactions with pressable objects.

Even beyond artificial-reality environments, the ability to simulate various input-recognition and input-response characteristics (e.g., using the electrostatically-controlled actuators discussed herein), including for individual keyboard keys of a physical keyboard would be advantageous, e.g., because keyboards could then be more easily adapted to suit the preferences of individual users. Many physical keyboards often are built with factory-set characteristics that do not allow for user-specific modifications, and, even if certain modifications are possible, they often require the purchase and installation of different physical components and cannot be adjusted on-the-fly to suit the preferences of different users.

As such, there is a need to address one or more of the above-identified challenges.

SUMMARY

To address one or more of the challenges discussed above, an electrostatically-controlled actuator can be coupled with a wearable device and can be configured to simulate interactions with physical objects (including both input-recognition and input-response characteristics), which reduces the reliance on the user's visual sense to interact with an artificial reality. For example, a user can interact with different keys on a virtual keyboard, via touch-typing, and the system (which can include a controlling device and a wearable device with which actuators can be coupled) can be configured to adjust input-recognition and/or input-response characteristics as the user's fingers move over the different keys (which can by virtual or physical keyboard keys). To further simulate interactions with various different input elements (e.g., virtual input elements or objects presented via an artificial-reality system), the electrostatically-controlled actuator can be configured to adjust one or more characteristics (e.g., adjusting an input-recognition characteristic that is based on voltage applied to an electrostatically-controlled actuator, which in turn can make it easier or more difficult to activate a keyboard key or other input object) based on whether the electrostatically-controlled actuator is over a first input element (e.g., a first key of a virtual or physical keyboard) or another input element (e.g., a mouse or a different key of a virtual or physical keyboard), which other input element is associated with different input-recognition and input-response characteristics as compared to those associated with the first input element. By doing this, the system can be configured to quickly make adjustments that allow for interactions with many different virtual objects (e.g., the adjustments can also occur at one actuator, which allows for a system in which a component of an actuator (which can be coupled to a wearable glove near a user's finger) can be dynamically adjusted as the user's finger moves to be near various input elements.

The techniques and components described herein apply to interactions with both virtual and physical input elements. For example, an electrostatically-controlled actuator can be placed beneath a keycap of a keyboard in place of a traditional mechanical switch. As one example, this allows for the electrostatically-controlled actuator to be adjusted to change typing feel (e.g., input-recognition characteristics such as a voltage applied at the electrostatically-controlled actuator that controls how much force needs to be applied at a component of the electrostatically-controlled actuator to active a respective input element. In some embodiments or circumstances, to the electrostatically-controlled actuator can also be configured to reject inputs, such as when a num-lock command has been received and the component of the electrostatically-controlled actuator is adjusted such that any amount of force applied at the component of the actuator does not cause activation of the respective input element.

Further, the wearable devices described herein can also improve users' interactions with artificial-reality environments and also improve user adoption of artificial-reality environments more generally by providing a form factor that is socially acceptable and compact, thereby allowing the user to wear the device throughout their day (and thus making it easier to interact with such environments in tandem with (as a complement to) everyday life). In the descriptions that follow, references are made to artificial-reality environments, which include, but are not limited to, virtual-reality (VR) environments (including non-immersive, semi-immersive, and fully-immersive VR environments), augmented-reality environments (including marker-based augmented-reality environments, markerless augmented-reality environments, location-based augmented-reality environments, and projection-based augmented-reality environments), hybrid reality, and other types of mixed-reality environments. As the skilled artisan will appreciate upon reading the descriptions provided herein, the novel wearable devices described herein can be used with any of these types of artificial-reality environments.

As an introductory summary, a few example summary aspects are provided below. In particular, in a first aspect (prefaced with AA below), a method that allows for activating keyboard keys (e.g., virtual or physical keys) using electrostatically-controlled actuators is provided. Some aspects discussed herein are applicable to actuators other than just electrostatically-controlled actuators. Thus, in a second aspect, (prefaced with A below), a method that allows for monitoring how close a representation of a user's finger is relative to input elements is provided, such that once the representation of the user's finger is determined to be within a predefined distance of an input element, then a component of an actuator can be adjusted based on how much force is required to activate the input element (and the same component of the actuator can be adjusted as the representation of the user's finger moves to within the predefined distance of some other input element). As mentioned above, the actuators discussed herein can be electrostatically-controlled actuators. In a third aspect, a method of manufacturing one of these electrostatically-controlled actuators is described. In a fourth and final aspect summarized here, a wearable system is provided that allows for using an electrostatically-controlled actuator coupled with a wearable structure (e.g., a wearable glove) for both recognition of input commands and for responding to those input commands (e.g., with a haptic response).

Systems and computer-readable storage media configured to perform or cause perform of the methods introduced above are also summarized below.

The first aspect will be discussed below, followed by the three other aspects in turn.

(AA1) In accordance with some embodiments, a method of controlling activation of a keyboard key using an electrostatically-controlled actuator comprises providing a keyboard key that is activated based on inputs directed to a component of an electrostatically-controlled actuator, the electrostatically-controlled actuator having a first state when less than a threshold amount of force is present at the component of the electrostatically-controlled actuator and a second state when more than the threshold amount of force is present at the component of the electrostatically-controlled actuator. The method includes detecting an input directed to the keyboard key that applies at least the threshold amount of force at the component of the electrostatically-controlled actuator to cause the electrostatically-controlled actuator to have the second state. The method also includes in response to the detecting, causing an input command that is associated with the keyboard key to be performed.

(AA2) In some embodiments of AA1, the keyboard key is a part of a physical keyboard.

(AA3) In some embodiments of AA1-AA2, the keyboard key is part of a virtual keyboard display in an artificial-reality environment and the electrostatically-controlled actuator is coupled with a wearable device worn by a user.

(AA4) In some embodiments of AA1-AA3, the wearable device is a glove.

(AA5) In some embodiments of AA1-AA4, in response to the input directed to the keyboard key that applies at least the threshold amount of force, the electrostatically-controlled actuator moves to the second state when fluid moves from a first place within the electrostatically-controlled actuator to another place within the electrostatically-controlled. The first state can be referred to a zipped state and the second state can be referred to as an unzipped state. Other states are also contemplated, including an transitional state in which the actuator is transitioning between the first state to the second state or the second state to the first state. Another example state is a state in which no voltage is applied at the actuator, such that the actuator is configured to reject activation of a certain input element (e.g., when a nums-lock condition is present and other keys are displayed by move associated actuators to their no-voltage states).

(AA6) In some embodiments of AA1-AA5, the method comprises: providing another keyboard key that is activated based on inputs directed to another component of another electrostatically-controlled actuator, the other electrostatically-controlled actuator having a third state when less than another threshold amount of force, different than the threshold amount of force, is present at the other component of the other electrostatically-controlled actuator and a fourth state when more than the other threshold amount of force is present at the other component of the other electrostatically-controlled actuator, where the other threshold amount of force is distinct from the threshold amount of force. The third and fourth states can be analogous to the first and second states, but are denoted using different adjectives since they described a different electrostatically-controlled actuator.

(AA7) In some embodiments of AA1-AA6, the component of the electrostatically-controlled actuator is coupled with a first portion of a wearable glove that is in contact with a user's first finger, and the other component of the electrostatically-controlled actuator is coupled with a second portion of the wearable glove that is in contact with a user's second finger. In other words, different electrostatically-controlled actuators can be associated with different fingers, e.g., when a wearable glove is worn and the glove includes coupled electrostatically-controlled actuators in each of the fingertips or finger portions more generally.

(AA8) In some embodiments of AA1-AA7, the method comprises, after the detecting, providing a haptic response via the component of the electrostatically-controlled actuator. In other words, the same component of the electrostatically-controlled actuator can be used for both input recognition (e.g., application of force to the component causes activation of an input element) and input response (e.g., feedback provided after an input element has been activated).

(AA9) In some embodiments of AA1-AA8, the threshold amount of force is a first threshold amount of force, and the first threshold amount of force is associated with a first subset of keys on a keyboard, and a second threshold amount of force (distinct from the first threshold amount of force) is associated with a second subset of keys on a keyboard. In some embodiments or circumstances, the first subset of keys includes the alphanumeric keys on the keyboard, while the second subset of keys includes the modifier keys of the keyboard (e.g., caps-lock, nums-lock, shift, etc. keys that modify the inputs that can be provided using the first subset of keys).

(AA10) In some embodiments of AA1-AA9, the method comprises, in response to determining that the keyboard key should be disabled, causing the component of the electrostatically-controlled actuator to remain only in a third state (e.g., the no-voltage state mentioned above) in which any amount of force at the component of the electrostatically-controlled actuator does not cause the component of the electrostatically controlled-actuator to change its state. In some embodiments, the third state is distinct from the first and second states, as was briefly described above.

(AA11) In some embodiments of AA1-AA10, the keyboard key is a numeric key and determining that the keyboard key should be disabled includes receiving an instruction to disable all numeric keys.

(AA12) In some embodiments of AA1-AA11, the electrostatically-controlled actuator is coupled with a wearable glove that is worn by a user and the actuator is configured to be controlled by a processor of the wearable glove or via a computing device that is coupled with the wearable glove (e.g., the computing device can be a console or other controlling device of an artificial-reality system).

(AA14) In some embodiments of AA1-AA13, the electrostatically-controlled actuator draws a steady state current less than 25 microamps (e.g., while it is in the first or the second state, but not while it is in the third (no-voltage) state mentioned above).

(AA15) In some embodiments of AA1-AA14, the electrostatically-controlled actuator is coupled to a silicone grounding pad.

(AA16) In some embodiments of AA1-AA15, the electrostatically-controlled actuator is controlled via a high voltage amplifier.

(AA17) In some embodiments of AA1-AA16, the high voltage amplifier is a high voltage DC-DC converter.

(AA18) In some embodiments of AA1-AA17, the electrostatically-controlled actuator is configured to provide vibration that simulates a hard stop of a keypress (e.g., as the key bottoms out). In one example of this, the force and vibration feedback can be simultaneously rendered from the device using a DC biased bipolar voltage signal. This can improve the user's perception of key press using the actuator.

(BB1) In accordance with some embodiments, a non-transitory computer-readable storage medium including instructions that, when executed by one or more processors of a computing device, cause the computing device to perform any of AA1-AA18.

(CC1) In accordance with some embodiments, a system comprising a computing device and a wearable glove with actuators, the wearable glove configured to be controlled by the computing device, the system configured to perform any of A1-AA18.

(DD1) A system comprising a computing device and a wearable glove with actuators, the wearable glove configured to be controlled by the computing device, the system including means for performing or causing performance of any of AA1-AA18.

Having summarized the first aspect generally related to use of electrostatically-controlled actuators with keyboard keys above, the second aspect (generally related to adjusting a component of an actuator as determinations are made as to which input elements a representation of a user's finger is near, including adjusting a same component of an actuator based on the representation of the user's finger being near different input elements) is now summarized.

(A1) In accordance with some embodiments, a method of adaptively controlling activation of different input elements, comprises detecting that a representation of a user's finger is located within a predefined distance (e.g., within a value in the range of 0-10 mm) of a first input element. The method also includes, in response to detecting that the representation of the user's finger is located within the predefined distance of a first input element (additional details regarding this operation are provided below in reference to FIG. 15 and, in particular, step 1506): obtaining (additional details regarding this operation are provided below in reference to FIG. 15 and, in particular, step 1508) information regarding a first amount of force needed to actuate the first input element, and causing (additional details regarding this operation are provided below in reference to FIG. 15 and, in particular, step 1510) adjustment of a physical characteristic of an actuator associated with the first input element such that an input having the first amount of force directed to a component of the actuator would cause activation of the first input element. The method further comprises detecting (additional details regarding this operation are provided below in reference to FIG. 15 and, in particular, step 1511) that the user's finger is located within a predefined distance of a second input element that is distinct from the first input element. The method additionally includes, in response to detecting that the user's finger is located within a predefined distance of a second input element (additional details regarding this operation are provided below in reference to FIG. 15 and, in particular, step 1512): obtaining (additional details regarding this operation are provided below in reference to FIG. 15 and, in particular, step 1514) information regarding a second amount of force needed to actuate the second input element, the second amount of force being distinct from the first amount of force, and causing (additional details regarding this operation are provided below in reference to FIG. 15 and, in particular, step 1516) adjustment of the physical characteristic of the actuator associated with the second input element such that an input having the second amount of force directed to the component of the actuator would cause activation of the second input element. In other words, a same actuator can be adjusted to allow for activations of different input elements, e.g., one input element (such as the first input element in this example) can be configured to be more difficult to press (e.g., more voltage is applied to the actuator to make it more difficult to press down on the component of the actuator when the representation of the user's finger is within the predefined distance of the first input element)) and the other input element (such as the second input element in this example) can be configured to be easier to press (e.g., a relatively smaller amount of voltage is applied to actuator to make it easier to press down on the component of the actuator when the representation of the user's finger is within the predefined distance of the second input element).

(A2) In some embodiments of A1, the method comprises, while the actuator is associated with the first amount of force: detecting an input having the first amount of force applied by the user's finger to the component of the actuator (for physical input elements, this force can be applied directly to the input element, such as a keyboard key, while for virtual input elements, this force can be applied to a simulated or virtual version of an object, such as a representation of a keyboard key that is rendered using an artificial-reality system), and activating the first input element to cause an input command to be performed.

(A3) In some embodiments of A1-A2, the method comprises, in response to activating the first input element to cause the input command to be performed, displaying a result of the input command in an artificial-reality environment (e.g., a character associated with a keyboard key can be presented in the artificial-reality environment after the first input element has been activated).

(A4) In some embodiments of A1-A3, the method comprises, after activating the first input element and while the actuator is associated with the second amount of force: detecting an input having the second amount of force applied by the user's finger to the component of the actuator, and activating the second input element to cause a different input command, distinct from the input command, to be performed.

(A5) In some embodiments of A1-A4, the method comprises, in response to activating the second input element to cause the different input command to be performed, displaying a result of the different input command in an artificial-reality environment.

(A6) In some embodiments of A1-A5, the adjustment of the physical characteristic of the actuator includes causing adjustment of a voltage that is provided to a portion of the component of the actuator.

(A7) In some embodiments of A1-A6, the method further comprises: after the input having the first amount of force is no longer applied by the user's finger to the component of the actuator, providing a first haptic response to the user's finger via the component of the actuator (e.g., the first haptic response can be provided by making a number of different adjustments to a voltage that is provided to the portion of the component of the actuator to cause the component of the actuator to produce a vibrotactile sensation that is felt by the user's finger), and after the input having the second amount of force is no longer applied by the user's finger to the component of the actuator, providing a second haptic response to the user's finger via the component of the actuator, the second haptic response being distinct from the first haptic response. Stated another way, the component of the actuator can not only be used for input-recognition purposes, but can also be used for input-response purposes, such that different input responses can be provided via the component of the actuator after recognition of inputs at different input elements.

(A8) In some embodiments of A1-A7, the component of the actuator is a bladder that includes a dielectric substance, the portion of the component of the actuator is coupled with two or more electrodes, the voltage is adjusted for at least one of the two or more electrodes, and the component of the actuator includes an additional portion to which force from the user's finger is applied.

(A9) In some embodiments of A1-A8, the voltage is independently adjustable at each of the two or more electrodes to cause changes in an amount of force directed to the component of the actuator that would cause activation of a respective input element that is located within the predefined distance of a respective input element.

(A10) In some embodiments of A1-A9, the method also includes, detecting that a representation of a different finger of the user is located within an additional predefined distance (e.g., which can be the same or different than the predefined distance discussed above, such that these predefined distances can be input-element specific and/or can be specific to which finger is near the input element, or a combination of both) of a third input element that is distinct from the first and second input elements. The method also includes, in response to detecting that the representation of the user's different finger is located within the additional predefined distance of the third input element and while the actuator is associated with the first amount of force or the second amount of force: obtaining information regarding a third amount of force needed to actuate the third input element. The method additionally includes causing adjustment of a physical characteristic of another actuator associated with the user's different finger (e.g., the other actuator is located in a finger portion of a wearable glove, the finger portion being worn over the user's different finger) such that an input having the third amount of force directed to a component of the other actuator would cause activation of the third input element.

(A11) In some embodiments of A1-A10, the first input element and the second input element are presented to the user as virtual keys within an artificial-reality environment.

(A12) In some embodiments of A1-A11, each of the first input element and the second input element is one of: a light switch, a keyboard key on a mobile device, a keyboard key on a detached keyboard, a keyboard key integrated into a housing of a laptop, a trackpad button, or a mouse button.

(B1) In accordance with some embodiments, a non-transitory computer-readable storage medium includes instructions that, when executed by one or more processors of a computing device, cause the computing device to perform any of A1-A12. In some embodiments, the wearable glove is the computing device, but in other examples the computing device is another device in communication with the wearable glove (such as a controlling device, or a console device, for an artificial-reality system).

(C1) In accordance with some embodiments, a system comprises a computing device and a wearable glove with actuators, the wearable glove configured to be controlled by the computing device, the system configured to perform any of A1-A12.

(D1) In accordance with some embodiments, a system comprises a computing device and a wearable glove with actuators, the wearable glove configured to be controlled by the computing device, the system including means for performing or causing performance of any of A1-A12.

Having now summarized the first and second aspects, the third aspect (related to a method of manufacturing electrostatically-controlled actuators) is summarized below.

(I1) In accordance with some embodiments, a method of manufacturing an electrostatically-controlled actuator is provided. The method comprises, providing first and second dielectric layers. The method further comprises, printing at least one electrode on each of the first dielectric layer and the second dielectric layer, such that (i) a first electrode is printed on a portion, less than all, of the first dielectric layer and a second electrode is printed on a portion, less than all, of the second dielectric layer. The method additionally comprises, coupling the first and second dielectric layers, such that the first and second dielectric layers form an actuator pouch, the actuator pouch including an open end, as well as distributing a predetermined amount of a dielectric substance into the actuator pouch via the open end. The method also comprises, sealing the open end of the actuator pouch such that the predetermined amount of the dielectric substance is sealed within the actuator pouch, and coupling a first conductor to the first electrode and a second conductor to the second electrode.

(I2) In some embodiments of I1, the method further comprises disposing an insulating layer over at least the portion of the first dielectric layer and over at least the portion of the second dielectric layer.

(I3) In some embodiments of I1-I2, the method further comprises, coupling a controller to the first and second conductors, the controller configured to control provision of a voltage to the first conductor or the second conductor. In some embodiments, the first and second electrodes, when the controller provides a voltage via the first conductor or the second conductor, are attracted via an electrostatic force to one another such that the first and second electrodes are drawn to each other only at the portions of the first and second dielectric layers, respectively.

(I4) In some embodiments of I1-I3, while the voltage is present at the first and second electrodes, responsive to a force applied over another portion of the first dielectric layer or the second dielectric layer, the force satisfying a separation-force threshold, the portion of the first dielectric layer and the portion of the second dielectric layer separate from each other causing the predetermined amount of the dielectric substance to move within the actuator pouch.

(I5) In some embodiments of I1-I4, the separation-force threshold is less than approximately 0.6 N (e.g., 0.5 N to 0.7 N).

(I6) In some embodiments of I1-I5, the separation-force threshold is defined by a user.

(I7) In some embodiments of I1-I6, a continued separation force required to keep separating the portion of the first dielectric layer from the portion of the second dielectric layer dielectric is at least 70 percent less compared to the separation-force threshold.

(I8) In some embodiments of I1-I7, the voltage, after the force has been applied, is configured to be provided by the controller at a predetermined frequency that causes the actuator pouch to vibrate, thereby providing a haptic response (in addition to the predetermined frequency, changes in the voltage can also be made to further alter the haptic response).

(I9) In some embodiments of I1-I8, the controller is configured to cause the actuator pouch to provide the haptic response and vibrate simultaneously.

(I10) In some embodiments of I1-I9, the controller is configured to detect a change in the voltage to determine a capacitance value.

(I11) In some embodiments of I1-I10, the controller is configured to use the change in the voltage is to determine the force provided based, at least in part, on the capacitance value provided by a force-displacement-capacitance model.

(I12) In some embodiments of I1-I11, the controller is configured to use the change in the voltage to determine the force provided based, at least in part, on a displacement of the actuator pouch and the voltage.

(I13) In some embodiments of I1-I12, the controller is configured to detect a change in the voltage for contact-sensing purposes. Thus, in some embodiments, in addition to the electrostatically-controlled actuator being configured to serve input-recognition and input-response purposes, it can further be configured to function as a proximity or capacitance sensor by monitoring the capacitance values.

(I14) In some embodiments of I1-I13, the first electrode printed on the portion of the first dielectric layer is one of a plurality of first electrodes and the second electrode printed on the portion of the second dielectric layer is one of a plurality of second electrodes, wherein voltages provided to the plurality of first electrodes are configured to be independently controlled and voltages provided to the plurality of second electrodes are configured to be independently controlled as well.

(I15) In some embodiments of I1-I14, the portion of the first dielectric layer and the portion of the second dielectric layer are both in contact with the dielectric substance.

(I16) In some embodiments of I1-I15, the predetermined amount of the dielectric substance is selected during manufacturing of the electrostatically-controlled actuator based on dimensions of the actuator pouch.

(I17) In some embodiments of I1-I16, the predetermined amount of the dielectric substance is one of vegetable oil, silicone oil, and segregated hydrofluoroether.

(I18) In some embodiments of I1-I17, the first and second electrodes have a width of approximately 14 mm (e.g., between 12-16 mm) and a length of approximately 16.5 mm (e.g., between 14.5 to 18.5 mm).

(I19) In some embodiments of I1-I18, the first and second dielectric layers are made of one of thermoplastic co-polyester elastomer, conductive urethane, polypropylene, and piezo copolymers.

(I20) In some embodiments of I1-I19, the method further comprises, coupling the first and second conductors with a high voltage amplifier configured to provide a voltage to one or both of the first electrode and the second electrode.

(I21) In some embodiments of I1-I20, the high voltage amplifier is a unipolar amplifier capable of generating the voltage in a single polarity.

(I22) In some embodiments of I1-I21, the high voltage amplifier is a bipolar amplifier capable of generating respective voltages with both a positive or a negative polarity.

(I23) In some embodiments, a wearable glove can be provided that includes finger portions each having one or more of the electrostatically-controlled actuators manufactured in accordance with any of I1-I22. In some embodiments the actuators or electrostatically-controlled actuators of the first and second aspects discussed above can be manufactured in accordance with any of I1-I22.

Having thus summarized the third aspect, the fourth aspect is now summarized below.

(J1) In accordance with some embodiments, a wearable system for generating a haptic response comprises: a wearable structure configured to be worn by a user, and one or more electrostatically-controlled actuators. Each electrostatically controlled actuator includes a high voltage amplifier coupled to an actuator pouch, the high voltage amplifier configured to provide a voltage to at least two opposing electrodes of the actuator pouch, the voltage creating an electrostatic force that attracts the at least two opposing electrodes to one another to close a portion of the actuator pouch and leave another portion of the actuator pouch filled with a dielectric substance. The actuator pouch is coupled to a portion of the wearable structure, where the actuator pouch is configured to, upon application of a force satisfying a force threshold at the other portion of the actuator pouch: generate a haptic response, and being to open part of the portion of the actuator pouch such that it fills with the dielectric substance. The one or more processors are configured to receive data about the opening of the part of the portion of the actuator pouch to provide one or more input commands based on the data to a computing device to cause the computing device to perform the one or more input commands.

(J2) In some embodiments of J1, the electrostatically-controlled actuator is configured in accordance with any of I1-I22.

(J3) In some embodiments of J1-J2, the force is generated as a user's finger pushes the actuator pouch towards a surface.

(J4) In some embodiments of J1-J3, the one or more processors are configured to actively adjust the actuator pouch based on the force.

(J5) In some embodiments of J1-J4, actively adjusting the actuator pouch based on the force includes, upon detection of the force satisfying the force threshold, providing instructions to the high voltage amplifier to forgo providing the voltage.

(J6) In some embodiments of J1-J5, actively adjusting the actuator pouch based on the force includes, upon detection of the force satisfying the force threshold being removed, providing instructions to the high voltage amplifier to provide the voltage.

(J7) In some embodiments of J1-J6, the system also includes a power source (e.g., battery or capacitor) configured to power at least the high voltage amplifier and the one or more processors of the wearable system.

(J8) In some embodiments of J1-J7, the processor is configured to provide a steady state current less than 25 μA to the electrostatically-controlled actuator during operation.

(J9) In some embodiments of J1-J8, the system also includes a silicone pad grounding the electrostatically-controlled actuator.

(J10) In some embodiments of J1-J9, a computing device is caused to perform the one or more input commands in an artificial-reality environment.

(J11) In some embodiments of J1-J10, the force satisfying the force threshold is predicted based on a determination that a user's finger is in proximity to a virtual keyboard in an artificial-reality environment.

(J12) In some embodiments of J1-J11, the high voltage amplifier is a high voltage DC-DC converter.

(J13) The system of any of J1-J11 can also be configured to perform or cause performance of the methods of any of AA1-AA18 and A1-A12. Performance of those methods can be caused based on execution of instructions stored in non-transitory computer-readable storage medium or media (which can be associated with the wearable structure, such as a wearable glove and/or associated with a computing device, such as a device used to render an artificial-reality environment to a user) that is communicatively coupled with the wearable glove).

The features and advantages described in the specification are not necessarily all inclusive and, in particular, certain additional features and advantages will be apparent to one of ordinary skill in the art in view of the drawings, specification, and claims. Moreover, it should be noted that the language used in the specification has been principally selected for readability and instructional purposes.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, illustrate pertinent features of the present disclosure. The description may admit to other effective features as the person of skill in this art will appreciate upon reading this disclosure.

FIG. 5A-5C illustrate a few example electrostatically-controlled actuators with different electrode configurations to produce different input-response characteristics (e.g., achieve different haptic sensations, in accordance with some embodiments).

FIG. 6A illustrates a circuit diagram for an electrostatic zipping actuator using a high voltage DC-DC converter, in accordance with some embodiments.

FIG. 6B illustrates two graphs used to illustrate that the circuit design of FIG. 6A ensures that the electrostatic zipping actuators discussed herein can be safely operated in close proximity to humans (e.g., to a human finger), in accordance with some embodiments.

In accordance with common practice, like reference numerals denote like features throughout the specification and figures.

DETAILED DESCRIPTION

Having briefly summarized each of the figures, a detailed description of each of the figures follows next.

Figure 1A:
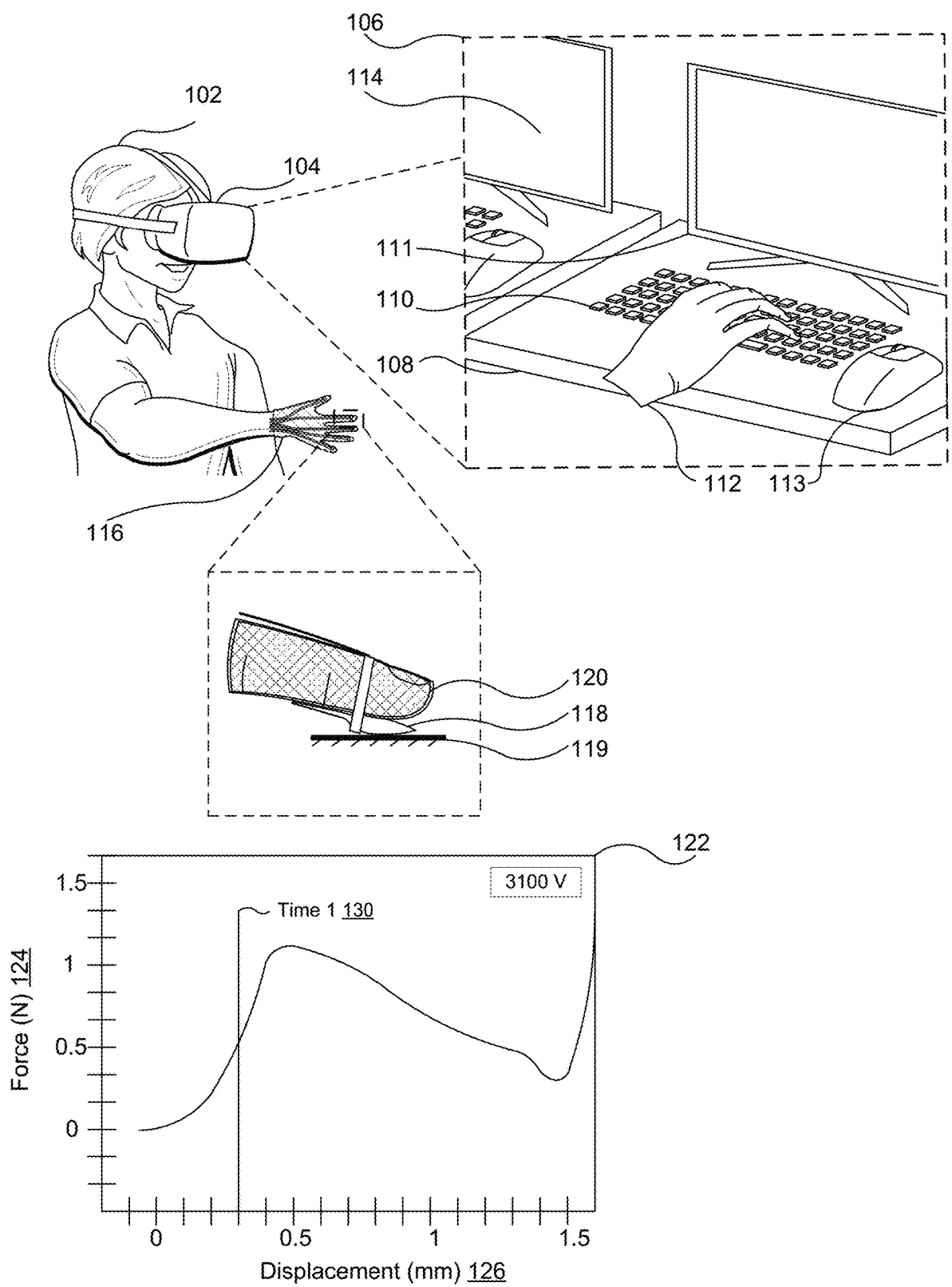
FIGS. 1A-1F illustrate a user interacting with an input element (e.g., a keyboard key) presented in a first type of artificial-reality environment, the input element being activated based on force provided by a user that is directed to a component of an actuator that is coupled with a wearable device, in accordance with some embodiments.

FIGS. 1A-1F illustrate a user interacting with an input element (e.g., a keyboard key) presented in a first type of artificial-reality environment, the input element being activated based on force provided by a user that is directed to a component of an actuator that is coupled with a wearable device, in accordance with some embodiments. FIG. 1A illustrates a user 102 wearing an artificial reality headset 104 that displays, via a display component (not pictured), an artificial reality 106, that includes a first virtual office desk 108 that includes a virtual keyboard 110, a virtual display device 111, a virtual mouse 113, and a virtual hand 112 corresponding to a hand 103 of the user 102. In some embodiments, a second virtual office setup 114 is shown, illustrating that additional users can be brought into the same virtual reality (e.g., akin to an open office setup with other coworkers).

FIG. 1A also shows the user 102 wearing a glove 116, the glove 116 includes one or more electrostatically-controlled actuator(s) 118 (also referred to as electrostatic actuator(s), electrostatically zipping actuator(s), and ES-book actuator(s)) for providing feedback corresponding to the one or more input elements/items in the artificial reality 106. In some embodiments, an electrostatically-controlled actuator 118 is placed beneath a fingertip 120 of the user 102. In some embodiments, an electrostatically-controlled actuator 118 is placed under each fingertip of a user hand(s). An electrostatically-controlled actuator 118, as will be discussed in detail in subsequent figures, is a fluid (or fluid-like material) filled pouch that has electrodes that when a specified current/voltage is applied, squeezes (e.g., zipped shut—in some embodiments, zipped refers to the electrodes of the actuator being attracted to each other and displacing fluid) the fluid-filled pouch. When enough force is applied to electrostatically-controlled actuator 118, e.g., by pressing compressing the electrostatically-controlled actuator 118 between the fingertip 120 of the user 102 and a surface 119 (e.g., a table), the electrostatically-controlled actuator 118 unzips (e.g., allowing the fluid to fill the newly created void between the electrodes).

FIG. 1A also illustrates electrostatically-controlled actuator 118 being configured to emulate a keyboard key of a keyboard (e.g., a mechanical keyboard key, rubber dome keyboard key, etc.). By emulating the feel of a keyboard key, a user can type in an artificial reality environment with greater accuracy, as they can confirm keyboard keys are being pressed without having to visually confirm. This emulation is illustrated by graph 122, which shows a compression force, in Newtons (N), along y-axis 124, being applied by the user 102 to the electrostatically-controlled actuator 118. The x-axis 126 shows the displacement of the finger (and/or the actuator) after the force has been applied. As shown in the graph 122, the force-displacement curve is produced when a voltage of 3100 volts (V) is applied to across the electrodes. This results in the electrodes being attracted to each other (e.g., zipped together electrostatically) with a predetermined amount of force. FIG. 1A shows that at time one, indicated by line 130, only a certain amount of force has been applied to the electrostatically-controlled actuator 118 by the user 102. Graph 122 and electrostatically-controlled actuator 118, shown in FIG. 1A, also illustrate that the electrostatically-controlled actuator 118 is presently in its zipped state (e.g., the electrodes are still (or primarily/substantially (e.g., about 75-100%)) electrostatically coupled together).

In some embodiments, it is detected that in the virtual reality environment that that the user's virtual hand 112 or virtual finger in the artificial reality 106 is located within a predefined distance of an input element (e.g., a keyboard key), and in response can obtain information regarding the input element, and cause a voltage adjustment of the electrostatically-controlled actuator 118, thereby changing a characteristic of the electrostatically-controlled actuator 118 (e.g., the force required to separate the electrodes of the electrostatically-controlled actuator).

Figure 1B:
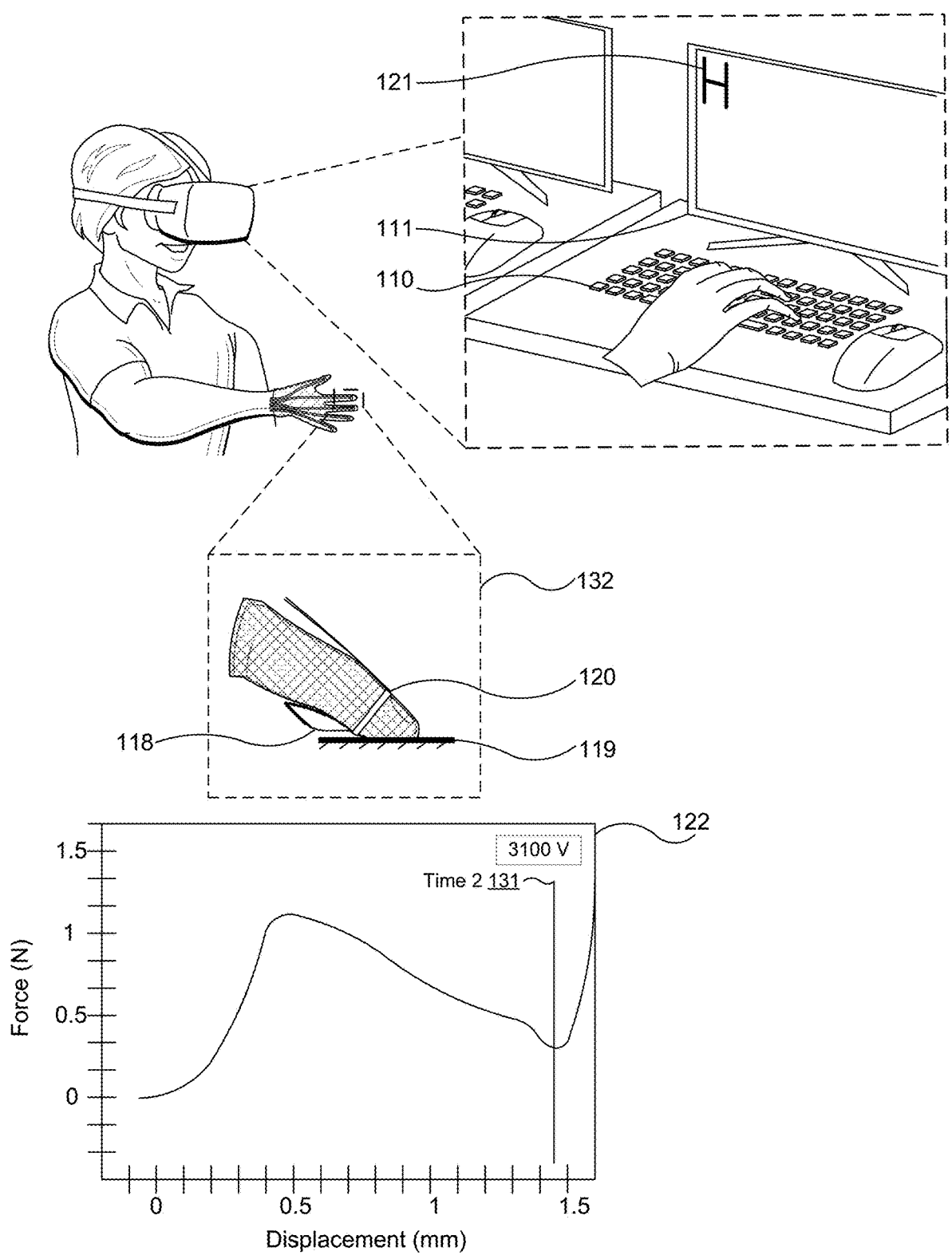

FIG. 1B illustrates that the electrostatically-controlled actuator 118 has unzipped in response to a threshold amount of force being applied to the electrostatically-controlled actuator 118 (e.g., by squeezing the electrostatically-controlled actuator 118 between a fingertip 120 and a physical surface 119). This is indicated in zoomed-in box 132, which shows the electrostatically-controlled actuator 118 being compressed and unzipped. Graph 122 of FIG. 1B also shows that at time two, indicated by line 131, the displacement has increased and the force threshold to cause unzipping has been exceeded. As indicated by the graph 122, once the electrostatic unzipping force is overcome, at about one Newton, the force for further displacement is decreased (e.g., the attractive force between electrodes of the electrostatically-controlled actuator 118 decreases according to factors comprising one or more of: (i) the inverse square law, (ii) the actuators having slightly conductive dielectric properties, which can generate an attractive force between the two electrodes not due to the Johnsen-Rahbek effect (JR-effect), and (iii) the varying distances of the different and deformable sections of the electrodes). In some embodiments, JR-effect results in inducing additional attractive force at the electrode-dielectric interface and this force is dependent on the interfacing materials and their surface roughness. Once the displacement exceeds 1.5 mm the force for further displacement increases as the fluid-like substance or fluid in the electrostatically-controlled actuator 118 cannot be easily further compressed (e.g., the internal pouch pressure becomes too great and/or the non-fluid components of the electrostatically-controlled actuator 118 cannot be easily compressed further). Alternatively, the fluid in electrostatically-controlled actuator 118 may be completely displaced, and the user is pressing against a non-flexing surface, such as a table.

Additionally, FIG. 1B also shows that in response to electrostatically-controlled actuator 118 being unzipped at a location corresponding to an "H" on virtual keyboard 110, a letter "H" 121 is displayed on virtual display device 111 in the artificial reality environment.

Figure 1C:
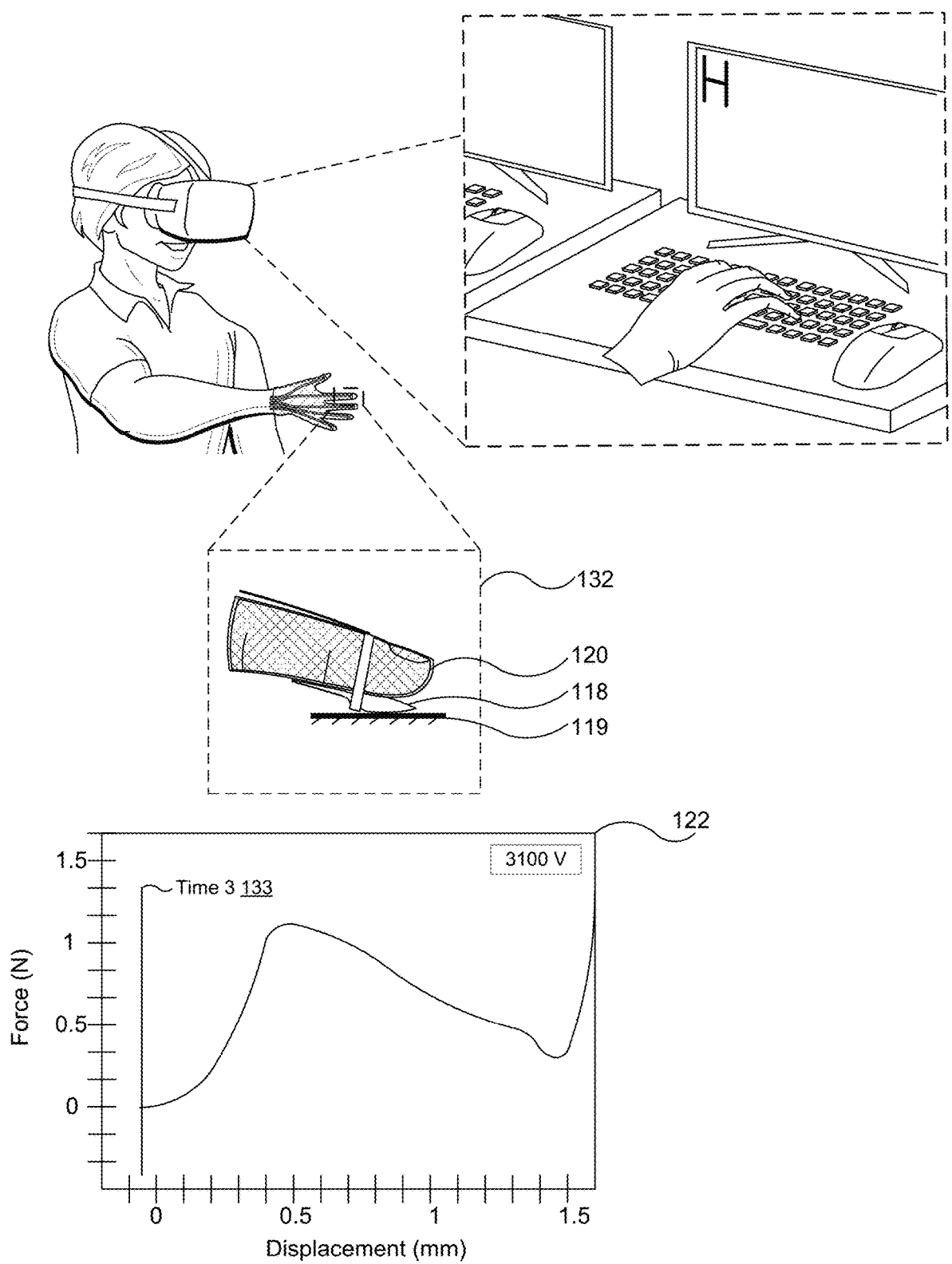

FIG. 1C illustrates that the electrostatically-controlled actuator 118 has zipped in response to a threshold amount of force removed from the electrostatically-controlled actuator 118 (e.g., by no longer squeezing the electrostatically-controlled actuator 118 between a fingertip 120 and a physical surface 119). This is indicated in zoomed-in box 132, which shows the electrostatically-controlled actuator 118 being uncompressed and the electrodes being zipped together.

Graph 122 of FIG. 1C also shows that at time three, indicated by line 133, the displacement has decreased to the initial amount and the force threshold to cause unzipping has no longer been exceeded. As indicated by the graph 122, once the electrostatic zipping force is overcome at about 1 N, the force for further displacement is decreased. In essence, the user will experience a sensation similar to releasing a key on a keyboard and having the key return to its initial resting position.

Figure 1D:
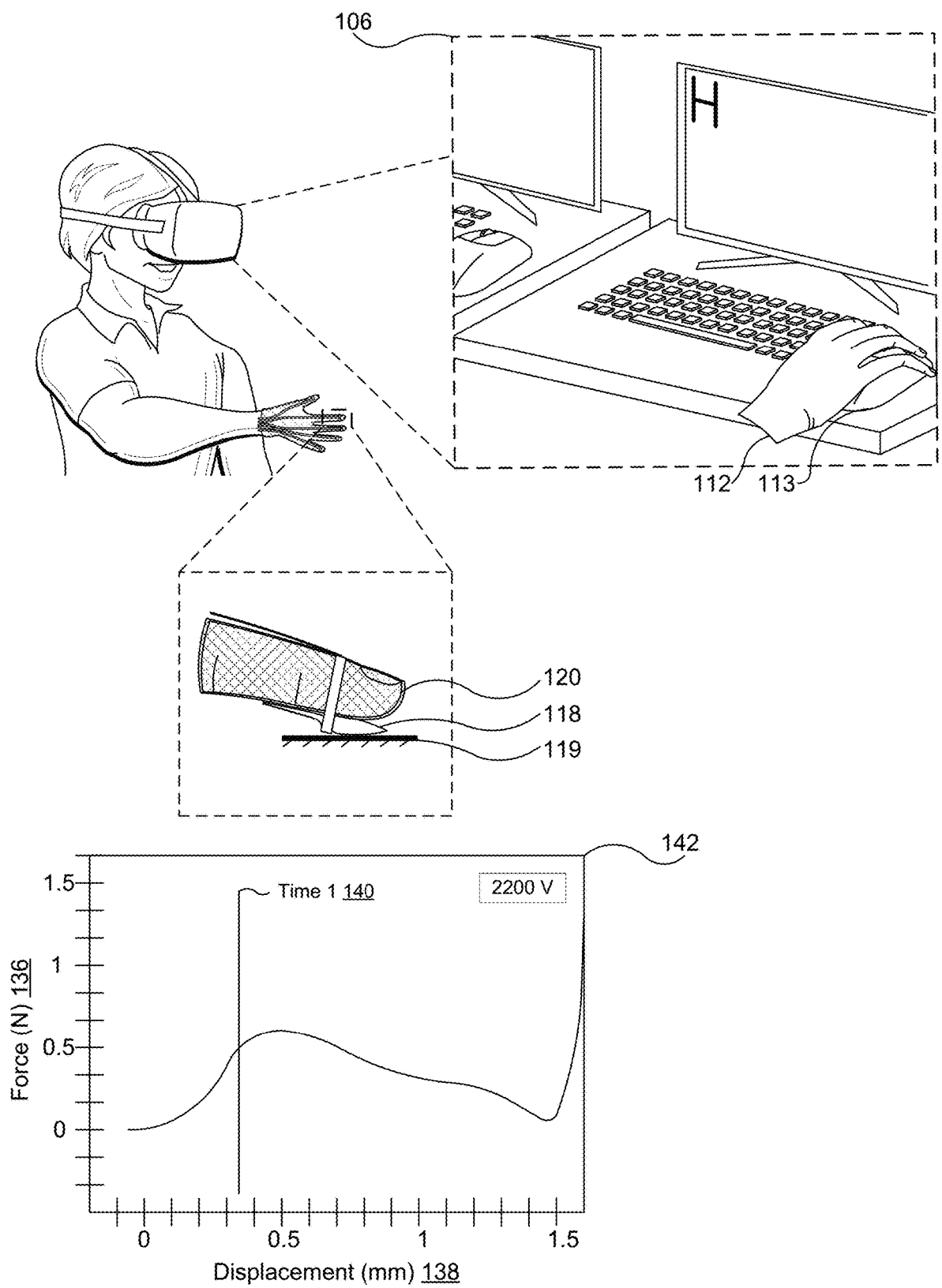

FIG. 1D illustrates electrostatically-controlled actuator 118 being further configured to emulate a right/left/side/scroll mouse click of a mouse (e.g., a mechanical mouse switch, rubber dome mouse switch, etc.). By emulating the feel of a mouse switch, a user can interact with a mouse in a virtual reality environment with greater accuracy, as they can feel that a mouse switch is being pressed. This emulation is illustrated by graph 142, that shows the force in Newtons along y-axis 136, applied by fingertip 120 on the electrostatically-controlled actuator 118. The x-axis 138 shows the displacement of the finger (and/or the actuator) after the force has been applied. As shown in the graph 142, the force-displacement curve is produced when 2200 volts (V) are applied to the electrodes, which results in the electrodes being attracted to each other (e.g., zipped together electrostatically) with a predetermined amount of force. The voltage of 2200 V produces a different force-displacement curve than the force-displacement curve produced by running 3100 V through the electrostatically-controlled actuator 118 (e.g., as is done for the emulated keyboard key shown in FIGS. 1A-1C). By lowering the voltage, compared to the keyboard example, the emulated mouse switch will require less force to activate (e.g., about 0.5 N compared to the about 1 N of emulated keyboard key). In some embodiments, a scroll wheel of a mouse can be emulated by quickly varying the voltage of the electrostatically-controlled actuator 118 to vibrate, which can emulate the tactile feel of a scroll wheel scrolling.

In some embodiments, electrostatically-controlled actuator 118 can be further configured to emulate a right/left/side/scroll mouse click of a trackpad (e.g., a trackpad found in a laptop). In some embodiments, for a trackpad click, a high frequency vibration from the actuator is used. In some embodiments, the perception of a click is generated by rendering a short pulse of amplitude-modulated high-frequency vibration.

Graph 142 and electrostatically-controlled actuator 118 in FIG. 1D also illustrate that the electrostatically-controlled actuator 118 is presently in its zipped state (e.g., the electrodes are still (or primarily) electrostatically coupled). Graph 142 shows that at time one, indicated by line 140 only a certain amount of force has been applied to the electrostatically-controlled actuator 118 by fingertip 120.

In some embodiments, it is detected that in the artificial reality environment that that the user's virtual hand 112 or virtual finger 120 in the artificial reality 106 is located within a predefined distance of another input element (e.g., a mouse switch). In response to information regarding the input element being obtained, causing a voltage adjustment of the electrostatically-controlled actuator 118, which thereby changes a characteristic of the electrostatically-controlled actuator 118. Stated another way, the electrostatically-controlled actuator 118 can be adjusted (e.g., by changing the voltage) quickly based on the input element that user's virtual hand 112 is in closest proximity to.

Figure 1E:
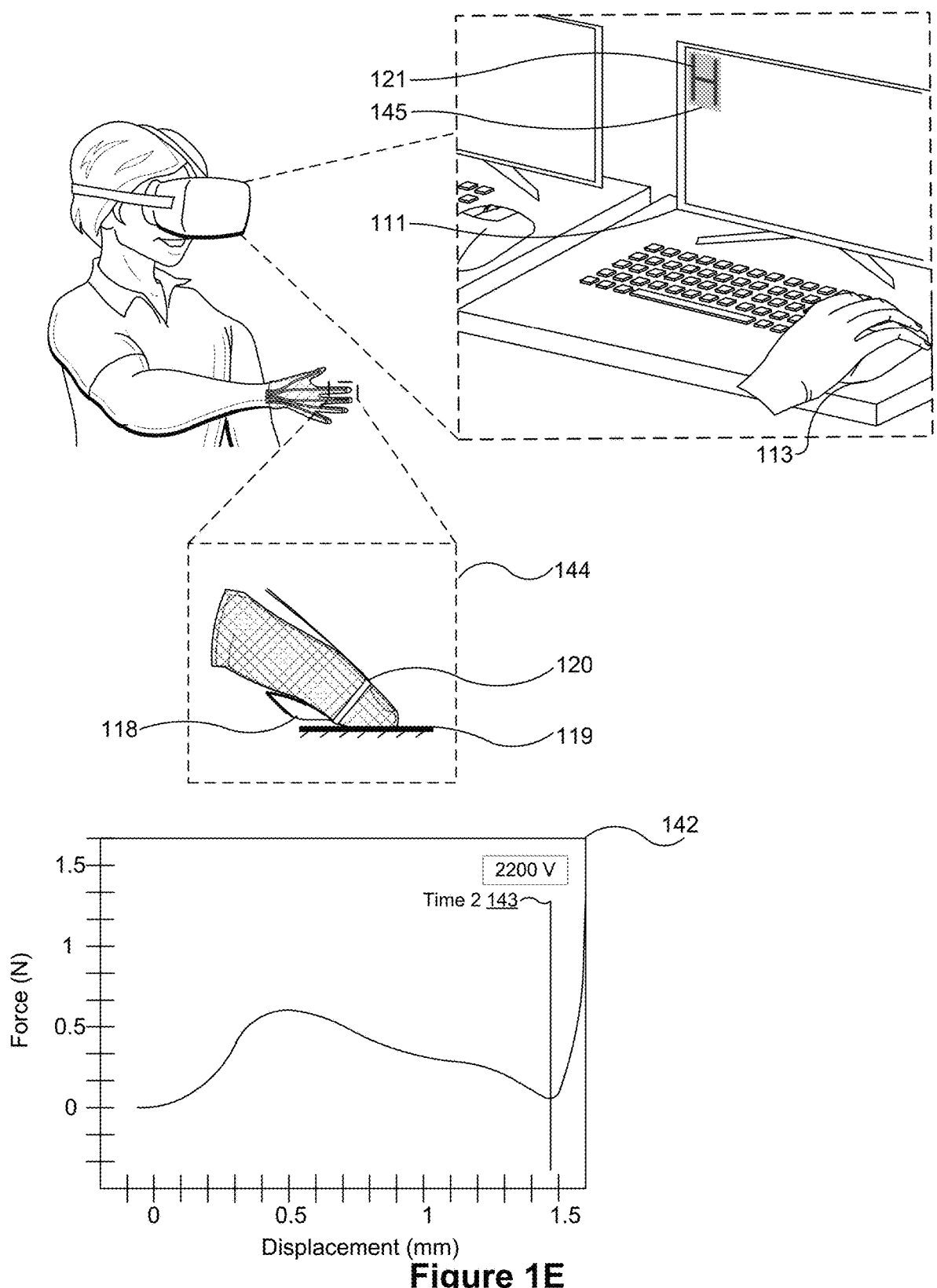

FIG. 1E illustrates that the electrostatically-controlled actuator 118 has unzipped in response to a threshold amount of force being applied to the electrostatically-controlled actuator 118 (e.g., by squeezing the electrostatically-controlled actuator 118 between a fingertip 120 and a physical surface 119). This is indicated in zoomed-in box 144, which shows the electrostatically-controlled actuator 118 being compressed and unzipped. Graph 142 of FIG. 1E also shows that at time two, indicated by line 143 the displacement has increased and the force threshold to cause unzipping has been exceeded. As indicated by the graph 142, once the electrostatic zipping force is overcome at about 0.5 N, the force for further displacement is decreased until 1.5 mm of travel. Once the displacement exceeds 1.5 mm, the force for further displacement increases as the fluid-like substance or fluid in the electrostatically-controlled actuator 118 cannot be easily further compressed (e.g., the pressure becomes too great in the pouch and/or the non-fluid components of the electrostatically-controlled actuator 118 cannot be further compressed easily).

Additionally, FIG. 1E also shows that in response to electrostatically-controlled actuator 118 being unzipped at a location corresponding to an input on virtual mouse 113, letter "H" 121 is highlighted (e.g., indicated by highlighted letter "H" 145, on virtual display device 111).

Figure 1F:
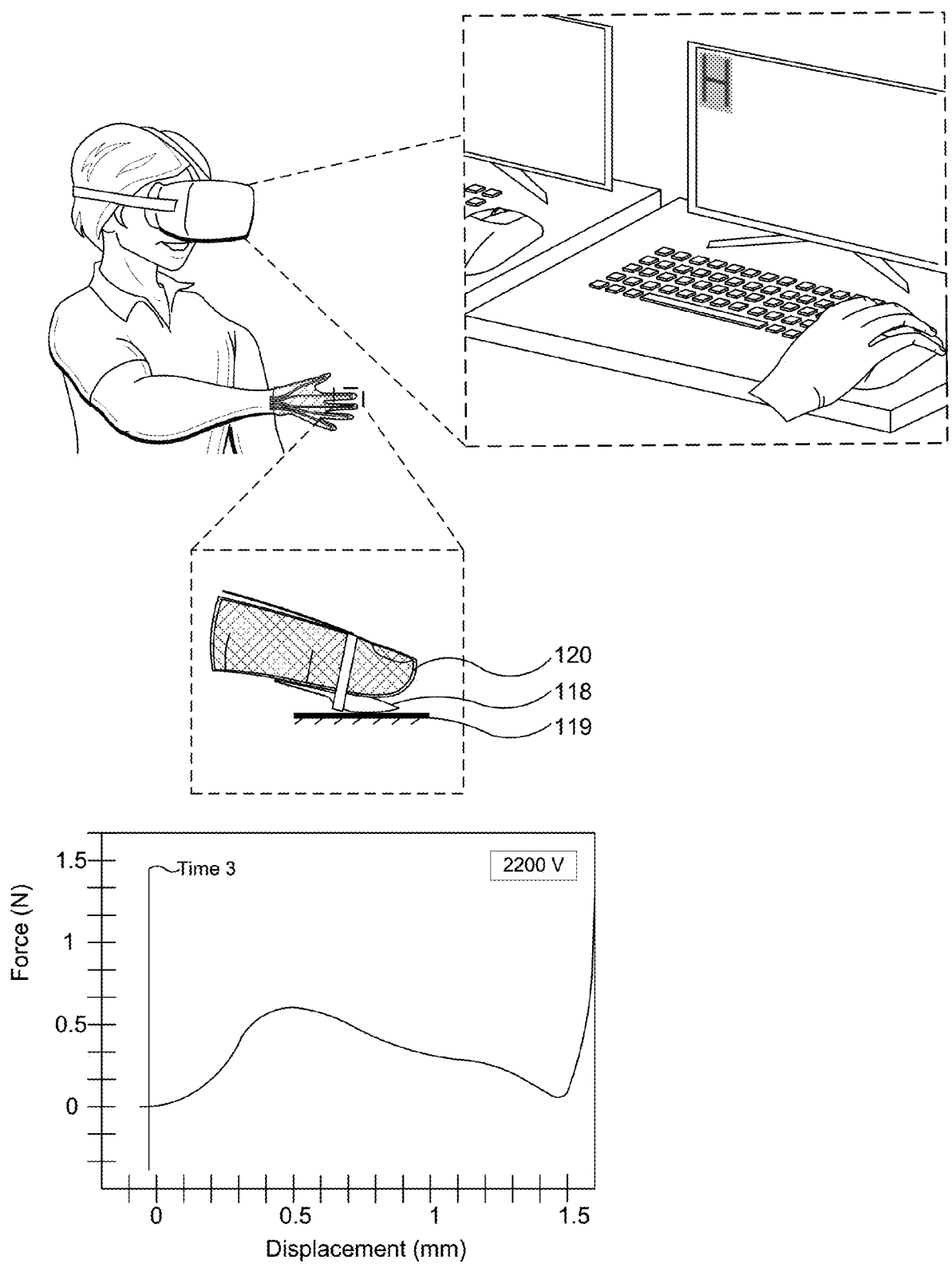

FIG. 1F also illustrates that the electrostatically-controlled actuator 118 has zipped in response to a threshold amount of force removed from the electrostatically-controlled actuator 118 (e.g., by no longer squeezing the electrostatically-controlled actuator 118 between a fingertip 120 and a physical surface 119). This is indicated in zoomed-in box 146, which shows the electrostatically-controlled actuator 118 being uncompressed and zipped.

Figure 2A:
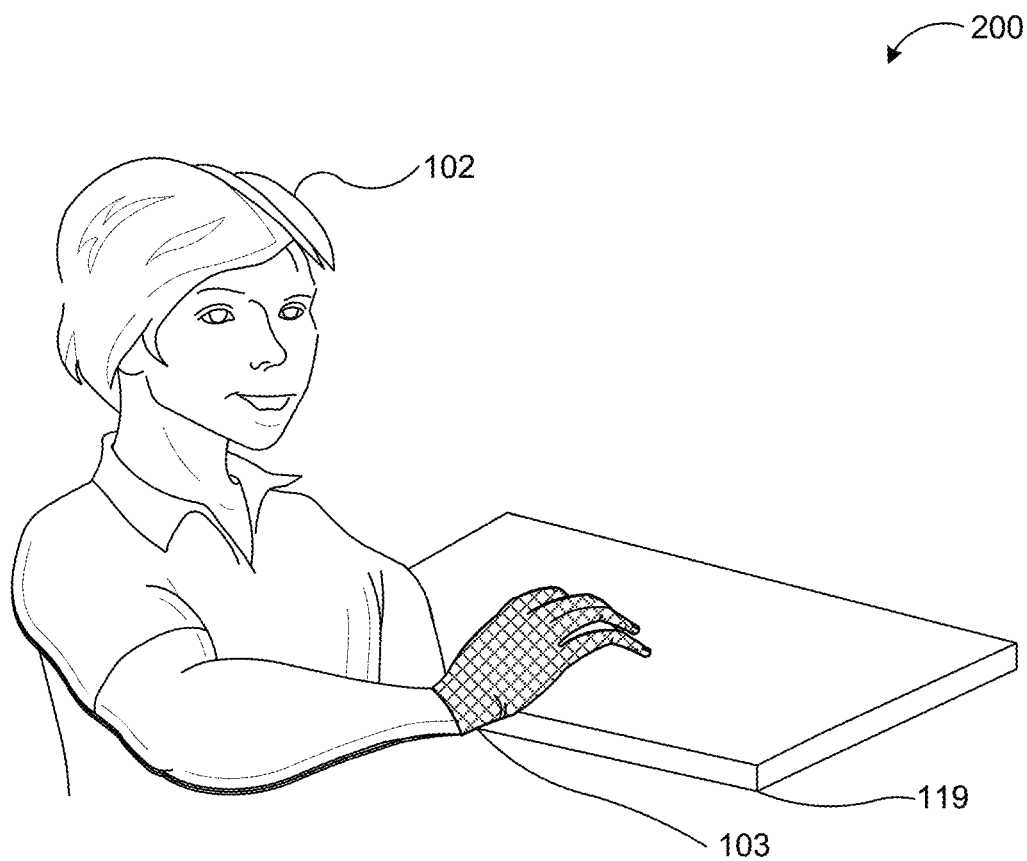
FIGS. 2A-2C illustrate a user interacting with an input element (e.g., a keyboard key) presented in a second type of artificial-reality environment, the input element being activated based on force provided by a user that is directed to a component of an actuator that is coupled with a wearable device, in accordance with some embodiments
Figure 2B:
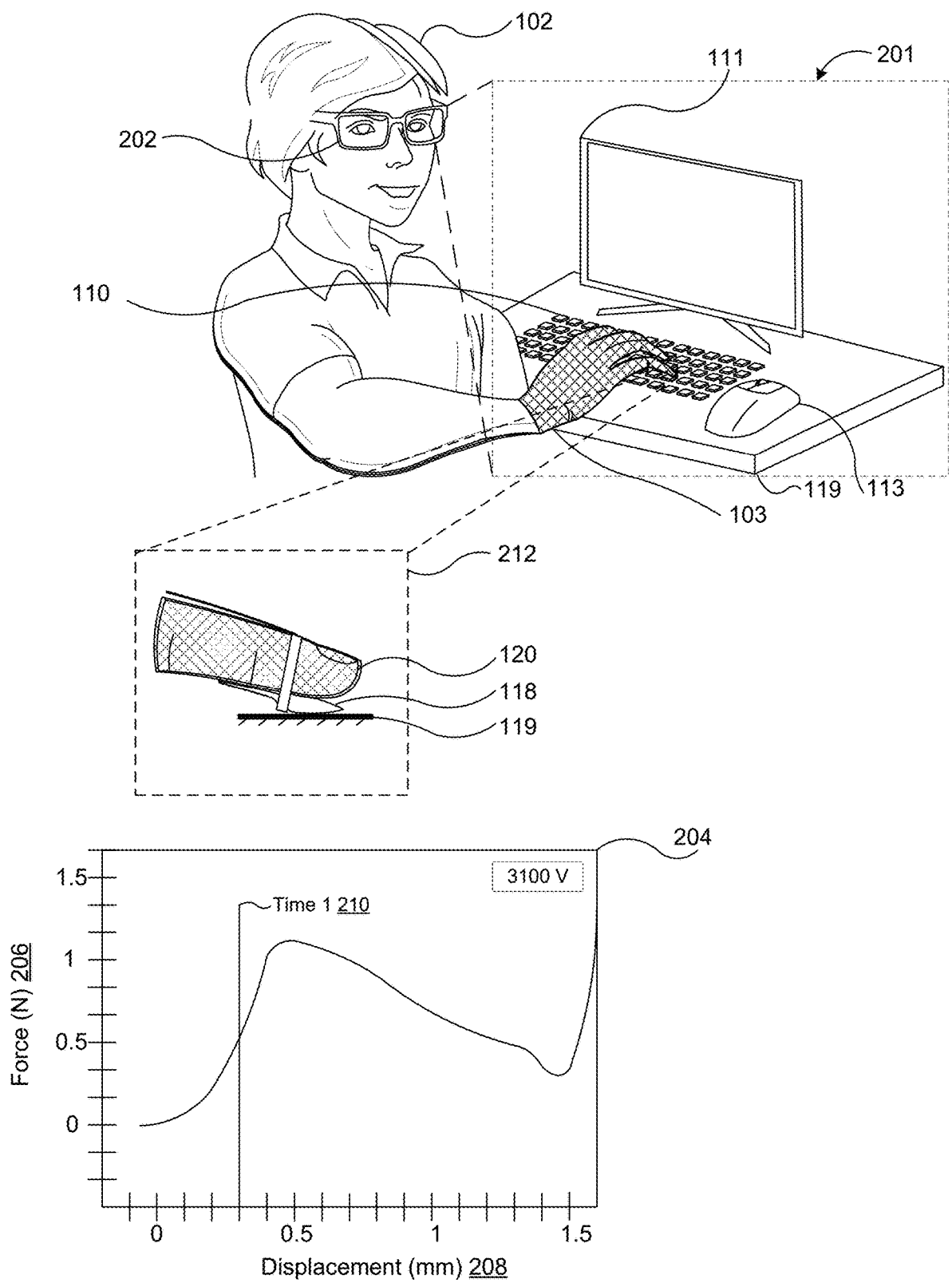
Figure 2C:
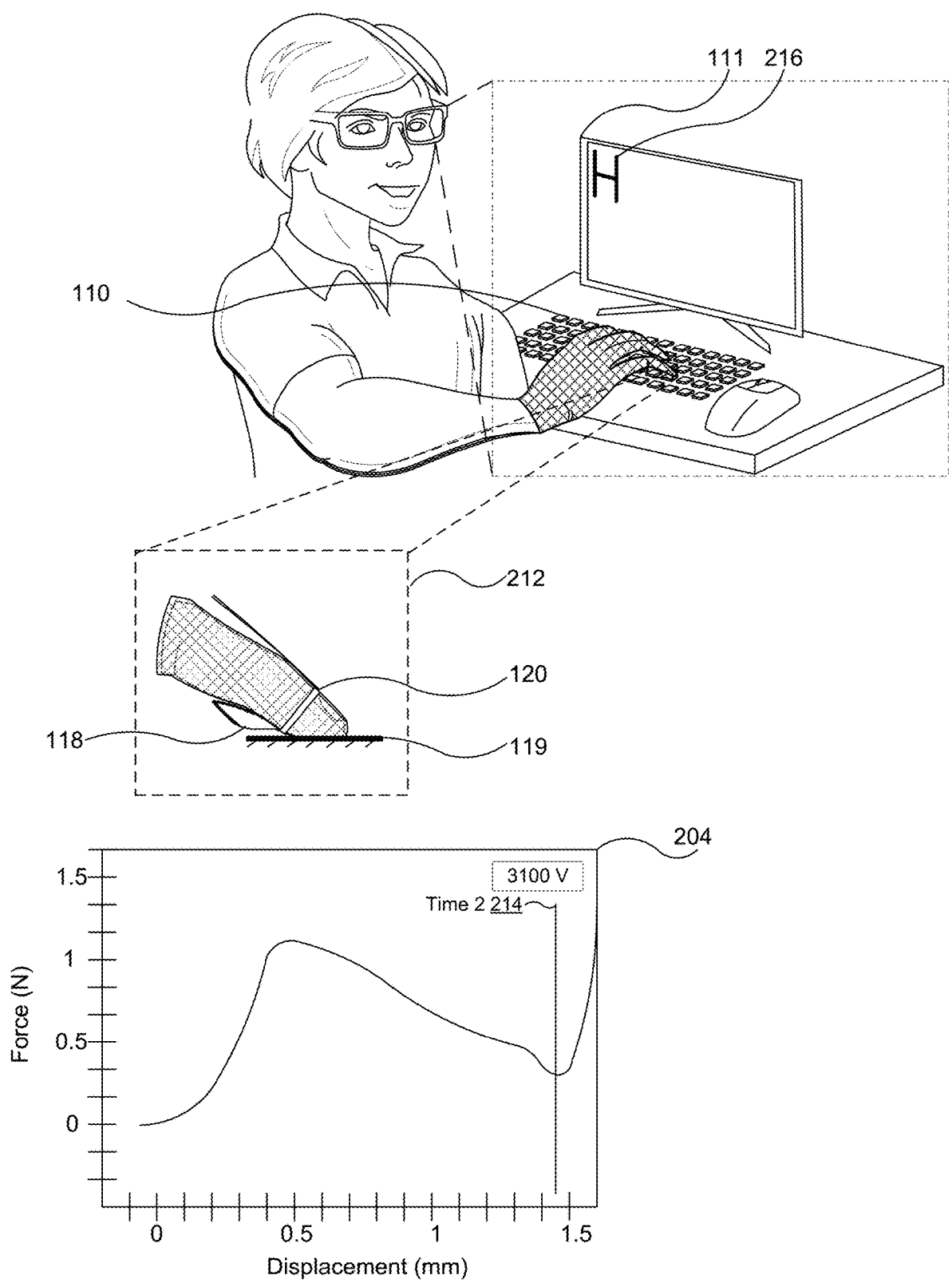

FIGS. 2A-2C illustrate a user interacting with an input element (e.g., a keyboard key) presented in a second type of artificial-reality environment, the input element being activated based on force provided by a user that is directed to a component of an actuator that is coupled with a wearable device, in accordance with some embodiments.

FIG. 2A shows a real-world environment 200 that user 102 would see without any visual augmentation. In this real-world environment 200, user 102 would see a physical surface 119 (e.g., a desk surface) with nothing on its surface.

FIG. 2B illustrates an artificial-reality environment 201 that includes both real items (e.g., physical surface 119 and hand 103 of the user 102 from the real-world environment 200) and augmented items (e.g., virtual keyboard 110, a virtual display device 111, a virtual mouse 113 from the artificial-reality environment 201). The artificial-reality environment 201 is displayed via an artificial-reality headset 202.

Similar to FIG. 1A, FIG. 2B illustrates electrostatically-controlled actuator 118 being configured to emulate a keyboard key of a keyboard (e.g., a mechanical keyboard key, rubber dome keyboard key, etc.). This emulation is illustrated by graph 204, which shows the compressive force in Newtons along y-axis 206, applied by the user 102 on the electrostatically-controlled actuator 118. The x-axis 208 shows the displacement of the finger (and/or the actuator) after the force has been applied. As shown in the graph 204, the force-displacement curve is produced when 3100 volts (V) are applied to the electrodes, which results in the electrodes being attracted to each other (e.g., zipped together electrostatically) with a predetermined amount of force. FIG. 2B shows that at time one, indicated by line 210, only a certain amount of force has been applied to the electrostatically-controlled actuator 118 by the user 102. Graph 204 and electrostatically-controlled actuator 118, in FIG. 2B, also illustrate that the electrostatically-controlled actuator 118 is presently in its zipped state (e.g., the electrodes are still (or primarily) electrostatically coupled).

FIG. 2C illustrates that the electrostatically-controlled actuator 118 has unzipped in response to a threshold amount of force being applied to the electrostatically-controlled actuator 118 (e.g., by squeezing the electrostatically-controlled actuator 118 between a fingertip 120 and a physical surface 119). This is indicated in zoomed-in box 212, which shows the electrostatically-controlled actuator 118 being compressed and unzipped. Graph 204 of FIG. 2C also shows that at time two, indicated by line 214 the displacement has increased and the force threshold to cause unzipping has been exceeded. As indicated by the graph 204, once the electrostatic zipping force is overcome at about 1 N, the force for further displacement is decreased. Once the displacement exceeds 1.5 mm the force for further displacement increases as the fluid-like substance or fluid in the electrostatically-controlled actuator 118 cannot be easily further compressed (e.g., the pressure becomes too great in the pouch and/or the non-fluid components of the electrostatically-controlled actuator 118 cannot be further compressed easily).

Additionally, FIG. 2C also shows that in response to electrostatically-controlled actuator 118 being unzipped at a location corresponding to an "H" on virtual keyboard 110, a letter "H" 216 is displayed on virtual display device 111.

FIG. 3A-3E illustrate a user activating keys on a physical keyboard based on interactions with respective electrostatic zipping actuators (also referred to herein as electrostatically-controlled actuator) that are coupled with the keys of the physical keyboard, in accordance with some embodiments. FIGS. 3A-3E illustrate an environment 302 that is not artificially altered through the use of an artificial reality device (e.g., artificial reality headset 104 or artificial reality headset 202). In some embodiments a user could wear artificial reality headset 104 or artificial reality headset 202 while using the physical keyboard 300.

Figure 3A:
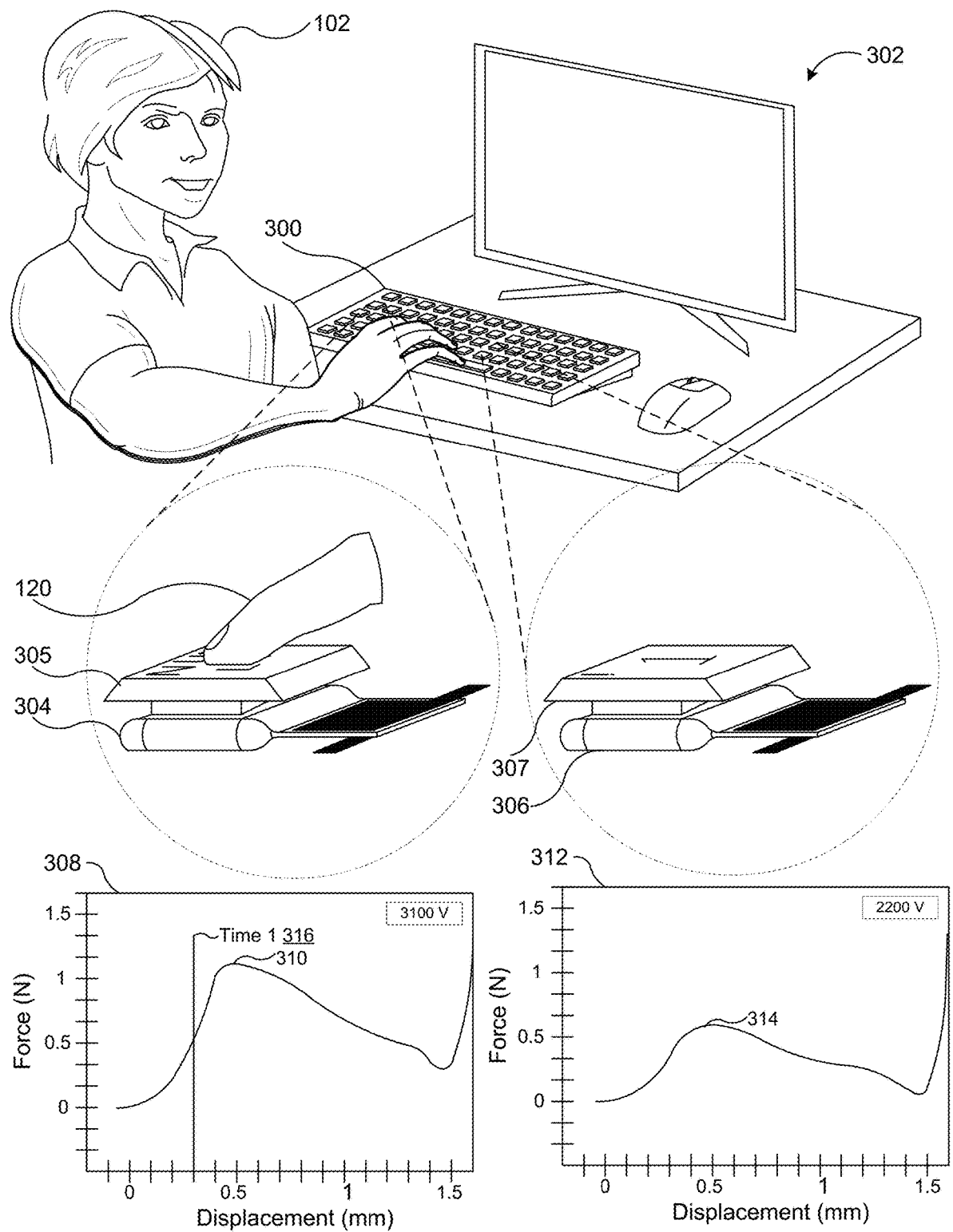
FIG. 3A-3E illustrate a user activating keys on a physical keyboard based on interactions with respective electrostatic zipping actuators (also referred to herein as electrostatically-controlled actuator) that are coupled with the keys of the physical keyboard, in accordance with some embodiments.

FIG. 3A illustrates a first electronic zipping actuator 304 placed beneath a number lock keycap 305 (e.g., a key for enabling or disabling number keys), and a second electronic zipping actuator 306 placed beneath a number keycap 307. While only two keys are shown with the electrostatic zipping actuators placed beneath the keycap, all other keys on the keyboard can be configured to operate in a similar way. In some embodiments, electrostatic zipping actuators and traditional keyboard switches can be placed on the same keyboard (e.g., modifier keys can be activated via traditional mechanical/membrane style switch and alphanumeric keys can activated via electrostatically-controlled actuators).

FIG. 3A illustrates a first force-displacement graph 308 corresponding to first electrostatic zipping actuator 304. First force-displacement graph 308 illustrates that first electrostatic zipping actuator 304 operates at 3100 V, which produces a first unzipping force threshold (e.g., as indicated by peak 310). FIG. 3A also illustrates a second force-displacement graph 312 corresponding to second electrostatic zipping actuator 306. Force-displacement graph 312 illustrates that second electrostatic zipping actuator 306 operates at 2200 V, which produces a second unzipping force threshold (e.g., as indicated by peak 314), different from the first unzipping force threshold. In some embodiments, the voltages can be actively adjusted to produce different unzipping thresholds (e.g., in a game the arrow/WASD keys and other important keys may become easier or harder to select, or keys that close out of documents may be harder to press to ensure the user intends to press those keys (e.g., "Alt" and "F4," or "Cmd" and "Q" are harder to press)). Lastly, FIG. 3A illustrates that the fingertip 120 begins pressing the number lock-keycap but does not yet meet/exceed the first unzipping force threshold (e.g., as indicated by peak 310) according to line 316, indicating a first time, in first force-displacement graph 308.

Figure 3B:
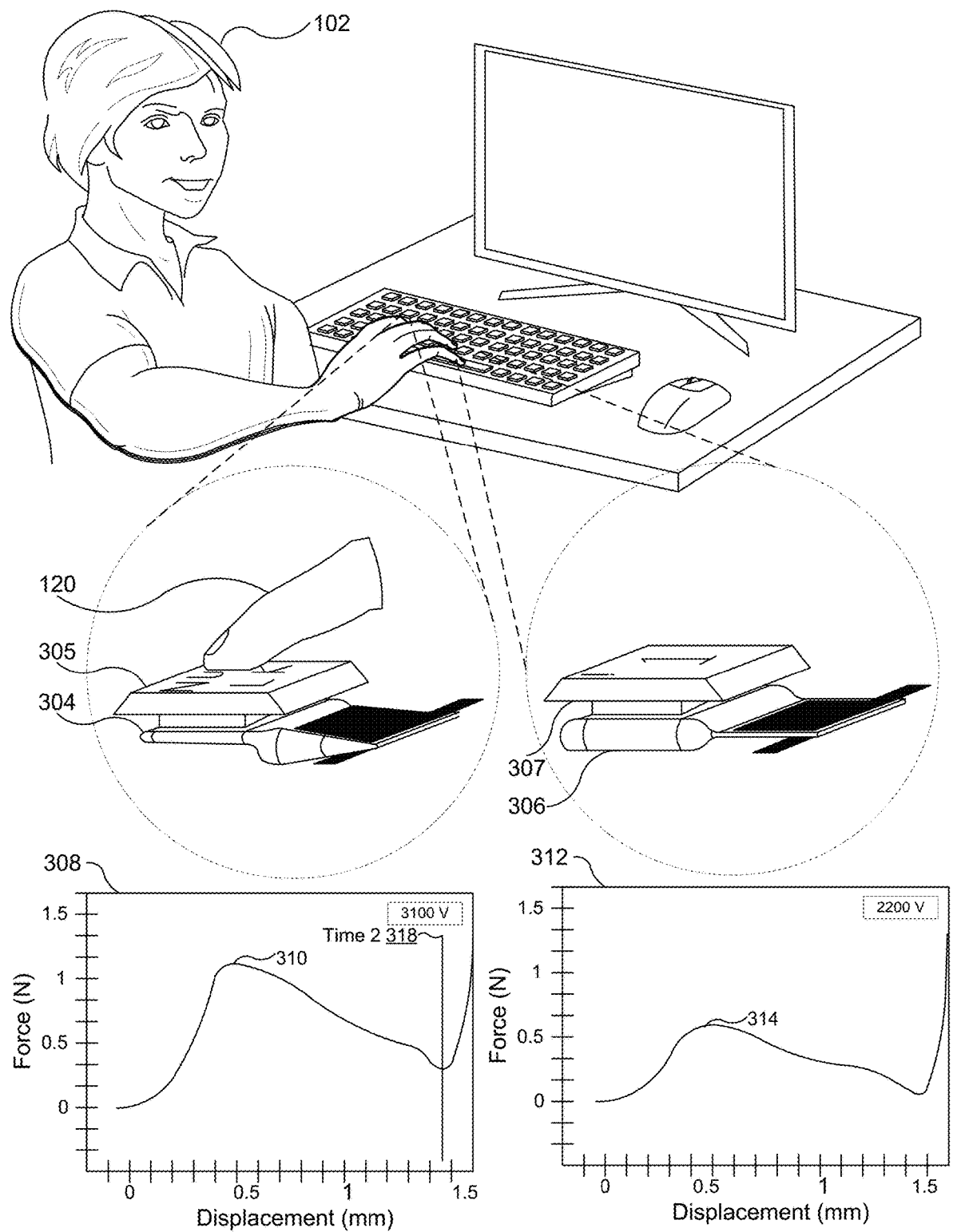

FIG. 3B illustrates that fingertip 120 has pressed the number-lock keycap 305, and has met/exceeded the first unzipping force threshold (e.g., as indicated by peak 310) according to line 318 in first force/displacement graph 308. In some embodiments, number-lock is initiated upon meeting or exceeding the first unzipping force threshold or is initiated upon detecting lift-off of the fingertip 120 (e.g., detecting that the electrostatic-zipping actuator has zipped up). FIG. 3B illustrates in force-displacement graph 308 that first electrostatic zipping actuator 304 is still operating at 3100 V. The second force-displacement graph 312 associated with second electrostatic zipping actuator 306 is still operating at 2200 V.

Figure 3C:
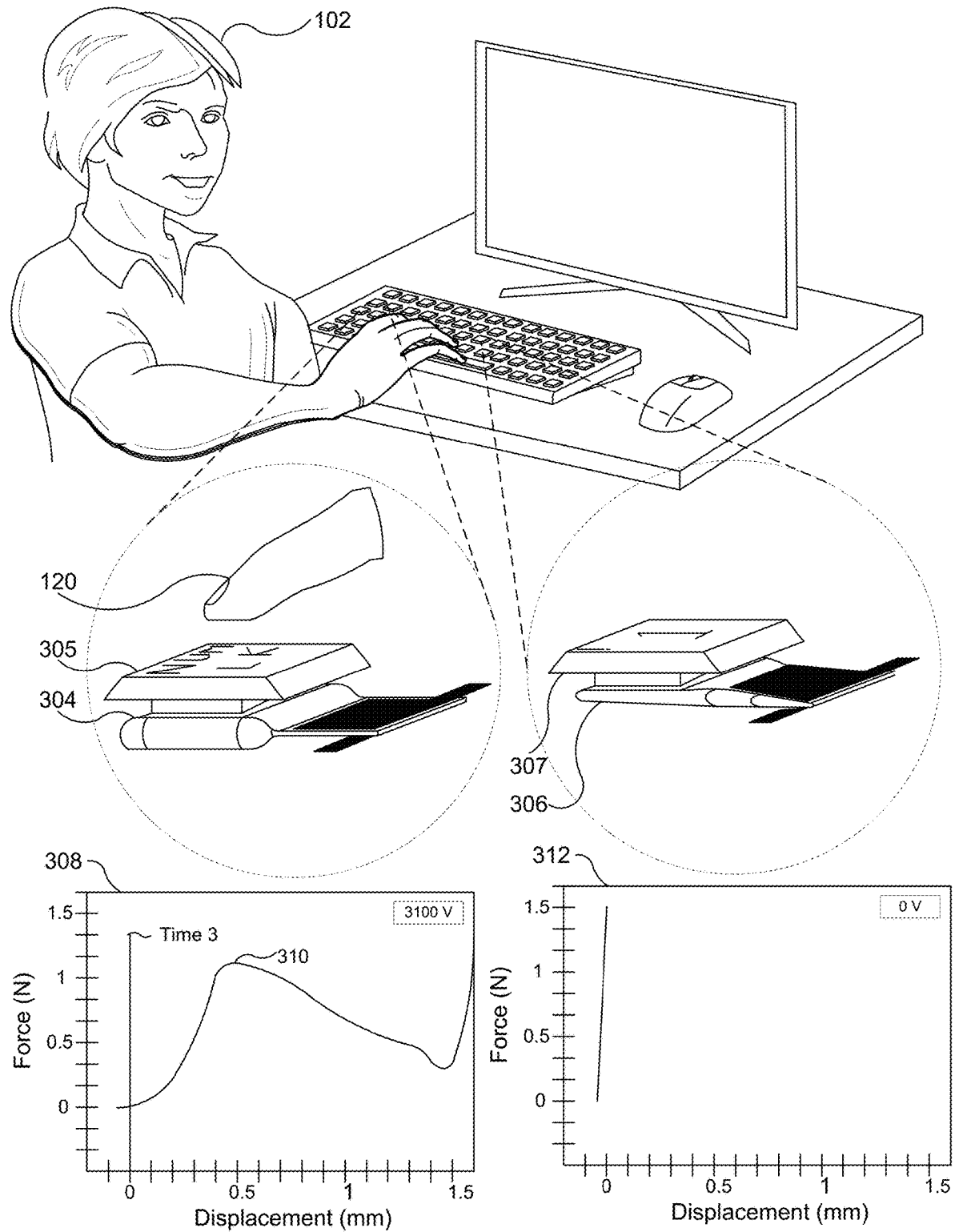

FIG. 3C shows that in response to the number-lock being enabled, the number keycap 307 (e.g., a number one key) becomes disabled. As shown in second force-displacement graph 312 that second electrostatic zipping actuator 306 is operating at 0 V. In some embodiments, when a low enough voltage is being received at second electrostatic zipping actuator 306, the number keycap 307 will sink down to its depressed state (e.g., the keycaps weight would displace the fluid in second electrostatic actuator 306) and become non-selectable. In some embodiments, a high voltage is passed through second electrostatic zipping actuator 306 in order to make resistance high enough that the user 102 would not be able to depress the number key (i.e., activate the switch) without using excessive force (e.g., an amount of force greater than 100 grams).

Figure 3D:
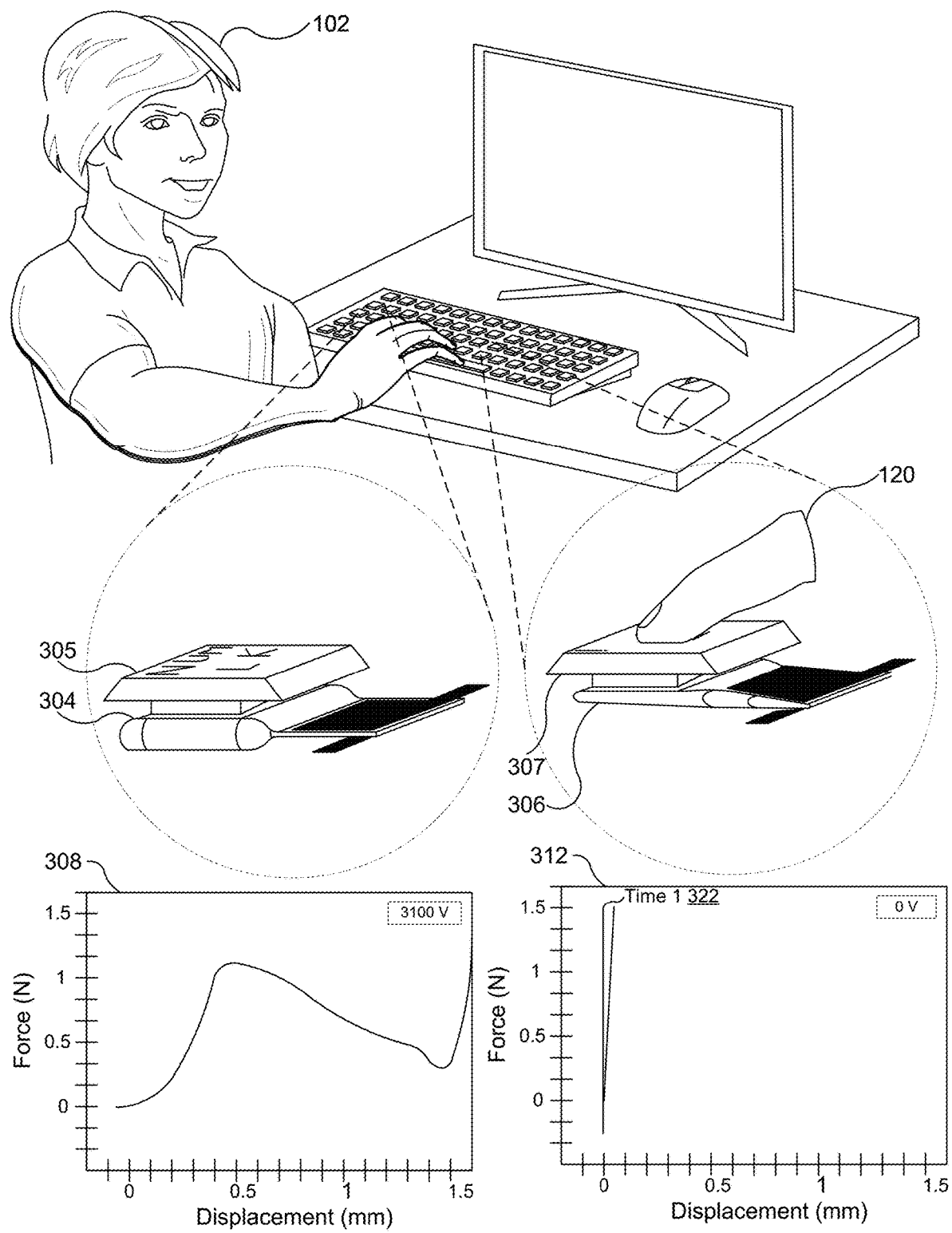

FIG. 3D shows the fingertip 120 beginning to press number keycap 307 while second electrostatic zipping actuator 306 is operating at 0 V. Since the second electrostatic zipping actuator 306 is operating at 0 V, and the number keycap 307 is in a depressed state, then the force required for any kind of displacement is very high. As shown by second force-displacement graph 312, the displacement will be very minimal despite an increasing amount of force being applied to the second electrostatic zipping actuator 306. As indicated by line 322 in second force-displacement graph 312, at a first point in time, a very minimal amount of force is applied with no displacement occurring.

Figure 3E:
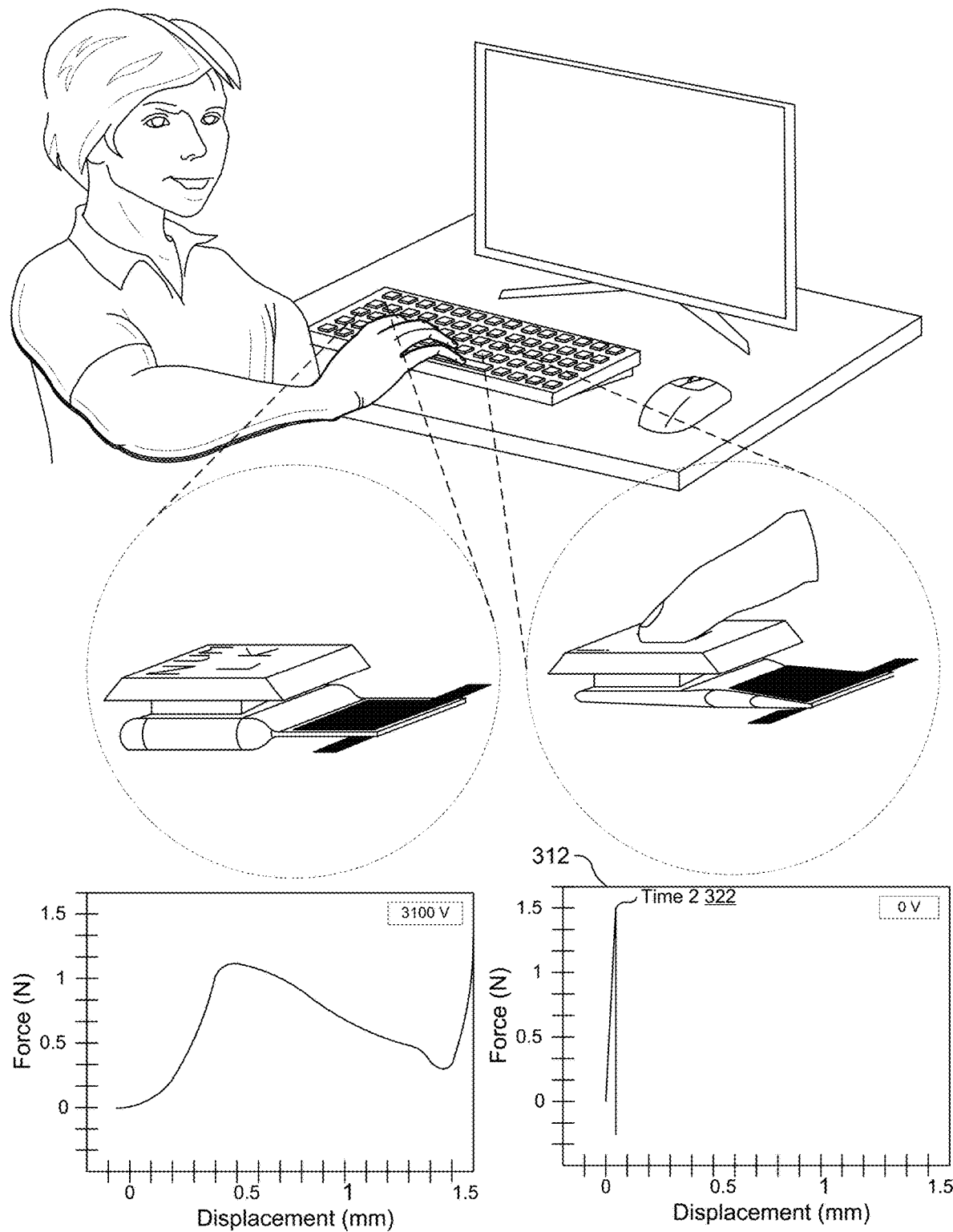

FIG. 3E illustrates by line 322 in second force-displacement graph 312, at a second point in time, a large amount of force is applied but still very minimal displacement occurs.

Figure 4A:
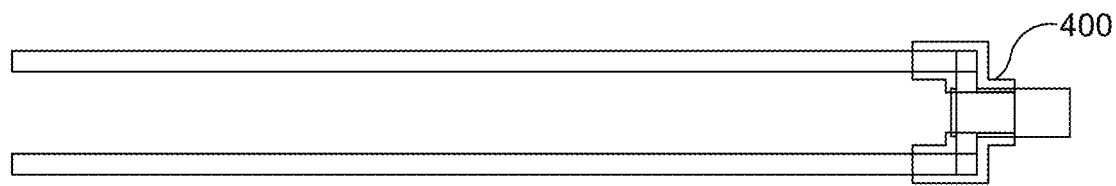
FIG. 4A illustrates an assembled wireframe view of an electrostatically-controlled actuator 400, in accordance with some embodiments.
Figure 4B:
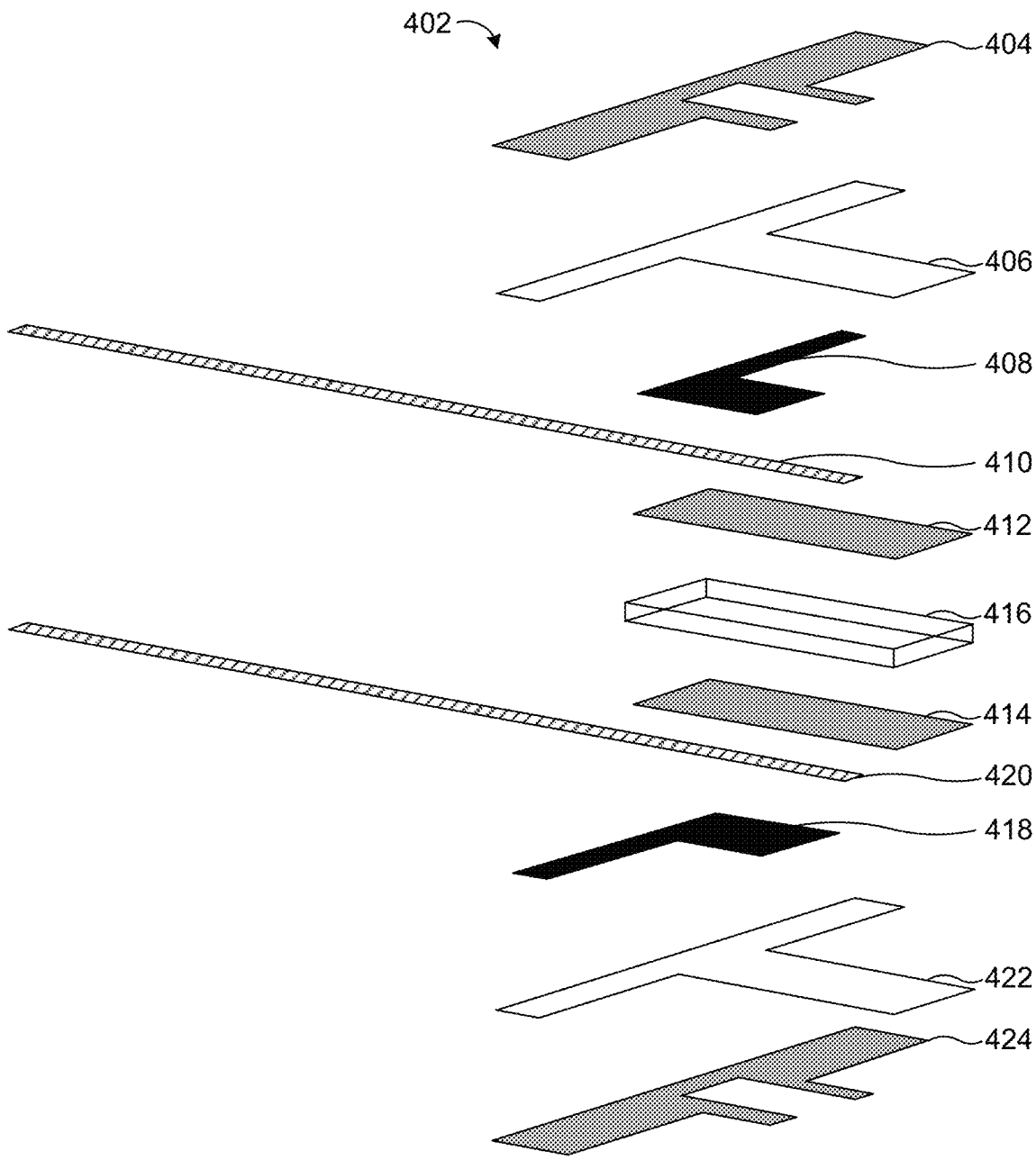
FIG. 4B illustrates an exploded view of the electrostatically-controlled actuator shown in FIG. 4A, in accordance with some embodiments.

FIG. 4A illustrates an assembled wireframe view of an electrostatically-controlled actuator 400, in accordance with some embodiments. FIG. 4B illustrates an exploded view of the electrostatically-controlled actuator shown in FIG. 4A, in accordance with some embodiments.

In some embodiments, the electrostatic zipping actuator consists of several different layers that include an innermost actuator pouch made by impulse heat-sealing of dielectric film that holds the dielectric fluid, electrodes on both sides of this pouch, flexible printed circuit cables to route the electrical power to the actuator, an insulating dielectric film and an insulation to encapsulate everything to enable bare hand interaction with the actuator without any safety concerns.

Moving generally from top to bottom, FIG. 4B illustrates that the topmost layer is an insulating sheet 404 (e.g., a Kapton insulation sheet). The next layer is a dielectric insulation film 406 (e.g., a Stretchlon dielectric insulation film) that is coupled to the insulating sheet 404. Beneath that is an electrode 408 (e.g., a carbon tape electrode). The electrode 408 is coupled to a flexible printed circuit cable 410. Beneath that is an electrode 408 that is coupled to a side of a dielectric actuator pouch. The dielectric actuator pouch is constructed by bonding a first encasing dielectric film 412 to a second encasing dielectric film 414. Encased within actuator pouch is a dielectric fluid 416 (e.g., Novec 7500). Another electrode 418 is placed beneath the second encasing dielectric film 414, and another flexible printed circuit cable 420 is coupled to the electrode 422. Beneath that is a dielectric insulation film 422. The bottommost layer is another insulating sheet 424.

FIG. 5A-5C illustrate a few example electrostatically-controlled actuators with different electrode configurations to produce different input-response characteristics (e.g., achieve different haptic sensations, in accordance with some embodiments) FIG. 5A illustrates a first example type of electrostatic actuator 500 with two electrodes (e.g., a frontside electrode 502 and a backside electrode 504). FIG. 5B illustrates a second example type of electrostatic actuator 506 with 8 electrodes (e.g., four frontside electrostatic electrodes 508A-508D and four backside electrostatic electrodes (not pictured). FIG. 5C illustrates a third example type of electrostatic actuator 512 with two electrodes (e.g., a frontside electrode 514 and a backside electrode 516). A third example type of electrostatic actuator 512 differs from first example type of electrostatic actuator 500, in that the electrode is longer in width. In some embodiments, electrostatic actuators with more than two electrodes (e.g., actuator 500) can be actuated at different voltages and at different times to generate different types of key press haptic sensations.

FIG. 6A illustrates a circuit diagram for an electrostatic zipping actuator using a high voltage DC-DC converter, in accordance with some embodiments. In this example circuit diagram, a first flexible printed circuit cable 602 and a second flexible printed circuit cable 604 are coupled to the electrostatic zipping actuator 601. The circuit diagram 600 shows that a first resister 606 and a second resister 608 are placed between first flexible printed circuit cable 602 and a second flexible printed circuit cable 604 in series. The circuit diagram 600 also shows a high voltage DC-DC converter 610 coupled to first flexible printed circuit cable 602 and second flexible printed circuit cable 604. A DC power output device 615 (e.g., a small rechargeable battery, a non-reusable coin-cell battery) is coupled to the high voltage DC-DC converter 610, which supplies power to the circuit and electrostatic zipping actuator 601. In some embodiments, the circuit diagram 600 includes a switch 612 for turning on or off the circuit shown in circuit diagram 600. In some embodiments, the electrostatic actuator includes a communication component (not pictured) for wirelessly communicating with another device (e.g., via Bluetooth). In some embodiments, some components of the circuit diagram 600 are located within a wrist-worn form factor controller (e.g., a smart watch).

FIG. 6B illustrates two graphs used to illustrate that the circuit design of FIG. 6A ensures that the electrostatic zipping actuators discussed herein can be safely operated in close proximity to humans (e.g., to a human finger), in accordance with some embodiments. Graph 614 illustrates that the electrostatically coupled actuators are class I safe as per IEC standard 62368. The star 616 in graph 614 illustrates the current and voltage are within the safe range. Graph 618 illustrates the current over time of the electrostatic zipping actuator operating at 3100V. In this graph 618 peak currents of ~300 microamps (μA) are shown only for the first 100-150 milliseconds (ms) when turned on, and then close to zero current immediately following being turned on.

Figure 7:
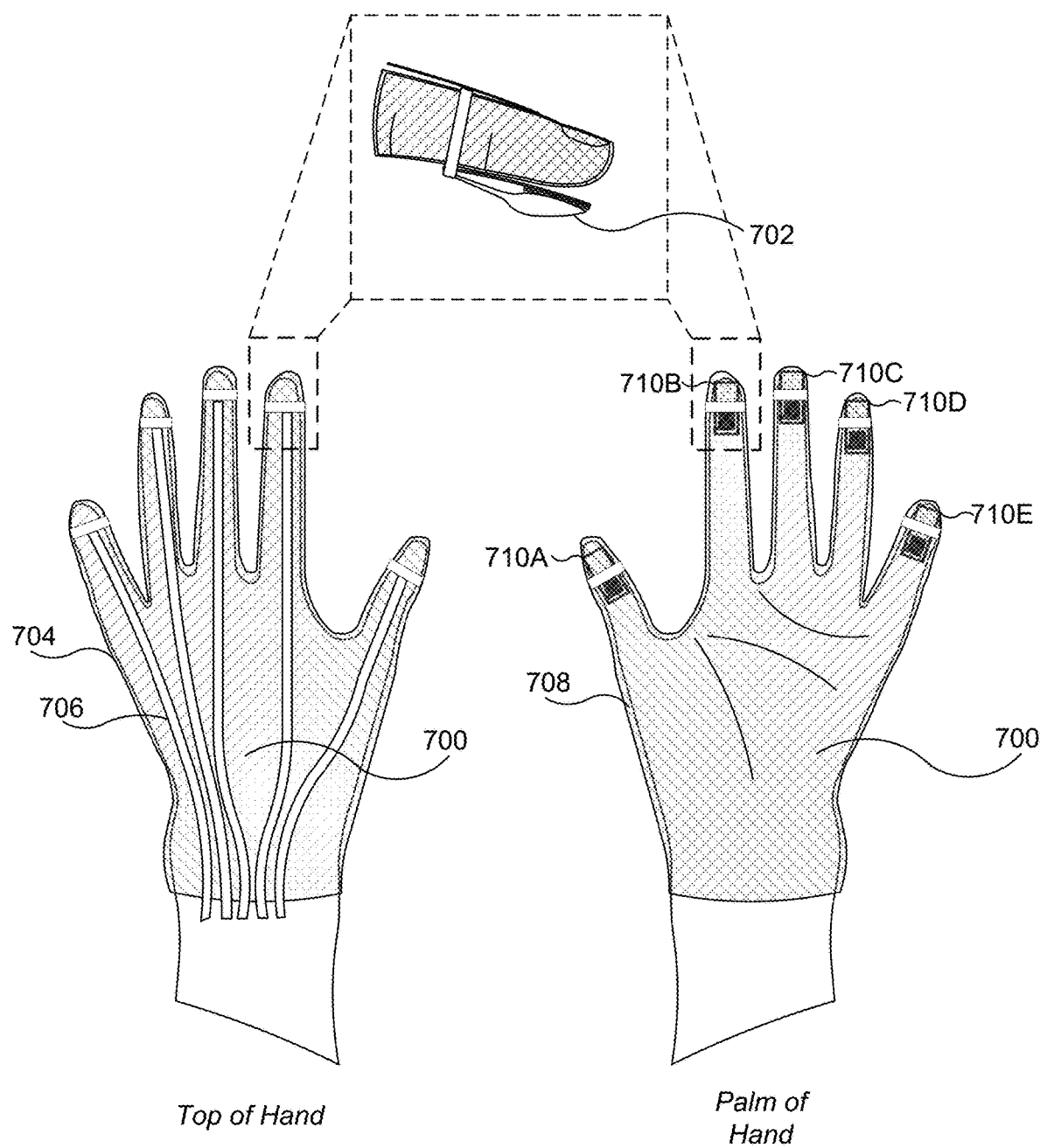
FIG. 7 illustrates top and bottom surfaces of an example wearable glove that includes one or more electrostatic zipping actuator(s) positioned near each finger of a user, the electrostatic zipping actuators used for providing input-recognition and/or input-response purposes as the user interacts with input elements in an artificial-reality environment, in accordance with some embodiments.

FIG. 7 illustrates top and bottom surfaces of an example wearable glove that includes one or more electrostatic zipping actuator(s) positioned near each finger of a user, the electrostatic zipping actuators used for providing input-recognition and/or input-response purposes as the user interacts with input elements in an artificial-reality environment, in accordance with some embodiments. FIG. 7 illustrates a top of the hand 704, which shows how the flexible printed circuit cables 706 can be routed away from the hand to power and circuitry components. A palm of the hand 708 shows electrostatically-controlled actuators 710A-710E placed on each finger of the user. FIG. 7 also shows an expanded view of an electrostatically-controlled actuator, which shows that the electrostatically-controlled actuator can be configured to include a pad (e.g., a stepped silicone pad) to provide space for fluid to store when a force is applied (e.g., squeezing a fluid filled pouch between a surface and a finger of a user). In some embodiments, a pad is configured to isolate actuator's on/off sensation sensed by a user wearing the glove 700 (e.g., isolating the feeling of fluid pooling in another part of the electrostatically-controlled actuator. In some embodiments, the pad is configured to convey the key being pressed when the actuator is pressed on a physical surface.

Figure 8B:
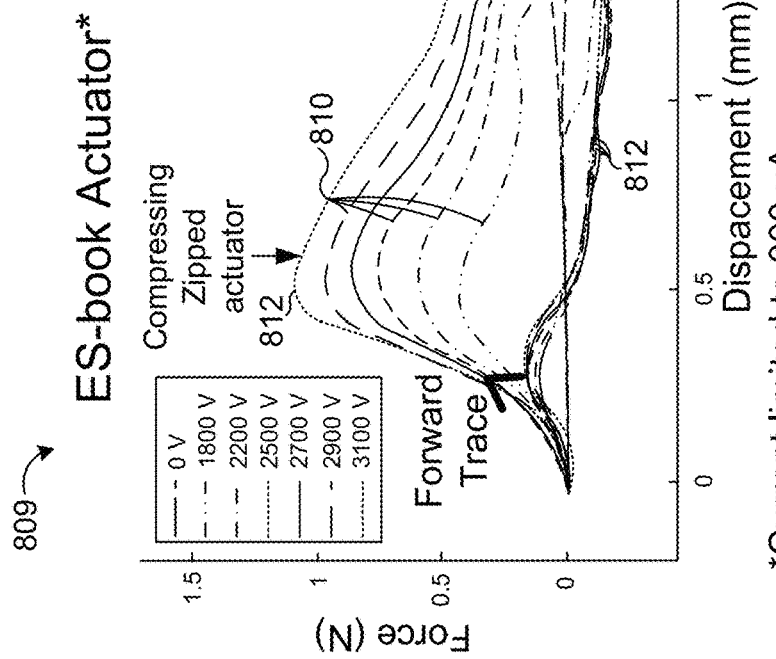
FIGS. 8A and 8B show a comparison between a force-displacement curve associated with a conventional physical keyboard, and a force-displacement curve associated with an electrostatically-controlled actuator, in accordance with some embodiments.
Figure 8A:
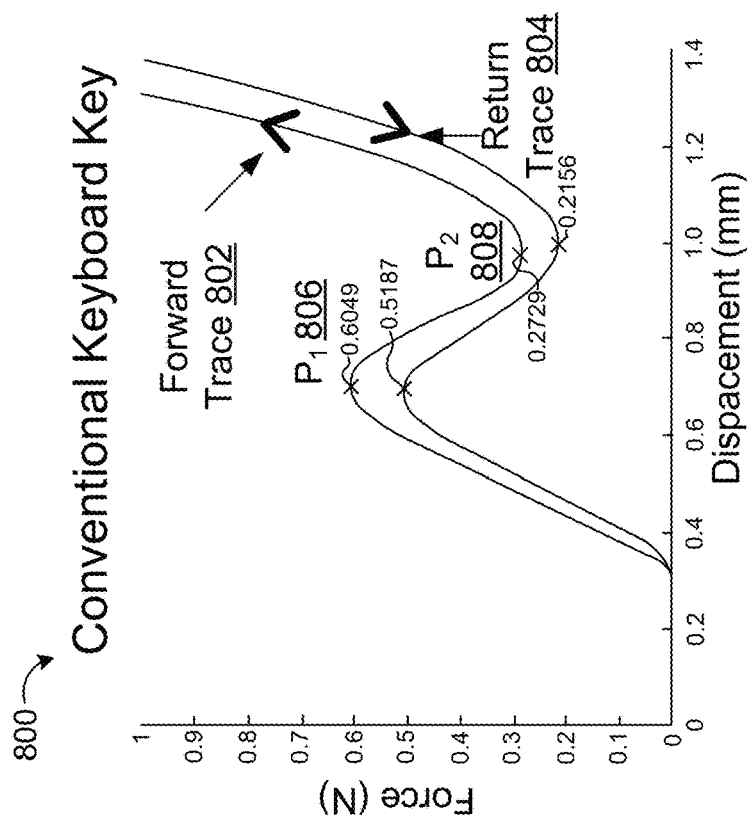

FIGS. 8A and 8B show a comparison between a force-displacement curve associated with a conventional physical keyboard, and a force-displacement curve associated with an electrostatically-controlled actuator, in accordance with some embodiments FIG. 8A shows a graph 800 that shows the force-displacement curve associated with a conventional keyboard switch (e.g., a rubber dome membrane switch, tactile mechanical switch, etc.). Graph 800 shows a forward trace curve 802, which represents the force-displacement for when the keyboard key of a conventional keyboard is depressed. Forward trace curve 802 has a first point, "P1"

806, which represents a first peak force required for displacement. This first point, "P1" 806, can be a tactile bump to indicate to the user that the input to that key has been received. Second point, "P2" 808, shows a valley in the forward trace curve 802, which is the switch traveling before reaching its bottoming out position. After second point, "P2" 808, the switch begins to bottom out in the housing and the force for displacement increases as the switch gets closer to fully bottoming out.

Graph 800 also shows a return trace 804, which represents the force/displacement curve for when the keyboard key of a conventional keyboard is released from its depressed state. This return trace 804 follows a similar trajectory as the forward trace 802, but with less force required, due to mechanical aspects of the switch (e.g., force from a compressed spring, and/or a rubber dome trying to restore itself to its original shape).

FIG. 8B shows a graph 809 that includes a plurality of force-displacement curves associated with electrostatic-book (zipping) actuator, where each curve is associated with the electrostatic-book actuator having different voltages applied. Graph 809 of FIG. 8B shows multiple forward trace curves 810 that emulate the forward trace curve 802 shown in FIG. 8A (i.e., the electrostatic zipping actuator is configured to emulate the force-displacement curve of a conventional keyboard trace). Graph 809 shows that the forward trace curves 810 have a respective first peak 812 at around 0.5 mm of displacement, which is similar to the first point, "P1" 806, shown in FIG. 8A. Similar to forward trace curve 802 shown in FIG. 8A, forward trace curves 810 also require less force to cause further displacement after the respective first peak 812. Similar to the bottom out feel discussed in FIG. 8A, forward trace curves 810, at about 1.5 mm of displacement, require significantly more force to cause more displacement. Unlike a conventional keyboard key, the electrostatic zipping actuator, as illustrated by forward trace curves 810, can be adjusted to have different force-displacement profiles (e.g., a simulated spring weight and/or a simulated membrane collapsing weight can be adjusted) by altering the voltage of the electrostatically-controlled actuator. Graph 809 also shows return trace curves 814, which represents the force-displacement curve for when the user releases the electrostatically-controlled actuator from its compressed state. The return trace curves 814 follow a similar trajectory as forward trace curves 810, but with less force required, due to mechanical aspects of the switch (e.g., force from actuator try to couple (e.g., zip-up)).

Figure 9:
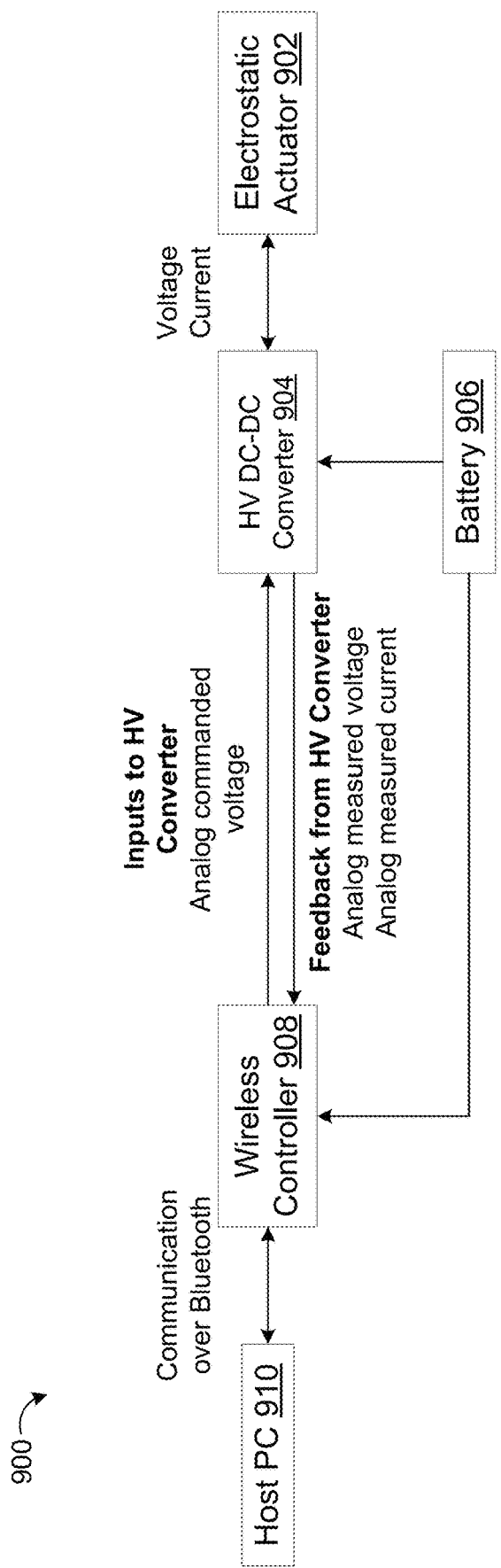
FIG. 9 illustrates a block diagram of a control architecture for a wireless, battery-operated electrostatically-controlled actuator with a high-voltage (HV) direct current to direct current (DC-DC) converter, in accordance with some embodiments.

FIG. 9 illustrates a block diagram of a control architecture for a wireless, battery-operated electrostatically-controlled actuator with a high-voltage (HV) direct current to direct current (DC-DC) converter, in accordance with some embodiments. Schematic 900 of FIG. 9 illustrates an electrostatically-controlled actuator 902 coupled to a high voltage direct current to a HV DC-DC converter 904. The coupling is configured to pass voltage and current to and from the HV DC-DC converter 904 to the electrostatic actuator 902. The HV DC-DC converter 904 is coupled to a battery 906, which supplies direct current to the HV DC-DC converter 904. The battery 906 is also coupled to a wireless controller 908, and supplies power to the controller 908 (e.g., a wireless controller). The controller 908 is coupled to the HV DC-DC converter 904, and is configured to transmit inputs to the HV DC-DC converter 904 (e.g., commands regarding how much voltage to apply to the electrostatic actuator 902 to simulate different interface objects). In some embodiments, the voltage that is commanded is an analog commanded voltage. The HV DC-DC converter 904 is configured to provide feedback to the controller 908. In some embodiments, the feedback includes analog measured voltage and analog measured current. The controller 908 is coupled and in bi-directional communication (e.g., via Bluetooth) with a host PC 910 (e.g., a mobile device, a wearable device, a receiving device, a desktop computer, etc.).

Figure 10:
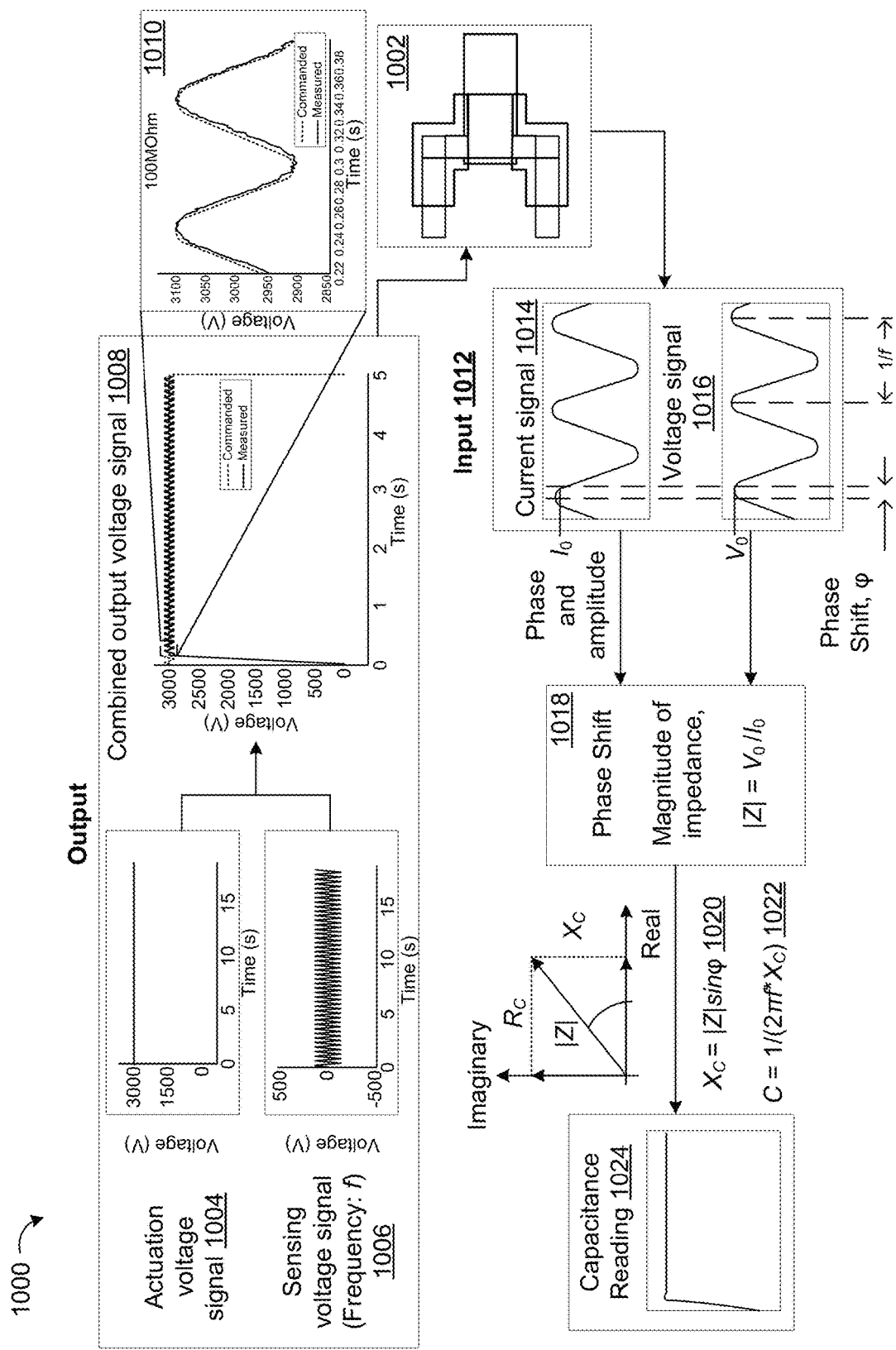
FIG. 10 illustrates how some of the electrostatically-controlled actuators discussed herein can be configured to perform capacitance sensing, in addition to their uses for input-recognition and input-response events (thus, the actuators can serve three different purposes), in accordance with some embodiments.

FIG. 10 illustrates how some of the electrostatically-controlled actuators discussed herein can be configured to perform capacitance sensing, in addition to their uses for input-recognition and input-response events (thus, the actuators can serve three different purposes), in accordance with some embodiments. The capacitance sensing can be used to infer actuator displacement and force output for a given applied voltage based on a learned capacitance-force-displacement model of the actuator. FIG. 10 shows a schematic 1000 for determining a capacitance reading of the electrostatic actuator. The schematic 1000 includes a "Output" section 1002 signifying the output voltage to the electrostatic actuator 1002. The "Output" section shows an actuation voltage graph 1004 and a sensing voltage signal graph 1006. Graph 1008 shows a combined output voltage signal of actuation voltage graph 1004 and a sensing voltage signal graph 1006. To better illustrate graph 1008, zoomed-in graph 1010 is shown, which is a zoomed-in portion of graph 1008. Zoomed-in graph 1010 shows that at 100 Ohms, the commanded voltage is substantially the same as the measured voltage.

FIG. 10 also illustrates in an input section 1012, that takes the inputted current signal, indicated by graph 1014, and the inputted voltage signal, indicated by graph 1016, to determine the magnitude of impedance and the phase shift, indicated by box 1018. In other words, the inputted signal can be processed to determine capacitance. The signal is processed by first finding the magnitude of the impedance by using the equation below:

$$|Z| = \frac{V_0}{I_0}$$

FIG. 10 also shows two additional equations that are used for determining the capacitance reading. As shown in equation 1020, and also shown below, an imaginary component of the capacitance is determined by multiplying determined magnitude, "|Z|," with the sine of the phase shift, "φ."

$$X_c = |Z| \sin \varphi$$

The resulting output of the above equation, $X_c$, is then applied to equation 1022, shown below, which determines capacitance by solving for $C$ in the equation below. The frequency is determined from graph 1016.

$$C = \frac{1}{2\pi f * X_c}$$

Lastly, FIG. 10 shows a resulting determined capacitance reading in graph 1024.

Figure 11:
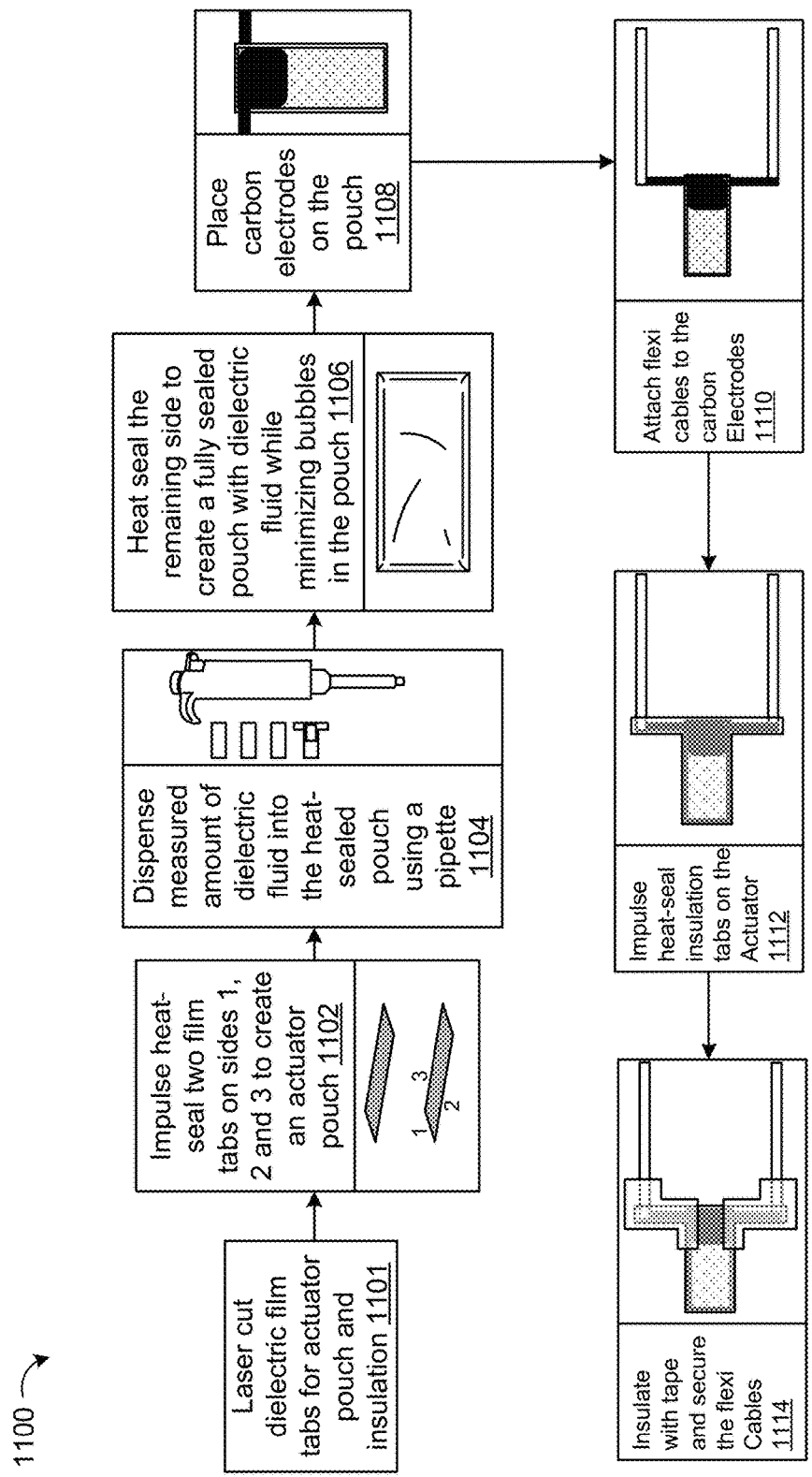
FIG. 11 illustrates a method of manufacturing an electrostatically-controlled actuator, in accordance with some embodiments.

FIG. 11 illustrates a method of manufacturing an electrostatically-controlled actuator, in accordance with some embodiments FIG. 11, at first process 1101, shows that dielectric film tabs for actuator pouch and insulation are laser cut. At second process 1102, three sides of the two film tabs are impulse heat-sealed together. At process 1104, measured amount of dielectric fluid is dispensed, via a pipette, into the heat-sealed pouch. At process 1106, the remaining side is heat sealed to create a fully sealed pouch with dielectric fluid while minimizing bubbles within the pouch. At process 1108, carbon electrodes are placed and/or printed on the pouch. At process 1110, flexi-cables are attached to the carbon electrodes. At process 1112, insulation tabs are heat-sealed on the actuator. At process 1114, the flexi-cables are secured and insulating tape is applied.

Figure 12:
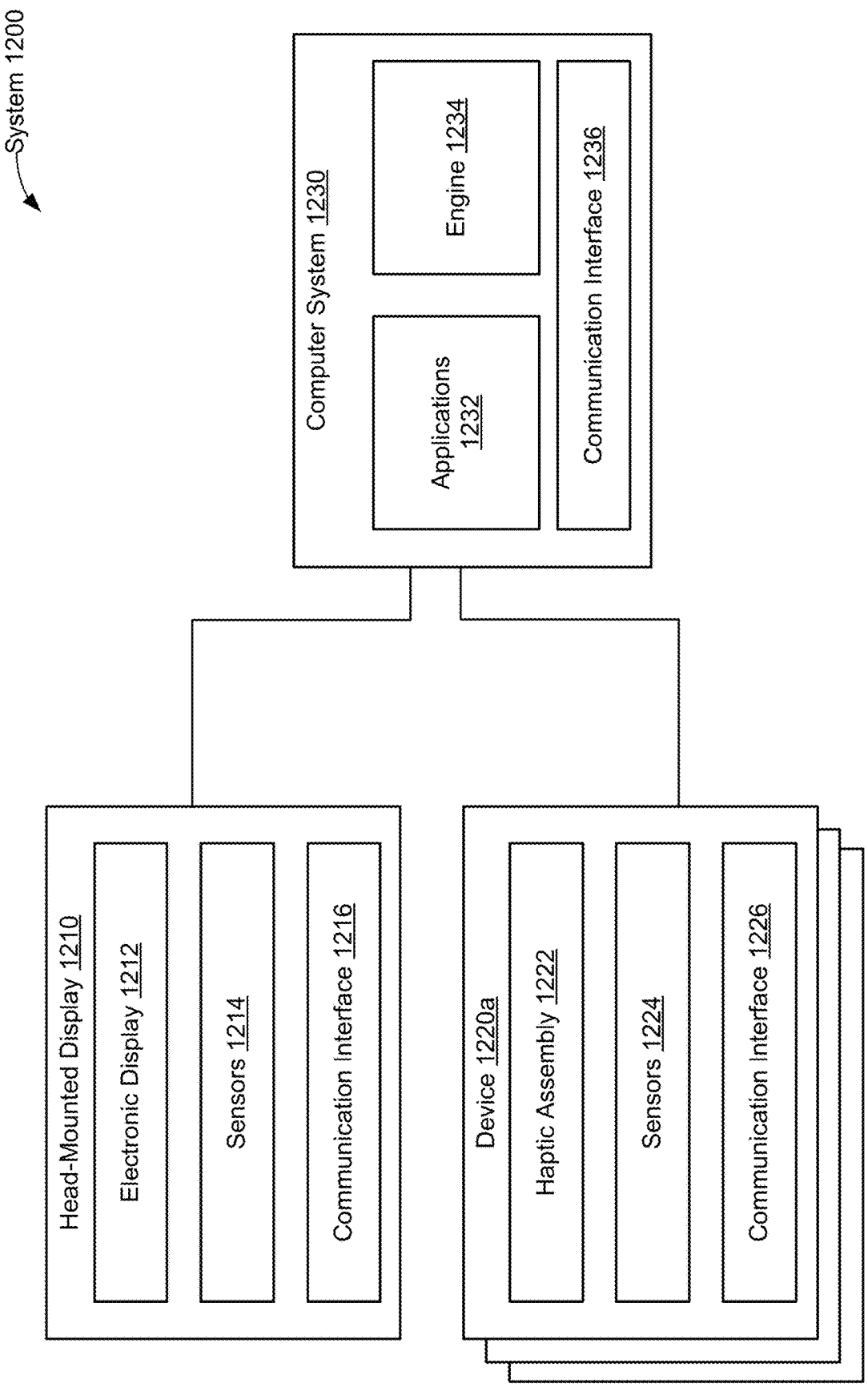
FIG. 12 is a high-level block diagram illustrating an artificial-reality system, in accordance with various embodiments.

FIG. 12 is a high-level block diagram illustrating an artificial-reality system 1200, in accordance with various embodiments. While some example features are illustrated, various other features have not been illustrated for the sake of brevity and so as not to obscure pertinent aspects of the example embodiments disclosed herein. To that end, as a non-limiting example, the system 1200 includes one or more devices 1220 (sometimes referred to as "wearable apparatuses," or simply "apparatuses"), which are used in conjunction with a computer system 1230 (sometimes referred to a "remote computer system") and optionally a head-mounted display 1210. In some embodiments, the one or more devices are integrated into a physical device and operate in lieu of a mechanical switch (e.g., placing a device beneath a keyboard key as shown in FIGS. 3A-3E). In some embodiments, the system 1200 provides the functionality of an artificial-reality device with haptics feedback, an augmented reality device with haptics feedback, or a combination thereof (e.g., artificial-reality headset 104 in FIGS. 1A-1F or augmented-reality headset 202 in FIGS. 2B-2C).

The head-mounted display 1210 presents media to a user. Examples of media presented by the head-mounted display 1210 include images (e.g., images that emulate real-world objects objects), video, audio, or some combination thereof. In some embodiments, audio is presented via an external device (e.g., speakers and/or headphones) that receives audio information from the head-mounted display 1210, the computer system 1230, or both, and presents audio data based on the audio information.

The head-mounted display 1210 includes an electronic display 1212, sensors 1214, and a communication interface 1216. The electronic display 1212 displays images to the user in accordance with data received from the computer system 1230. In various embodiments, the electronic display 1212 may comprise a single electronic display 1212 or multiple electronic displays 1212 (e.g., one display for each eye of a user).

The sensors 1214 include one or more hardware devices that detect spatial and motion information about the head-mounted display 1210. Spatial and motion information can include information about the position, orientation, velocity, rotation, and acceleration of the head-mounted display 1210. For example, the sensors 1214 may include one or more inertial measurement units (IMUs) that detects rotation of the user's head while the user is wearing the head-mounted display 1210. This rotation information can then be used (e.g., by the engine 1234) to adjust the images displayed on the electronic display 1212. In some embodiments, each IMU includes one or more gyroscopes, accelerometers, and/or magnetometers to collect the spatial and motion information. In some embodiments, the sensors 1214 include one or more cameras positioned on the head-mounted display 1210.

The communication interface 1216 enables input and output to the computer system 1230. In some embodiments, the communication interface 1216 is a single communication channel, such as HDMI, USB, VGA, DVI, or DisplayPort. In other embodiments, the communication interface 1216 includes several distinct communication channels operating together or independently. In some embodiments, the communication interface 1216 includes hardware capable of data communications using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, or MiWi) and/or any other suitable communication protocol. The wireless and/or wired connections may be used for sending data collected by the sensors 1214 from the head-mounted display to the computer system 1230. In such embodiments, the communication interface 1216 may also receive audio/visual data to be rendered on the electronic display 1212.

The device 1220 includes a garment worn by the user (e.g., a glove (e.g., a glove 116 shown in FIGS. 1A-2C), a shirt, or pants). In some embodiments, the device 1220 collects information about a portion of the user's body (e.g., the user's hand) that can be used as input for artificial-reality applications 1232 executing on the computer system 1230. In the illustrated embodiment, the device 1220 includes a haptic assembly 1222, sensors 1224, and a communication interface 1226. The device 1220 may include additional components that are not shown in FIG. 12, such as a power source (e.g., an integrated battery, a connection to an external power source, a container containing compressed air, or some combination thereof), one or more processors, and memory.

The haptic assembly 1222 (sometimes referred to as a "haptic feedback mechanism") provides haptic feedback (i.e., haptic stimulations) to the user by forcing a portion of the user's body (e.g., hand) to move in certain ways and/or preventing the portion of the user's body from moving in certain ways. To accomplish this, the haptic assembly 1222 is configured to apply a force that counteracts movements of the user's body detected by the sensors 1214, increasing the rigidity of certain portions of the device 1220, or some combination thereof. Various embodiments of the haptic assembly 1222 are described with reference to FIGS. 1A-11. The device 1220 may include one or more haptic assemblies 1222, as shown in FIGS. 1A-11.

The sensors 1224 include one or more hardware devices that detect spatial and motion information about the device 1220. Spatial and motion information can include information about the position, orientation, velocity, rotation, and acceleration of the device 1220 or any subdivisions of the device 1220, such as fingers, fingertips, knuckles, the palm, or the wrist when the device 1220 is a glove. The sensors 1224 may be IMUs, as discussed above with reference to the sensors 1214.

The communication interface 1226 enables input and output to the computer system 1230. In some embodiments, the communication interface 1226 is a single communication channel, such as USB. In other embodiments, the communication interface 1226 includes several distinct communication channels operating together or independently. For example, the communication interface 1226 may include separate communication channels for receiving control signals for the haptic assembly 1222 and sending data from the sensors 1224 to the computer system 1230. The one or more communication channels of the communication interface 1226 can be implemented as wired or wireless connections. In some embodiments, the communication interface 1226 includes hardware capable of data communications using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, or MiWi), custom or standard wired protocols (e.g., Ethernet, HomePlug, etc.), and/or any other suitable communication protocol, including communication protocols not yet developed as of the filing date of this document.

The computer system 1230 includes a communication interface 1236 that enables input and output to other devices in the system 1200. The communication interface 1236 is similar to the communication interface 1216 and the communication interface 1226.

The computer system 1230 is a computing device that executes artificial-reality applications 1232 (e.g., virtual-reality applications, augmented-reality applications, or the like) to process input data from the sensors 1214 on the head-mounted display 1210 and the sensors 1224 on the device 1220. The computer system 1230 provides output data for (i) the electronic display 1212 on the head-mounted display 1210 and (ii) the haptic assembly 1222 on the device 1220.

In some embodiments, the computer system 1230 sends instructions (e.g., the output data) to the device 1220. In response to receiving the instructions, the device 1220 creates one or more haptic stimulations (e.g., activates one or more of the haptic assemblies 1222). Alternatively, in some embodiments, the computer system 1230 sends instructions to an external device, such as a pressure-changing device (see electrostatic zipping actuator shown in FIGS. 1A-1F and 2B-11), and in response to receiving the instructions, the external device creates one or more haptic stimulations (e.g., the output data bypasses the device 1220). Alternatively, in some embodiments, the computer system 1230 sends instructions to the device 1220, which in turn sends the instructions to the external device. The external device then creates of one or more haptic stimulations. Although not shown, in the embodiments that include a distinct external device, the external device may be connected to the head-mounted display 1210, the device 1220, and/or the computer system 1230 via a wired or wireless connection. The external device may be a pressure changing device such as a pneumatic device, a hydraulic device, some combination thereof, or any other device capable of adjusting pressure (e.g., fluid pressure).

The computer system 1230 can be implemented as any kind of computing device, such as an integrated system-on-a-chip, a microcontroller, a desktop or laptop computer, a server computer, a tablet, a smart phone or other mobile device. Thus, the computer system 1230 includes components common to typical computing devices, such as a processor, random access memory, a storage device, a network interface, an I/O interface, and the like. The processor may be or include one or more microprocessors or application specific integrated circuits (ASICs). The memory may be or include RAM, ROM, DRAM, SRAM and MRAM, and may include firmware, such as static data or fixed instructions, BIOS, system functions, configuration data, and other routines used during the operation of the computing device and the processor. The memory also provides a storage area for data and instructions associated with applications and data handled by the processor.

The storage device provides non-volatile, bulk, or long-term storage of data or instructions in the computing device. The storage device may take the form of a magnetic or solid-state disk, tape, CD, DVD, or other reasonably high capacity addressable or serial storage medium. Multiple storage devices may be provided or available to the computing device. Some of these storage devices may be external to the computing device, such as network storage or cloud-based storage. The network interface includes an interface to a network and can be implemented as either wired or wireless interface. The I/O interface interfaces the processor to peripherals (not shown) such as, for example and depending upon the computing device, sensors, displays, cameras, color sensors, microphones, keyboards, and USB devices.

In the example shown in FIG. 12, the computer system 1230 further includes artificial-reality applications 1232 and an artificial-reality engine 1234. In some embodiments, the artificial-reality applications 1232 and the artificial-reality engine 1234 are implemented as software modules that are stored on the storage device and executed by the processor. Some embodiments of the computer system 1230 include additional or different components than those described in conjunction with FIG. 12. Similarly, the functions further described below may be distributed among components of the computer system 1230 in a different manner than is described here.

Each artificial-reality application 1232 is a group of instructions that, when executed by a processor, generates artificial-reality content for presentation to the user. An artificial-reality application 1232 may generate artificial-reality content in response to inputs received from the user via movement of the head-mounted display 1210 or the device 1220. Examples of artificial-reality applications 1232 include gaming applications, conferencing applications, and video playback applications.

The artificial-reality engine 1234 is a software module that allows artificial-reality applications 1232 to operate in conjunction with the head-mounted display 1210 and the device 1220. In some embodiments, the artificial-reality engine 1234 receives information from the sensors 1214 on the head-mounted display 1210 and provides the information to an artificial-reality application 1232. Based on the received information, the artificial-reality engine 1234 determines media content to provide to the head-mounted display 1210 for presentation to the user via the electronic display 1212 and/or a type of haptic feedback to be created by the haptic assembly 1222 of the device 1220. For example, if the artificial-reality engine 1234 receives information from the sensors 1214 on the head-mounted display 1210 indicating that the user has looked to the left, the artificial-reality engine 1234 generates content for the head-mounted display 1210 that mirrors the user's movement in an artificial environment.

Similarly, in some embodiments, the artificial-reality engine 1234 receives information from the sensors 1224 on the device 1220 and provides the information to an artificial-reality application 1232. The application 1232 can use the information to perform an action within the artificial world of the application 1232. For example, if the artificial-reality engine 1234 receives information from the sensors 1224 that the user has closed his fingers around a position corresponding to a coffee mug in the artificial environment and raised his hand, a simulated hand in the artificial-reality application 1232 picks up the artificial coffee mug and lifts it to a corresponding height. As noted above, the information received by the artificial-reality engine 1234 can also include information from the head-mounted display 1210. For example, cameras on the head-mounted display 1210 may capture movements of the device 1220, and the application 1232 can use this additional information to perform the action within the artificial world of the application 1232.

The artificial-reality engine 1234 may also provide feedback to the user that the action was performed. The provided feedback may be visual via the electronic display 1212 in the head-mounted display 1210 (e.g., displaying the simulated hand as it picks up and lifts the virtual coffee mug) and/or haptic feedback via the haptic assembly 1222 in the device 1220. For example, the haptic feedback may prevent (or, at a minimum, hinder/resist movement of) one or more of the user's fingers from curling past a certain point to simulate the sensation of touching a solid coffee mug. To do this, the device 1220 changes (either directly or indirectly) a pressurized state of one or more of the haptic assemblies 1222. Each of the haptic assemblies 1222 includes a mechanism that, at a minimum, provides resistance when the respective haptic assembly 1222 is transitioned from a first pressurized state (e.g., atmospheric pressure or deflated) to a second pressurized state (e.g., inflated to a threshold pressure). Structures of haptic assemblies 1222 are discussed in further detail above with reference to FIGS. 1A-11.

As noted above, the haptic assemblies 1222 described herein are configured to transition between a first pressurized state and a second pressurized state to provide haptic feedback to the user. Due to the ever-changing nature of artificial reality, the haptic assemblies 1222 may be required to transition between the two states hundreds, or perhaps thousands of times, during a single use. Thus, the haptic assemblies 1222 described herein are durable and designed to quickly transition from state to state. To provide some context, in the first pressurized state, the haptic assemblies 1222 do not impede free movement of a portion of the wearer's body. For example, one or more haptic assemblies 1222 incorporated into a glove are made from flexible materials that do not impede free movement of the wearer's hand and fingers (e.g., the electrostatic-zipping actuator, shown in FIGS. 1A-5C, 7-8B, and 11 is made from a flexible polymer). The haptic assemblies 1222 are configured to conform to a shape of the portion of the wearer's body when in the first pressurized state. However, once in the second pressurized state, the haptic assemblies 1222 are configured to impede free movement of the portion of the wearer's body. For example, the respective haptic assembly 1222 (or multiple respective haptic assemblies) can restrict movement of a wearer's finger (e.g., prevent the finger from curling or extending) when the haptic assembly 1222 is in the second pressurized state. Moreover, once in the second pressurized state, the haptic assemblies 1222 may take different shapes, with some haptic assemblies 1222 configured to take a planar, rigid shape (e.g., flat and rigid), while some other haptic assemblies 1222 are configured to curve or bend, at least partially.

Figure 13:
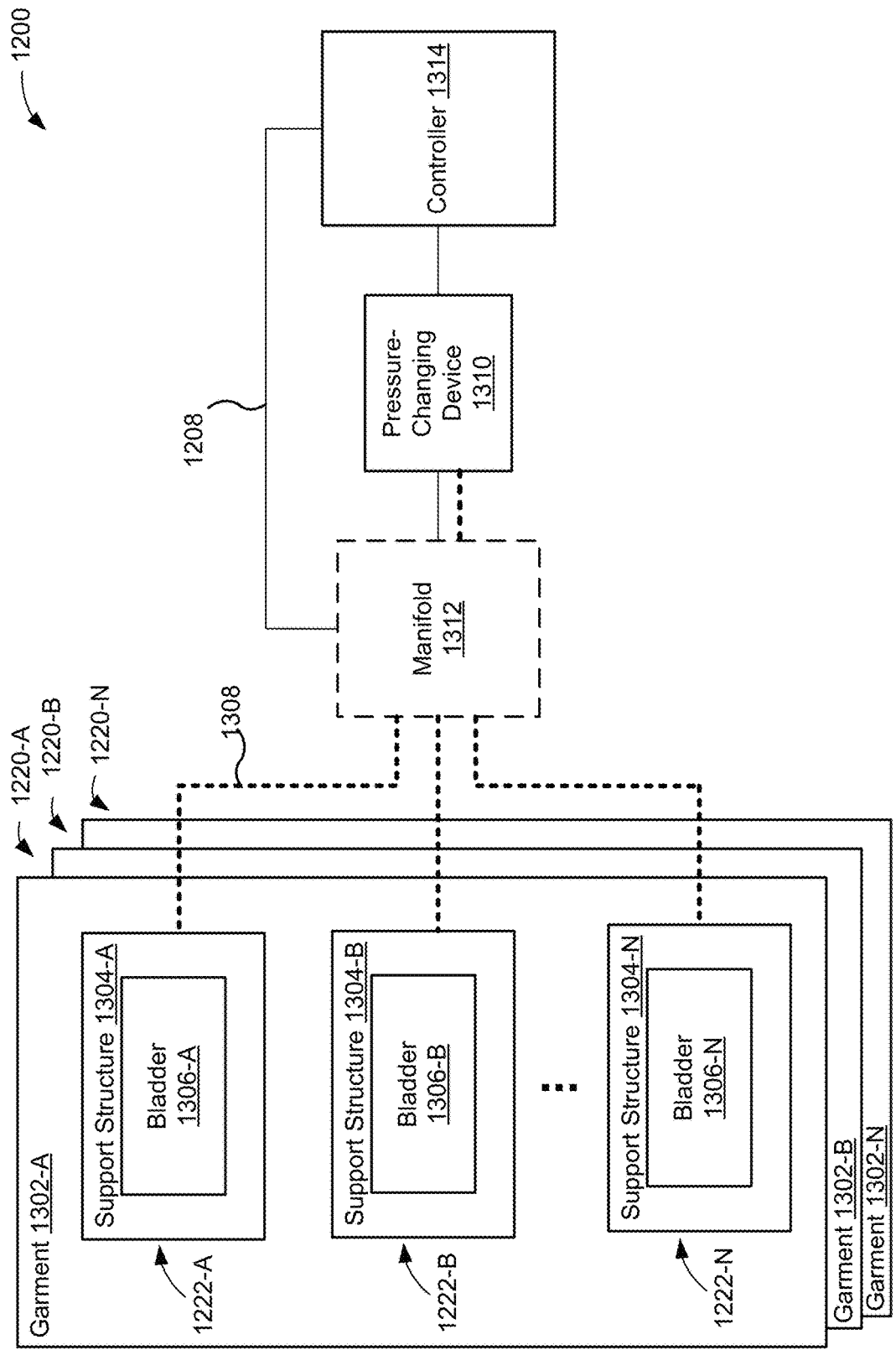
FIG. 13 is a schematic showing additional components that can be used with the artificial-reality system of FIG. 12, in accordance with some embodiments.

FIG. 13 is a schematic showing additional components that can be used with the artificial-reality system 1200 of FIG. 12, in accordance with some embodiments. The components in FIG. 13 are illustrated in a particular arrangement for ease of illustration and one skilled in the art will appreciate that other arrangements are possible. Moreover, while some example features are illustrated, various other features have not been illustrated for the sake of brevity and so as not to obscure pertinent aspects of the example implementations disclosed herein.

As a non-limiting example, the system 1200 includes a plurality of devices 1220-A, 1220-B, . . . 1220-N, each of which includes a garment 1302 and one or more haptic assemblies 1222 (e.g., haptic assemblies 1222-A, 1222-B, . . . , 1222-N). As explained above, the haptic assemblies 1222 are configured to provide haptic stimulations to a wearer of the device 1220. The garment 1302 of each device 1220 can be various articles of clothing (e.g., gloves, socks, shirts, or pants), and thus, the user may wear multiple devices 1220 that provide haptic stimulations to different parts of the body. Each haptic assembly 1222 is coupled to (e.g., embedded in or attached to) the garment 1302. Further, each haptic assembly 1222 includes a support structure 1304 and at least one bladder 1306. The bladder 1306 (e.g., a membrane) is a sealed, inflatable pocket made from a durable and puncture resistance material, such as thermoplastic polyurethane (TPU), a flexible polymer, or the like. The bladder 1306 contains a medium (e.g., a fluid such as air, inert gas, or even a liquid) that can be added to or removed from the bladder 1306 to change a pressure (e.g., fluid pressure) inside the bladder 1306. The support structure 1304 is made from a material that is stronger and stiffer than the material of the bladder 1306. A respective support structure 1304 coupled to a respective bladder 1306 is configured to reinforce the respective bladder 1306 as the respective bladder changes shape and size due to changes in pressure (e.g., fluid pressure) inside the bladder.

The system 1200 also includes a controller 1314 and a pressure-changing device 1310. In some embodiments, the controller 1314 is part of the computer system 1230 (e.g., the processor of the computer system 1230). The controller 1314 is configured to control operation of the pressure-changing device 1310, and in turn operation of the devices 1220. For example, the controller 1314 sends one or more signals to the pressure-changing device 1310 to activate the pressure-changing device 1310 (e.g., turn it on and off). The one or more signals may specify a desired pressure (e.g., pounds-per-square inch) to be output by the pressure-changing device 1310. Generation of the one or more signals, and in turn the pressure output by the pressure-changing device 1310, may be based on information collected by the sensors 1214 and/or the sensors 1224 (FIG. 12). For example, the one or more signals may cause the pressure-changing device 1310 to increase the pressure (e.g., fluid pressure) inside a first haptic assembly 1222 at a first time, based on the information collected by the sensors 1214 and/or the sensors 1224 (e.g., the user makes contact with the artificial coffee mug). Then, the controller may send one or more additional signals to the pressure-changing device 1310 that cause the pressure-changing device 1310 to further increase the pressure inside the first haptic assembly 1222 at a second time after the first time, based on additional information collected by the sensors 1214 and/or sensors 1224 (e.g., the user grasps and lifts the artificial coffee mug). Further, the one or more signals may cause the pressure-changing device 1310 to inflate one or more bladders 1306 in a first device 1220-A, while one or more bladders 1306 in a second device 1220-B remain unchanged. Additionally, the one or more signals may cause the pressure-changing device 1310 to inflate one or more bladders 1306 in a first device 1220-A to a first pressure and inflate one or more other bladders 1306 in the first device 1220-A to a second pressure different from the first pressure. Depending on the number of devices 1220 serviced by the pressure-changing device 1310, and the number of bladders therein, many different inflation configurations can be achieved through the one or more signals and the examples above are not meant to be limiting.

The system 1200 may include an optional manifold 1312 between the pressure-changing device 1310 and the devices 1220. The manifold 1312 may include one or more valves (not shown) that pneumatically couple each of the haptic assemblies 1222 with the pressure-changing device 1310 via tubing 1308. In some embodiments, the manifold 1312 is in communication with the controller 1314, and the controller 1314 controls the one or more valves of the manifold 1312 (e.g., the controller generates one or more control signals). The manifold 1312 is configured to switchably couple the pressure-changing device 1310 with one or more haptic assemblies 1222 of the same or different devices 1220 based on one or more control signals from the controller 1314. In some embodiments, instead of using the manifold 1312 to pneumatically couple the pressure-changing device 1310 with the haptic assemblies 1222, the system 1200 may include multiple pressure-changing devices 1310, where each pressure-changing device 1310 is pneumatically coupled directly with a single (or multiple) haptic assembly 1222. In some embodiments, the pressure-changing device 1310 and the optional manifold 1312 can be configured as part of one or more of the devices 1220 (not illustrated) while, in other embodiments, the pressure-changing device 1310 and the optional manifold 1312 can be configured as external to the device 1220. A single pressure-changing device 1310 may be shared by multiple devices 1220.

In some embodiments, the pressure-changing device 1310 is a pneumatic device, hydraulic device, a pneudraulic device, or some other device capable of adding and removing a medium (e.g., fluid, liquid, gas) from the one or more haptic assemblies 1222.

The devices shown in FIG. 13 may be coupled via a wired connection (e.g., via busing 1208). Alternatively, one or more of the devices shown in FIG. 13 may be wirelessly connected (e.g., via short-range communication signals).

Figure 15:
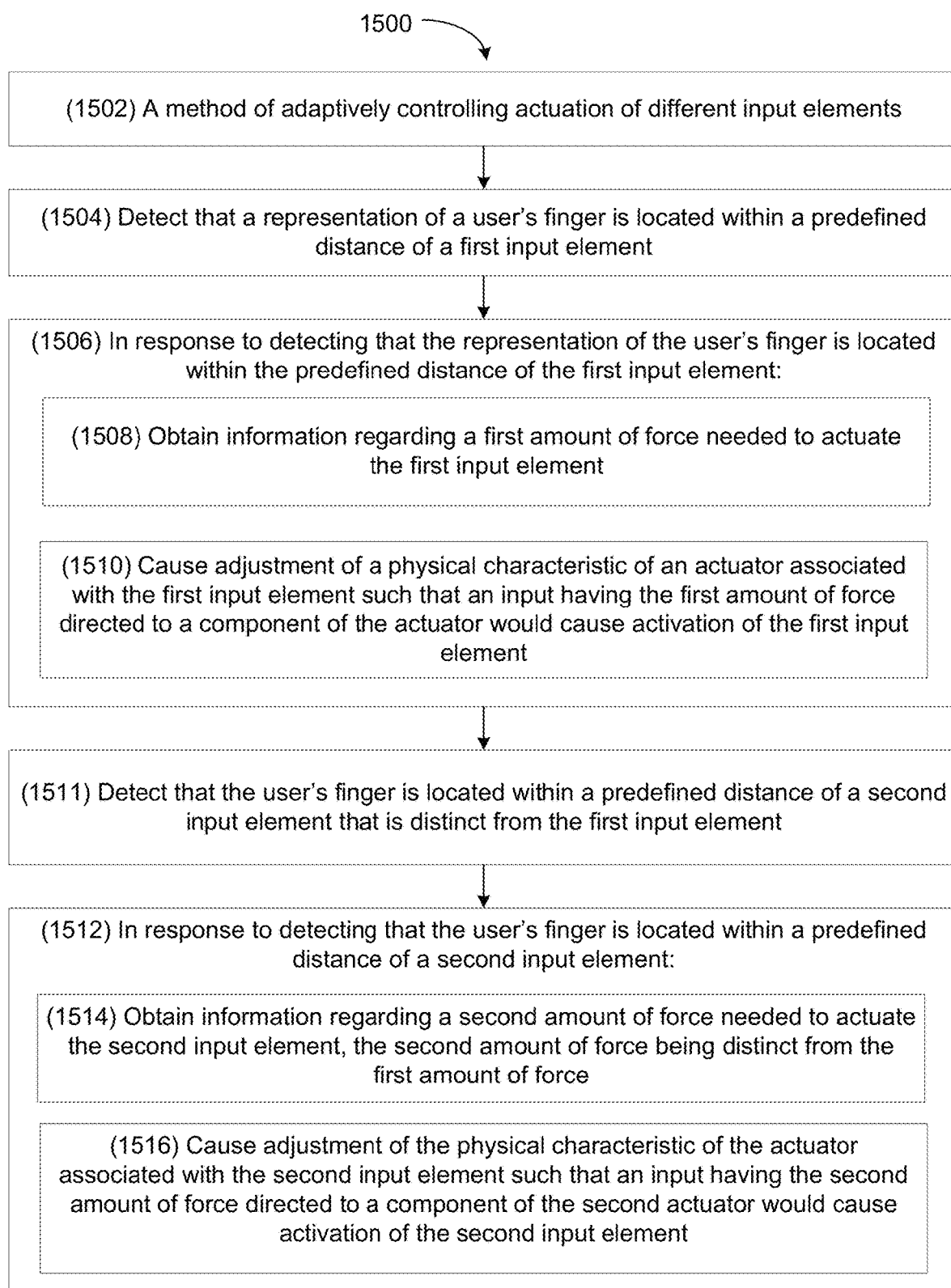
FIG. 15 is a flowchart of a method of adaptively controlling activation of different input elements, in accordance with some embodiments.

FIG. 15 is a flowchart of a method of adaptively controlling activation of different input elements, in accordance with some embodiments. In some embodiments, a method (1500) of adaptively controlling activation of different input elements (1502), comprises, detecting (1504) that a representation of a user's finger is located within a predefined distance of a first input element (e.g., the predefined distance is less than 1 inch). In some embodiments, the representation can be the user's finger itself or can be a representation of the finger that is presented for viewing in an artificial-reality environment. In some embodiments, the input element can be a virtual or physical key of a keyboard (e.g., virtual keyboard 110) or can be another type of input element, such as a virtual or physical light switch, a virtual gun trigger, a mouse switch (e.g., virtual mouse 113 in FIGS. 1D-1F). In some embodiments, predefined distance can be a distance of approximately 0-3 mm, such that it covers the finger being very close to or over the keyboard key. In some embodiments, the detecting can be performed by using a change in capacitance detected by an actuation component of the keyboard key. In response to detecting (1506) that the representation of the user's finger is located within the predefined distance of a first input element, information (e.g., information for simulating the first input—for example, if the user interface element is a light switch, the amount of force will be matched to a light switch in the physical world) regarding a first amount of force needed to actuate the first input element is obtained. Thereby causing an adjustment of a physical characteristic (e.g., the force required to adjust the volume of a actuator, which can be controlled by adjusting a voltage applied to one or more electrodes of the actuator thereby causing a change in the force require to "unzip" the actuator) of an actuator associated with the first input element such that an input having the first amount of force directed to a component of the actuator would cause activation of the first input element (e.g., FIGS. 1A-1C show that when the user's hand is over a virtual keyboard 110, the electrostatic actuator 118 has a predefined voltage 3100 V applied to simulate a keyboard switch). Detecting that the user's finger is located within a predefined distance of a second input element (e.g., a virtual mouse 113 in FIGS. 1D-1F) that is distinct from the first input element. In response to detecting that the user's finger is located within a predefined distance of a second input element (e.g., FIG. 1D shows the hand of the user over the virtual mouse 113), information regarding a second amount of force needed to actuate the second input element is obtained, the second amount of force being distinct from the first amount of force, and adjustment of the physical characteristic of the actuator associated with the second input element such that an input having the second amount of force directed to a component of the second actuator would cause activation of the second input element is caused. For example, FIGS. 1D-1F shows that when the user's hand is over a virtual mouse 113, the electrostatic actuator 118 has a predefined voltage 2200 V to simulate a mouse switch.

In some embodiments, while the actuator is associated with the first amount of force, an input having the first amount of force applied by the user's finger to the component of the actuator is detected, and the first input element (e.g., by the actuator coming into contact with a surface by the way of the finger moving) to cause an input command to be performed is activated. For example, FIGS. 1A-1C show the electrostatic actuator 118 being activated at the virtual keyboard 110, which causes the letter "H" 121 being displayed on the virtual display device 111.

In some embodiments, in response to activating the first input element to cause the input command to be performed, display a result of the input command in an artificial-reality environment. In some embodiments, FIGS. 1A-1C show the electrostatic actuator 118 being activated at the virtual keyboard 110, which causes the letter "H" 121 being displayed on the virtual display device 111.

In some embodiments, after activating the first input element and while the actuator is associated with the second amount of force, an input having the second amount of force applied by the user's finger to the component of the actuator is activated, and the second input element to cause a different input command is activated, distinct from the input command, to be performed. For example, FIGS. 1D-1F show the electrostatic actuator 118 being activated again while associated with the virtual mouse 113, which causes the letter "H" 121 to be highlighted (e.g., indicated by highlighted letter "H" 145 on the virtual display device 111).

In some embodiments, in response to activating the second input element to cause the different input command to be performed, a result of the different input command in an artificial-reality environment is displayed. For example, the result can include simulating that the input element displayed in the artificial-reality display environment has been selected, such as by simulating a keyboard key moving down after the input command is received, or simulating a light switch being toggled on after the input command is received and then showing a result of that activation by displaying a character in the AR environment that is associated with the activated key.

In some embodiments, causing adjustment of the physical characteristic of the actuator includes, causing adjustment of a voltage that is provided to a portion of the component of the actuator. For example, the actuator is a dielectric filled pouch that has two or more electrodes that are configured to squeeze the pouch, and in some embodiments, the force that it takes to stop the squeezing of the pouch is adjustable by adjusting the charge.

In some embodiments, after the input having the first amount of force is no longer applied by the user's finger to the component of the actuator, provide a first haptic response to the user's finger via the component of the actuator. For example, FIGS. 1A-1C show that when the user's hand is over a virtual keyboard 110, the electrostatic actuator 118 has a predefined voltage 3100 V applied to simulate the force of pressing a keyboard switch). In some embodiments, after the input having the second amount of force is no longer applied by the user's finger to the component of the actuator, provide a second haptic response to the user's finger via the component of the actuator, the second haptic response being distinct from the first haptic response. For example, FIGS. 1D-1F shows that when the user's hand is over a virtual mouse 113, the electrostatic actuator 118 has a predefined voltage 2200 V to simulate the force of pressing a mouse switch.

In some embodiments, the different force thresholds are controlled by changing an amount or type of charge (voltage) present at electrodes that are near a portion of the bladder of the actuator. Due to this, the haptic response can be varied because some of the dielectric that is only within the unzipped portion of the bladder will move back to a zipper portion of the bladder once the finger is no longer applying force needed to exceed the currently associated force threshold. This movement will differ depending on how much (and what type) of charge is present at the electrodes (e.g., more charge will cause the zipped portion to zip more quickly, which provides a different haptic response than when less charge is present and the zipped portion zips more slowly). Charge levels can also be dynamically varied during inputs such that charge amounts and types can be dynamically varied both to alter force thresholds on the front end (e.g., before an input is detected) and on the backend (e.g., before a haptic response is provided after input detection).

The first and second haptic responses can also be dynamically adjusted based on a capacitance that can be sensed using aspects of the actuator itself. For instance, as the user's finger is removed from the first input element, the first haptic response can be varied as the capacitance value is determined to decrease due to the user's finger being gradually removed from pressing against the component of the actuator that was current associated with the first input element. As a more specific example, the first haptic response can include a first haptic feedback portion in which the charge at one portion of the component of the actuator (e.g., the portion that is not in direct contact with the user's finger) is increased or varied to provide the first haptic feedback portion to the user's finger (e.g., a pushing or vibrative feeling against the user's finger) and the first haptic response can also include a second haptic feedback portion, distinct from the first haptic feedback portion, that is lesser in intensity as the user's finger is being removed from pressing against the component of the actuator. The capacitance-sensing aspect of the actuator is also described in more detail below in reference to FIG. 10.

In some embodiments, the component of the actuator is a bladder that includes a dielectric substance (e.g., dielectric fluid 416 in FIG. 4B), the portion of the component of the actuator is coupled with two or more electrodes (e.g., electrode 408 and other electrode 418 in FIG. 4B; and electrodes 502, 504, 508A-508D, 514, and 516 in FIGS. 5A-5C), the charge is adjusted for at least one of the two or more electrodes, and the component of the actuator includes an additional portion to which force from the user's finger is applied. For example, FIGS. 5A-5C illustrate portions of the electrostatic actuator not covered by the electrodes (pictured in black solid-fill)). For example, the inputs having the first and second amounts of force are applied at the additional portion of the component of the actuator.

In some embodiments, charge is independently adjustable at each of the two or more electrodes to cause changes in an amount of force directed to the component of the actuator that would cause activation of a respective input element that is located within the predefined distance of a respective input element. For example, FIG. 8B illustrates that applying different voltages across the electrodes results in different force thresholds for unzipping (e.g., separating) the electrostatic actuator.

In some embodiments, detecting that a representation of a different finger of the user is located within an additional predefined distance of a third input element that is distinct from the first and second input elements. In some embodiments, the predefined distance can be the same or a different predefined distance. When the input elements are of a same type (e.g., all keyboard keys), then the predefined distances can be the same. In some embodiments, the input element can be a virtual or physical key of a keyboard or can be another type of input element, such as a virtual or physical light switch, a virtual gun trigger, a virtual mouse; predefined distance can be a distance of approximately 0-3 mm, such that it covers the finger being very close to or over the keyboard key; the detecting can be performed by using a change in capacitance detected by an actuation component of the keyboard key. In some embodiments, in response to detecting that a representation of the user's different finger is located within the additional predefined distance of the third input element and while the actuator is associated with the first amount of force or the second amount of force: obtaining information regarding a third amount of force needed to actuate the third input element; and causing adjustment of a physical characteristic of another actuator associated with the third input element such that an input having the third amount of force directed to a component of the other actuator would cause activation of the third input element.

Stated another way, some embodiments described herein can allow for independent control of various actuators associated with different fingers of the user to allow for associating different force thresholds with different input elements that are near different of the user's fingers. As described, one illustrative example is a wearable glove that can include actuators within or near fingertips of the gloves and each of those actuators can be independently controlled based on determinations as to which input elements each of the representations of the user's fingers is near (e.g., within a particular predefined distance of).

In some embodiments, the first input element and the second input element are presented to the user as virtual keys within an artificial-reality environment (e.g., virtual keyboard 110 in FIGS. 1A-1C). Virtual keys are just one illustrative example used herein, and other types of virtual (and physical) input elements are also contemplated. Further, the first and second input elements need not be the same type of input element, such that the first input element can be a virtual key on a keyboard and the second input element can be a virtual light switch, etc.

In some embodiments, the first input element and the second input element are one of: a light switch, a keyboard key on a mobile device, a keyboard key on a detached keyboard (e.g., physical keyboard 300 in FIGS. 3A-3E), a keyboard key integrated into a housing of a laptop, a trackpad button, or a mouse button.

Figure 14:
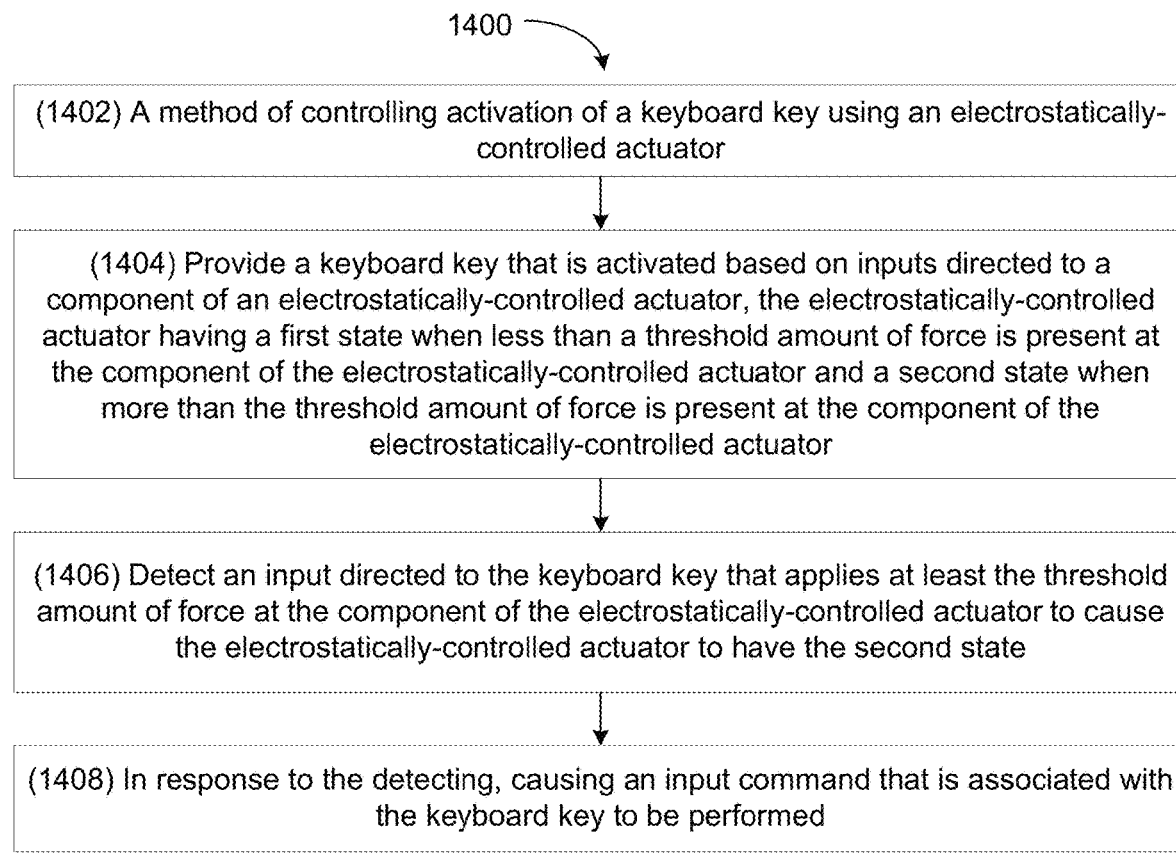
FIG. 14 is a flowchart of a method of controlling activation of a keyboard key using an electrostatically-controlled actuator, in accordance with some embodiments.

FIG. 14 is a flowchart of a method of controlling activation of a keyboard key using an electrostatically-controlled actuator, in accordance with some embodiments. In some embodiments, a method (1400) of controlling activation of a keyboard key using an electrostatically-controlled actuator (1402) comprises providing (1404) a keyboard key that is activated based on inputs directed to a component of an electrostatically-controlled actuator (the component can be a portion of the bladder of an electrostatically-controlled actuator that is filled with a substance when the actuator is in its zipped state, and there is another portion of the component that only fills with the substance with the actuator is in its unzipped state), the electrostatically-controlled actuator having a first (zipped) state when less than a threshold amount of force is present at the component of the electrostatically-controlled actuator and a second (unzipped) state when more than the threshold amount of force is present at the component of the electrostatically-controlled actuator (e.g., FIG. 1A illustrates the electrostatically-controlled actuator 118 in a first (zipped) state, and FIG. 1B illustrates the electrostatically-controlled actuator 118 in a second (unzipped) state). In some embodiments, the keyboard key can be a physical key on a physical keyboard or can be a virtual key present in an artificial-reality environment; the electrostatically-controlled actuator can be a part of the physical keyboard or can be associated with a wearable device, such as a glove, by which inputs can be provided to actuate virtual keys.

The method comprises detecting (1406) an input directed to the keyboard key that applies at least the threshold amount of force at the component of the electrostatically-controlled actuator to cause the electrostatically-controlled actuator to have the second state (e.g., FIG. 1B illustrates the electrostatically-controlled actuator 118 in a second (unzipped) state in response to the fingertip 120 of the user 102 pressing down on the electrostatically-controlled actuator 118). The method comprises in response to the detecting, causing (1408) an input command that is associated with the keyboard key to be performed (e.g., FIG. 1B illustrates the letter "H" 121 being displayed in response to a threshold amount of force being received at the electrostatically-controlled actuator 118).

In some embodiments, the keyboard key is a part of a physical keyboard (e.g., FIGS. 3A-3E illustrate a physical keyboard 300 that has electrostatically-controlled actuators placed beneath the keys of the physical keyboard 300).

In some embodiments, the keyboard key is part of a virtual keyboard display in an artificial-reality environment (e.g., an artificial reality or an augmented reality) and the electrostatically-controlled actuator is coupled with a wearable device worn by a user. For example, FIGS. 1A-1F and 2B-2C each illustrated a virtual keyboard 110 displayed in an artificial reality environment.

In some embodiments, the wearable device is a glove (e.g., FIGS. 1A-2C and 7 all illustrate the user of the device wearing a glove that includes one or more electrostatically-controlled actuators). In some embodiments, multiple electrostatically-controlled actuators are coupled to the glove (e.g., each finger-tip). In some embodiments, more than one electrostatically-controlled actuator can be placed on each finger. In some embodiments, the glove is connected to another wearable device such as a smart watch or other worn device that can process the received inputs. In some embodiments, the glove is in wireless communication with an external device (e.g., via a Bluetooth connection or Wi-Fi) to control the glove.

In some embodiments, in response to the input directed to the keyboard key that applies at least the threshold amount of force, the electrostatically-controlled actuator moves to the second state when fluid (e.g., dielectric fluids such as Cargill FR3, Novec 7300 and Novec 7500) moves from a first place within the electrostatically-controlled actuator to another place within the electrostatically-controlled (e.g., electrostatically-controlled actuator 118 includes a fluid (or fluid-like material) filled pouch that when compressed and unzipped opens up additional space for the fluid to travel to). In some embodiments, the threshold amount of force is an amount of force necessary to overcome an electrostatic force present near a portion of the component of the actuator. (e.g., enough force to separate the charged electrodes from one another, thereby causing the actuator to shift to its unzipped state).

In some embodiments, the method comprises providing another keyboard key that is activated based on inputs directed to another component of another electrostatically-controlled actuator, the other electrostatically-controlled actuator having a third state when less than another threshold amount of force, different than the threshold amount of force, is present at the other component of the other electrostatically-controlled actuator and a fourth state when more than the other threshold amount of force is present at the other component of the other electrostatically-controlled actuator. In some embodiments, the other threshold amount of force is distinct from the threshold amount of force. For example, FIG. 3A shows electronic zipping actuator 304 placed beneath a number lock keycap 305 has a force-displacement curve 308 (at 3100 V), and electrostatic zipping actuator 306 placed beneath number keycap 307 has a different force-displacement curve 312 (at 2200V). Stated another way, multiple keys of a virtual or physical keyboard can each be associated with different electrostatically-controlled actuators and different force thresholds.

In some embodiments, the component of the electrostatically-controlled actuator is coupled with a first portion of a wearable glove that is in contact with a user's first finger, and the other component of the electrostatically-controlled actuator is coupled with a second portion of the wearable glove that is in contact with a user's second finger. For example, FIG. 7 illustrates that electrostatically-controlled actuators (710A-710E) are placed beneath each of the user's fingertip.

In some embodiments, the method comprises after the detecting, providing a haptic response via the component of the electrostatically-controlled actuator. In some embodiments, this haptic response can be caused due to the electrostatic force overtaking the force that was previously applied by the user's finger to cause activation of the keyboard key, which then causes the user's finger to feel the substance (e.g., a fluid) moving back to the unzipped portion of the actuator. In other embodiments, another haptic feedback generator provides the haptic response (e.g., a vibrational motor) or provides an additional haptic response beyond that provided by the component of the actuator itself.

In some embodiments, the threshold amount of force is a first threshold amount of force, and the first threshold amount of force is associated with a first subset of keys on a keyboard (e.g., the alphanumeric keys or specifically the home row keys), and a second amount of force is associated with a second subset of keys on a keyboard (e.g., modifier keys, function keys, etc.). In some embodiments, the second amount force is set at a level high enough to inform the user the that the subset of keys is not selectable. In some embodiments, the second amount of force can indicate the user which keys are being pressed. In some embodiments, the second amount of force stops users from erroneously selecting a user input element (e.g., the escape key is harder to press in an environment where the escape key would delete unsaved work). For example, FIG. 3A shows electronic zipping actuator 304 placed beneath a number lock keycap 305 (e.g., a modifier key) has a force-displacement curve 308 (at 3100 V), and electrostatic zipping actuator 306 placed beneath number keycap 307 (e.g., an alphanumeric key) has a different force-displacement curve 312 (at 2200V).

In some embodiments, in response to determining that the keyboard key should be disabled, causing the component of the electrostatically-controlled actuator to remain only in a third state in which any amount of force at the component of the electrostatically-controlled actuator does not cause the component of the electrostatically-controlled actuator to change its state, wherein the third state is distinct from the first and second states (e.g., FIG. 3C shows that in response to the number-lock being enabled, the number keycap 307 (e.g., a number one key) becomes disabled. As shown in second force/displacement graph 312 that second electrostatic zipping actuator 306 is operating at 0 V, which makes the key move to a depressed non-selectable state).

In some embodiments, the keyboard key is a numeric key and the determining that the keyboard key should be disabled includes receiving an instruction to disable all numeric keys. For example, FIG. 3C shows that in response to the number-lock being enabled, the number keycap 307 (e.g., a number one key) becomes disabled. For example, when a num lock has been activated, electrostatically-controlled actuators associated with the numeric keys can then be disabled by altering their states, such as by draining off all charge from electrode portions of actuators associated with the numeric keys.

In some embodiments, the electrostatically-controlled actuator is controlled by a processor. In some embodiments, the electrostatically-controlled actuator is coupled with a computing device. For example, FIG. 9 illustrates the electrostatic actuator 902 coupled to the wireless controller 908. In some embodiments, the electrostatically controlled actuator is battery-operated, and is in wireless communication with a computing device.

In some embodiments, the electrostatically-controlled actuator draws a steady state current less than 25 microamps. For example, graph 618, in FIG. 6B, illustrates the current over time of the electrostatic zipping actuator operating at 3100V. In this graph 618 peak currents of ~300 microamps (µA) for the first 100-150 milliseconds (ms) when turned on and close to zero current immediately following being turned on). In some embodiments, the majority of the peak current (~300 µA) drawn in the first 100-150 ms after the voltage is turned on (FIG. 6B). Furthermore, after the voltage is applied even when the actuator is zipped/unzipped with external force, the actuator only draws very low steady state leakage current. Thus, the power requirement of these actuators is quite low with majority of the power required for self-operation of the high voltage DC-to-DC converter. Thus, these actuators are powered with a small battery and are operated in an untethered manner.

In some embodiments, the electrostatically-controlled actuator is coupled to a silicone grounding pad (e.g., FIG. 7 shows an expanded view of an electrostatic zipping actuator, which shows that the electrostatic zipping actuator can be configured to include a pad 701 (e.g., a stepped silicone pad) to provide space for fluid to store when a force is applied (e.g., squeezing a fluid filled pouch between a surface and a finger of a user)).

In some embodiments, the electrostatically-controlled actuator is controlled via a high voltage amplifier. In some embodiments, the high voltage amplifier is a high voltage DC-DC converter. For example, FIG. 6A illustrates a circuit diagram 600 for operating electrostatic-coupled actuator 601 using a high voltage DC-DC converter 610.

In some embodiments, a method of manufacturing an electrostatically-controlled actuator, comprises providing first and second dielectric layers (e.g., dielectric film tabs). In some embodiments, the first and second dielectric layers are substantially identical. For example, the dielectric film tabs are laser cut, CNC cut, or blade cut. In another example, FIG. 11 shows that dielectric film tabs for actuator pouch and insulation are cut to size. FIG. 11 illustrates a method of manufacturing 1100 an electrostatic actuator. While FIG. 11 illustrates a specific set of steps, other arrangements of these steps is conceivable. For example, to aid in the manufacturing process, the placing/printing of carbon electrodes in process 1108 can occur after or before the dielectric film is cut to size in process 1101.

The method of manufacturing comprises printing (e.g., carbon) at least one electrode (e.g., one or more electrodes made from silver, carbon or gold) on (e.g., on parts of, such as respective first exterior sides of) each of the first dielectric layer and the second dielectric layer, such that (i) a first electrode is printed on a portion, less than all, of the first dielectric layer and a second electrode is printed on a portion, less than all, of the second dielectric layer. In other words, the respective printed electrodes do not occupy the entireties of the dielectric layers, instead some portion of each dielectric layer is just a dielectric layer and does not have an electrode printed on top of it. As explained elsewhere in this description, this allows for the zipping and unzipping of the actuator, since an electrostatic force at the electrodes closes/zips only part of an actuator pouch, but not all of it. The method of manufacturing comprises coupling the first and second dielectric layers (e.g., along at least two distinct edges), such that the first and second dielectric layers form an actuator pouch, the actuator pouch including an open end. In some embodiments, the tabs are impulse heat-sealed, ultrasonic heat sealed, flatbed heat sealed. In some embodiments, the electrodes oppose each other and are (e.g., stacked). In some embodiments, the coupling and printing operations can be performed in various orders, such that the coupling step can precede the printing step, and vice versa.

The method of manufacturing comprises, distributing a predetermined amount of a dielectric substance (e.g., fluid, air, fluid-acting substance) into the actuator pouch via the open end. In some embodiments, respective electrodes are separated from the dielectric substance by way of the first or the second dielectric layer.

The method of manufacturing comprises, sealing the open end of the actuator pouch such that the predetermined amount of the dielectric substance is sealed within the actuator pouch; and while minimizing the amount of air in the pouch. In some embodiments, the dielectric fluid is kept in place under gravity while the vacuum is pulled for non-volatile dielectric fluids.

The method of manufacturing comprises, coupling a (e.g., flexible printed circuit) first conductor to the first electrode and a second conductor to the second electrode. In some embodiments, the conductors can be flexible cables that are impulse heat-sealed onto the electrodes. One flexible printed circuit cable is coupled to the first electrode and another flexible printed circuit cable is coupled to the second electrode.

In some embodiments, the electrodes are coupled to the bottom and top of the actuator pouch. Alternatively, in some embodiments the carbon electrodes are coupled and not printed on a stretched sheet of Stretchlon. Advantages of printed electrode include a superior flat attachment to the dielectric sheet (e.g., Stretchlon sheet), and has better bonding of electrode to substrate. Printing is also more scalable for mass-production as opposed to applying using non-printed methods. Non-printed electrodes can wrinkle, which reduces performance of the electrode. In some embodiments, actuator includes printed silver electrodes that are sintered with the substrate and substrate (Stretchlon) with printed electrodes. In some embodiments, the top and bottom each have least four layers (not including the flexible printed circuit board). In some embodiments, the electrostatically-controlled actuator can include multiple electrodes, where a single electrode can simulate multiple objects (e.g., a user can feel the key they are selecting as well as adjacent keys).

In some embodiments, the method of manufacturing comprises, disposing an insulating layer over at least the portion of the first dielectric layer and over at least the portion of the second dielectric layer. In some embodiments, there are at least two insulating layers. In some embodiments, a first insulating layer of the at least two or more insulating layers is disposed over a portion of the first electrode and a portion of the first conductor (e.g., flexible printed circuit cable), and a second insulating layer of the at least two or more insulating layers is disposed over a portion of the second electrode and a portion of the second conductor (e.g., flexible printed circuit cable). In some embodiments, a first layer is a Stretchlon dielectric insulation film, and a second layer is a Kapton insulation layer. An additional dielectric layer is used to insulate the electrodes such that the actuator can be directly touched without any concern for safety or shock to the user. Further, an additional insulation layer of Kapton tape on each side that encapsulates the regions where the cables are connected, and electrodes could be exposed at the heat-sealing edges. In some embodiments, additional insulating layers may be stacked on each other (e.g., a second insulating layer may be stacked on the insulating layer). In some embodiments, each layer of the stacked insulating layers can be made of different materials. In some embodiments, a first material is dielectric film, and a second material is Kapton. In some embodiments, the first material is a dielectric ink that can be screen printed on the actuator pouch.

In some embodiments, the method comprises coupling a controller to the first and second conductors, and the controller is configured to control provision of a voltage to the first conductor or the second conductor. In some embodiments, the first and second electrodes on the first dielectric layer and the second dielectric layer, when the controller provides a voltage via the first and second conductors, respectively, are attracted via an electrostatic force to one another such that the first and second electrodes are drawn to each other only at the portions of the first and second dielectric layers, respectively. In some embodiments, a voltage provided at the first side has a positive polarity and a voltage provided at the second side has a negative polarity. In particular, the electrodes are drawn to each other (e.g., "zips") when high voltage is applied across the two electrodes due to the electrostatic attraction between the two electrodes. This zipping action pushes the dielectric fluid inside the actuator to the non-electrode side of the pouch.

In some embodiments, while the voltage is present at the first and second electrodes, responsive to a force applied over another portion of the first dielectric layer or the second dielectric layer, the force satisfying a separation-force threshold, the portion of the first dielectric layer and the portion of the second dielectric layer are separated from each other causing the predetermined amount of the dielectric substance to move within the actuator pouch. For example, this can create a key press sensation and can replace the use of mechanical switches for keyboard keys, and can also be used to generate various different types of key press sensations (e.g., harder or softer presses to activate a key) and can also create various haptic feedback responses. The change in the voltage has one or more characteristics such as a voltage, a phase, a frequency. In some embodiments, the change in the voltage includes a capacitance value. The applied force results in the unzipping which causes the force offered to drop suddenly leading to the button press haptic sensation. In some embodiments, the applied force results in a displacement of about 1.4 mm. In particular, when the inflated pouch is pressed on an external surface the fluid pressure inside the pouch increases and beyond a certain pressure the actuator unzips and the fluid is then pushed to the electrode side. This unzipping causes the force offered by the actuator to drop suddenly leading to the button press haptic sensation. These actuators can achieve the presented F-D characteristics endogenously (passively) with minimal active control. In some embodiments, the voltage is removed when a force satisfying the force threshold is applied, and then re-applied when the force is removed.

In some embodiments, the separation-force threshold is less than 0.6 N. In some embodiments, the separation-force threshold is defined by a user. In some embodiments, the actuator pouch can endogenously (passively) simulate the force-displacement characteristics of a keyboard key closely (snap ratio of ~70%) and can be modulated on-the-fly to render keys with different stiffness profiles based on their operational voltage.

In some embodiments, a continued separation force required to keep separating the portion of the first dielectric layer from the portion of the second dielectric layer dielectric is at least 70 percent less compared to the separation-force threshold. For example, instantaneous unzipping of the actuator once the external force applied on the pouch reaches a certain level creates a bump in the force-displacement profile (snap ratios of ~70%, where snap ratio is defined as the ratio of the force threshold to a second force less than the force threshold). For example, the actuator captures the key features of the force-displacement profile including the range of forces and displacements as well the drop in the force after the initial peak, which is important for haptic confirmation of the key press.

In some embodiments, the predetermined amount of dielectric is pushed back into the first end of the of the actuator pouch, the second end of the actuator pouch is configured to be displaced in a vertical direction a predetermined distance. The predetermined distance is 1.4 mm. The predetermined distance is defined by a user. After the force satisfying the force threshold is removed from the second end of the of the actuator pouch, the voltage provided at the two or more electrodes causes the predetermined amount of dielectric fluid to be (instantly or near instantaneously) pushed back into the second end of the of the actuator pouch collapsing the first end and expanding the second end. The actuator pouch resets the threshold after each press. The actuator pouch returns to its original shape and is configured to receive an additional response. The predetermined amount of dielectric fluid is pushed back into the second end of the of the actuator pouch in less than 238 ms. The zipping time of the actuator is governed by the applied voltage, actuator geometry, dielectric film and fluid characteristics and high voltage circuit resistance. In some embodiments, WPM (words per minute) can also be transformed into keystrokes per hour (kph) using these general guidelines: 40 wpm=10,000 kph; 50 wpm=12,500 kph; 60 wpm=15,000 kph (i.e., 2500 kph for every additional 10 wpm). Assuming the goal is 70-80 wpm=the actuator pouch refills in between 0.18 seconds and 0.2 seconds (approximately).

In some embodiments, the voltage, after the force has been applied, is configured to be provided by the controller at a predetermined frequency that causes the actuator pouch to vibrate, thereby providing a haptic response. In some embodiments, actuator can also be actuated at higher frequencies (up to ~250 Hz) to provide a vibration as another mode of haptic feedback that can be useful to simulate contact onset and end of key stroke. The high frequency actuation requires a high voltage amplifier capable of delivering larger currents to quickly charge and discharge the actuator (amplifier claimed below). In some embodiments, higher frequency vibrations in glove can cause the actuator to vibrate and micro zip. In some embodiments, force/capacitive feedback can be used to figure out when to provide vibration feedback In some embodiments, the controller is configured to cause the actuator pouch to provide the haptic response and vibrate simultaneously. The developed glove can deliver both the key press and vibration feedback simultaneously to further make the key press snappier and more realistic.

In some embodiments, the controller is configured to detect a change in the voltage to determine a capacitance value. In some embodiments, the voltage is based on a combination of an actuation signal (i.e., the voltage signal) and a low amplitude and high frequency sensing signal. For example, by measuring the voltage and current of the actuator and determining their amplitude and phase shift between the two waveforms, the capacitance of the actuator can be estimated.

In some embodiments, the controller is configured to use the change in the voltage is to determine the force provided based, at least in part, on the capacitance value provided by a force-displacement-capacitance model. In some embodiments, it is possible to estimate the force output of the actuator for a given estimated capacitance and applied voltage by learning a force-displacement-capacitance model of the actuator. See also FIG. 10 illustrating capacitance sensing using the actuator that can be used to infer the actuator displacement and force output for a given applied voltage based on a learned capacitance-force-displacement model of the actuator.

In some embodiments, the controller is configured to use the change in the voltage to determine the force provided based, at least in part, on a displacement of the actuator pouch and the voltage. In some embodiments, the force output of the actuator is a function of the actuator displacement and applied voltage.

In some embodiments, the controller is configured to detect a change in the voltage for contact-sensing (or displacement-sensing) purposes. In some embodiments, the change in the voltage is used as a control signal for causing a system including the actuator response to perform an action. The actuator can be used as continuous capacitive sensors for contact-onset, displacement, and contact force sensing.

In some embodiments, the first electrode printed on the portion of the first dielectric layer is one of a plurality of first electrodes and the second electrode printed on the portion of the second dielectric layer is one of a plurality of second electrodes, wherein voltages provided to the plurality of first electrodes are configured to be independently controlled and voltages provided to the plurality of second electrodes are configured to be independently controller.

For example, different voltages can be applied to each electrode to create various electrostatic attractive forces, which then causes each pair of electrodes to be actuated (i.e., separated from one another due to a force applied elsewhere over the actuator pouch) based on application of different levels of force (i.e., a first electrode may be zipped tighter than a second electrode). Additionally, or alternatively, in some embodiments, the electrodes can be put in different configurations. For example, the top and bottom portions of the actuator pouch can each have 4 individual electrode that provide a distinct sensed response. In some embodiments, each individual electrode is provided distinct voltage that is actuated at a different pressure. For example, FIG. 5A-5C illustrate actuators with different electrode configurations to achieve different haptic sensations. Similarly, actuators with more than two electrodes can be actuated at different voltages and at different times to generate different types of key press haptic sensations.

In some embodiments, the portion of the first dielectric layer and the portion of the second dielectric layer are both in contact with the dielectric substance (e.g., the printed electrodes are inside the actuator pouch in direct contact with the dielectric fluid). In some embodiments, larger change in actuator capacitance can be achieved with this inverted configuration. In some embodiments, the inverted configuration reduces the signal-to-noise ratio in sensing data (e.g., when the actuator is used as a capacitive sensor).

In some embodiments, the predetermined amount of the dielectric substance is selected during manufacturing of the electrostatically-controlled actuator based on dimensions of the actuator pouch.

In some embodiments, the dimensions of the actuator pouch include a width of approximately 16 mm and a length of approximately 35 mm. In some embodiments, the predetermined amount of the dielectric substance is approximately 225 microliters. The innermost layer consists of a dielectric actuator pouch (e.g., dimensions of 35 mm×16 mm) with a dielectric fluid (e.g., volume of 225 µl) that can be pressed to move the fluid around.

In some embodiments, the predetermined amount of the dielectric substance is one of vegetable oil (e.g., Cargill FR3), silicone oil, and segregated hydrofluoroether (e.g., Novec fluids: Novec 7300, Novec 7500). In some embodiments, the dielectric fluid can be any fluid that has a dielectric constant (preferably) above three.

In some embodiments, the first and second electrodes have a width of approximately 14 mm and a length of approximately 16.5 mm. In some embodiments, at least 4 electrodes are coupled to each side of the actuator pouch, and each electrode has a width of 3.5 mmm and a length of 4 mm. In particular, the next layer consists of conductive electrodes (e.g., dimensions of 16.5 mm×14 mm) on each side of the pouch with their attachment tabs oriented in the opposite direction, to ensure that the high voltage electrodes with opposite polarity are farthest from each other. In some embodiments, approximately means within +/−2 mm of the values discussed herein.

In some embodiments, the first and second dielectric layers are made of one of thermoplastic co-polyester elastomer (e.g., Hytrel® Stretchlon 200), conductive urethane (e.g., conductive TPU), polypropylene (e.g., BOPP), piezo copolymers (e.g., PVDF-TrFE-CTFE). In some embodiments, the dielectric tab can be made of any material that has a high dielectric constant, preferably above five. In alternative embodiments, the printed electrodes are interchanged with carbon tape electrodes. The electrodes can be any conductive substrate that can adhere well to the actuator pouch. The carbon tape electrodes have adhesive on both sides that adhere well to the dielectric film substrate. The printed ink electrodes are sintered in contact with the dielectric substrate.

In some embodiments, coupling the first and second conductors with a high voltage amplifier configured to provide a voltage to one or both of the first electrode and the second electrode. In some embodiments, the high voltage amplifier is a unipolar amplifier capable of generating the voltage in a single polarity. In some embodiments, the high voltage amplifier is a bipolar amplifier capable of generating the voltage in both a positive and negative polarity.

In some embodiments, several different dielectric films (Stretchlon, TPU, BOPP, Conductive TPU and PVDF-TrFE-CTFE) and dielectric fluids (Cargill FR3, Novec 7300 and Novec 7500) for prototyping these actuators. While most of these dielectric material combinations resulted in functional zipping actuators, each has different pros and cons for a wearable actuator. In some embodiments, BOPP works only with FR3 fluid, requires excessively high voltage (~6-10 kV) for the actuator to function and is therefore, not safe for use in a wearable. In some embodiments, TPU has higher zipping initiation voltage than the other substrates and therefore, requires relatively higher voltages for the actuator to function. Conductive TPU has low dielectric strength and therefore, cannot be used to achieve desired force output. In some embodiments, PVDF-TrFE-CTFE has low zipping initiation voltage (~0.8 kV) with FR3 and showed the highest force output at low voltages, however, has poor mechanical tensile strength and low dielectric strength. Also, it shows an unzipping issue with Novec 7300 and immediately unzips after zipping under DC actuation. In some embodiments, Stretchlon has the right combination of dielectric properties (dielectric constant and strength and conductivity) and good tensile strength. Stretchlon with Novec 7500 showed low zipping initiation voltage and good force output at medium voltages (2-3.1 kV) and therefore, was chosen as the dielectric substrate for these actuators. In some embodiments, Stretchlon is a vacuum bagging material and its use as a dielectric material for zipping electrostatic actuators for the first time in this work. Furthermore, use of Novec 7500 over Novec 7300 with Stretchlon reduced the operational voltage of the actuator from ~5 kV to below 3 kV. This dielectric fluid also reduced the zipping initiation voltage by a factor of ~4 (from ~2 kV to <0.5 kV) without affecting the leakage current, which is important for operating these actuators on a battery with long runtime. In some embodiments, Stretchlon is not just a dielectric, but also has electrostatic characteristics. Stretchlon has higher conductivity than most other dielectrics.

In some embodiments, tape electrodes require care during assembly to avoid any wrinkles in the electrode and ensure alignment of the tape with respect to the actuator pouch. In some embodiments, printed electrodes typically form a better interface as the ink is uniformly in close contact with the substrate, and can be precisely aligned with respect to the actuator pouch during the printing process and have better adhesion than tape electrodes. This approach to manufacturing would make the overall process readily scalable for high throughput device fabrication with better contact and adhesion between the electrode and the substrate. This results in more robust and better performing actuators. Furthermore, complex electrode shapes (e.g., multi-electrode actuators) are achievable using the printed approach. The requirements on printed electrodes are thick-film (micron scale), high-conductivity, limited patterning (millimeters), and good adhesion on the substrates. These are compatible with film characteristics produced via screen-printing, stencil printing and dispensing/direct-write printing. Here, screen-printing is used to demonstrate this concept.

In some embodiments, properly insulating electrostatic actuators for use in a wearable is critical to ensure that these can operate robustly and safely in close proximity to the user without causing any electric shock. In some embodiments, to insulate the actuators, especially the high voltage electrodes, from the user, another layer of dielectric film is used which is heat-sealed on top of the actuator along with the electrodes to fully encapsulate the actuator. In some embodiments, an additional layer of Kapton tape with adhesive is used to further insulate the heat-sealed regions and the attachment region of the flexible cable to ensure complete insulation. In some embodiments, Kapton tape provides mechanical strain relieving of the flexible cable and ensure that tugging on the cable during use of the actuator does not result in any mechanical failure of the actuator. Also, in some embodiments, instead of heat-sealing dielectric film for insulation, dielectric inks can also be screen printed on these actuators, which can help achieve precise alignment between the different layers and save the additional heat-sealing steps of insulating the actuator.

In some embodiments, an impulse heat-sealing approach to manufacturing these actuators was developed, which uses localized heating and bonding of the dielectric films. One advantage of using this approach over other heat-sealing or bonding techniques is that it only requires localized heating of the substrate, where other techniques can alter the dielectric or mechanical properties of the full actuator substrate as well make the heat sealing of the pouch with dielectric liquid in it more challenging. In some embodiments, printing and lamination techniques can also be used to manufacture the insulation layers in the device as well as the electrical connectors to the DC converter, leading to a higher throughput and more automated production process. In some embodiments, the presented electrostatic zipping actuator consists of several different layers of substrates that are assembled together to achieve a functional actuator.

In some embodiments, exploration of different actuator geometries showed that zipping initiation voltage and force output of electrostatic actuators depend on their pouch geometry and electrode configuration. For example, actuators with longitudinal configuration resulted in lower zipping voltages and higher force output as compared to the lateral configuration. In some embodiments, the unzipping phenomenon in these actuators show a distinct instability, similar to that of a keyboard key, in that the actuator unzips instantaneously beyond a certain force level, which creates a bump in the force-displacement (F-D) profile of these actuators. Furthermore, there is a delicate balance between the different actuator and electrode dimensions as well as the volume of dielectric fluid that results in this instability and can be tuned to achieve a desired F-D profile. To optimize the F-D characteristics of these actuators and arrive at a design that matches the F-D profile of a keyboard key, several different combinations of actuators with different lengths, aspect ratios, electrode lengths and dielectric fluid volumes are possible. The optimized actuator endogenously (passively) captures the key characteristics of the F-D profile of a keyboard key. In some embodiments, actuators with more than two electrodes can be developed that can be actuated with different voltages at desired times to generate more rich haptic sensations.

In some embodiments, the F-D characteristics of a laptop keyboard key shows that it exerts a max force of ~0.6 N on the finger and has a displacement of 1.4 mm, before it bottoms out. Literature shows that keyboard key force plays an important role for typing from an ergonomics perspective with higher force levels resulting in higher biomechanical loads on the forearm tendons and muscles resulting in higher muscle activity and quicker fatigue (Rempel et al., Ergonomics 1997). In some embodiments, the F-D characterization of the developed actuator with Stretchlon as the dielectric substrate and Novec 7500 as the dielectric fluid shows that the force and displacement ranges of this actuator are comparable to that of a mechanical keyboard key (FIGS. 8A-8B). In some embodiments, the instantaneous unzipping of the actuator once the external force applied on the pouch reaches a certain level creates a bump in the force-displacement profile (snap ratios of ~70%, where snap ratio is defined as the ratio of P1-P2 to P1 in FIG. 8A), which is very similar to the bump observed in the F-D profile of a physical keyboard key during press and release. This results in a distinct perceived key press sensation that is close to the actual key press from a haptics standpoint. In some embodiments, the stiffness of the actuator can be changed by modulating its operational voltage on-the-fly, with higher voltages rendering higher stiffness levels and vice versa. These features are particularly useful in the context of virtual laptops, where stiffness of the actuator can be programmed on-the-fly and used to simulate other buttons (e.g., power button). Also, when the actuator is turned-off, the force-displacement characteristics change drastically, and the key press sensation is completely gone, thus making it possible to enable or completely disable the key in a programmable manner.

Since an electrostatic actuator is basically an electrical capacitor where the capacitance is a function of the instantaneous displacement of the actuator, it is possible to also use this actuator as a contact/displacement sensor. The capacitance of the actuator can be estimated by applying a voltage signal to the actuator that is a combination of an actuation signal and a low amplitude and high frequency sensing signal. By measuring the voltage and current of the actuator and determining their amplitude and phase shift between the two waveforms, the capacitance of the actuator can be estimated. In some embodiments, since the force output of the actuator is a function of the actuator displacement and applied voltage, it is also possible to estimate the force output of the actuator for a given estimated capacitance and applied voltage by learning a force-displacement-capacitance model of the actuator (e.g., as explained in reference to FIG. 10).

In some embodiments, two types of high voltage amplifiers can be used to drive these actuators: unipolar and bi-polar. In some embodiments, a unipolar amplifier is capable of generating only a single polarity voltage output (positive or negative), whereas a bipolar amplifier can generate both positive and negative voltage output. In some embodiments, an advantage of unipolar amplifier is that their small form-factor can be used to make a completely wireless wearable system. In some embodiments, however, unipolar amplifiers require a bleeder resistor in the circuit, especially when high frequency actuation is required (e.g., for vibrotactile modality). In some embodiments, this is because an electrostatic actuator is a small electrical capacitor (with 10s of pF capacitance), which needs to be quickly discharged when the voltage is turned off. In some embodiments, in a case of a unipolar amplifier where only a one polarity of voltage is used to actuate the device, a resistor in parallel is required to be connected to the actuator to passively discharge it when the voltage is turned off. The presence of this bleeder resistor results in heat losses in the system even during the charging phase of the actuator in a typical always-on bleeder circuit. In some embodiments, a solution to this issue would be to use a switched-bleeder configuration where the bleeder resistor is only introduced in the system during the discharging phase of the actuator. In some embodiments, bipolar amplifiers, on the other hand, though somewhat larger in form-factor do not require any bleeder resistor in the circuit, since the amplifier can generate both positive and negative voltages to actively discharge the electrodes quickly.

Literature shows that on average there is an inter-key interval (timestamps between two keypress events) of 238 (SD=111) ms during typing with an average typing speed of 52 (SD=20) words per minute on modern computer keyboards (Dhakal et al., CHI 2018). In some embodiments, to achieve these rates in the active control scenario, the actuator zipping time of under 238 ms is required assuming that the user completely unzips the actuator every time by pressing it against the physical surface. In some embodiments, for faster unzipping, a bleeder resistor is provided in the high voltage circuit to quickly discharge the actuator when the voltage is removed. In some embodiments, the electrostatically-controlled actuators are capable of fast zipping and unzipping with appropriate bleeder resistance in the circuit. In some embodiments, these actuators can render quick successive key presses since they return to their zipped state as soon as the contact force is removed and can operate endogenously with minimal active control.

In some embodiments, a wearable system for generating a haptic response comprises, a wearable structure configured to be worn by a user. The wearable system includes one or more electrostatically-controlled actuators, each electrostatically controlled actuator including: a high voltage amplifier coupled to an actuator pouch, the high voltage amplifier configured to provide a voltage to at least two opposing electrodes of the actuator pouch, the voltage creating an electrostatic force that attracts the at least two opposing electrodes to one another to close a portion of the actuator pouch and leave another portion of the actuator pouch filled with a dielectric substance (e.g., FIG. 6A illustrates the electrostatic zipping actuator 601 coupled to an amplifier, specifically a high voltage DC-Dc converter 610). The actuator pouch is coupled to a portion of the wearable structure, where the actuator pouch is configured to, upon application of a force satisfying a force threshold at the other portion of the actuator pouch (e.g., FIG. 7 illustrates the electrostatic zipping actuators coupled to a glove 700, and FIGS. 1A-1C illustrate the electrostatic actuator is configured to provide a haptic feedback by allowing fluid to flow to a different area once the electrostatically-controlled actuator unzips): generate a haptic response (e.g., the unzipping of the electrostatically-controlled actuator, as shown in FIG. 1B, provides a haptic feedback), and being to open part of the portion of the actuator pouch such that it fills with the dielectric substance (e.g., the unzipping of the electrostatically-controlled actuator, as shown in FIG. 1B, provides additional space for the fluid to travel). The one or more processors configured to receive data about the opening of the part of the portion of the actuator pouch to provide one or more input commands based on the data to a computing device to cause the computing device to perform the one or more input commands (e.g., FIG. 1B shows the letter "H" being displayed on the virtual display 111). In some embodiments, the one or more processors, are configured to provide instructions to the high voltage amplifier for generating the voltage.

In some embodiments, the force is generated as a user's finger pushes the actuator pouch towards a surface. In some embodiments, the one or more processors are configured to actively adjust the actuator pouch based on the force. For example, FIG. 10A force on-off controller developed for active control of the actuator based on key press force sensing using a Sensel pad. The actuators can achieve the presented F-D characteristics endogenously (passively) with minimal active control. An active on-off controller for the actuator pouches based on force feedback using a sensing pad can further improve the return F-D characteristics of these actuators.

In some embodiments, actively adjusting the actuator pouch based on the force includes, upon detection of the force satisfying the force threshold, providing instructions to the high voltage amplifier to forgo providing the voltage. In some embodiments, the force on-off controller can be configured to turn off the actuator when the pressing force reaches a certain level providing the ability to further shape the F-D profile during the pressing phase and turned on when the pressing force drops below a certain level during the release phase. This provides the ability further improve the snap ratio. Alternatively, or additionally, the operational voltage of the actuators can be continuously modulated to precisely track any F-D profile with active control (e.g., the voltage can be modulated before it is removed or monitored throughout the entire pressing phase).

In some embodiments, actively adjusting the actuator pouch based on the force includes, upon detection of the force satisfying the force threshold being removed (or no longer satisfying the force threshold), providing instructions to the high voltage amplifier to provide the voltage. In some embodiments, the wireless controller has its own firmware and then sends commands to a high voltage DC-DC converter, which scales up the voltage and provides it to the actuator. Furthermore, the current and voltage applied to the actuator is also measured in the controller to enable more advanced control schemes and ensure safe operation of the device.

In some embodiments, the wearable system further comprises a battery configured to power at least the high voltage amplifier and the one or more processors of the wearable system. For example, FIG. 9 illustrates a control architecture for the wireless battery-operated electrostatic zipping actuator glove with high voltage DC-DC converter. In some embodiments, the wearable system is a completely untethered battery-operated and wirelessly controlled glove with an electrostatic actuator that can render a key press sensation on a fingertip. In some embodiments, the battery is a coin-cell battery and operation of the presented electrostatic actuator uses a high voltage DC-DC converter. In some embodiments, a bleeder resistor is provided for quick discharging of the capacitive actuator once the voltage is turned off.

In some embodiments, the processor is configured to provide a steady state current less than 25 µA to the electrostatically-controlled actuator during operation. In some embodiments, the majority of the peak current (~300 µA) drawn in the first 100-150 ms after the voltage is turned on (FIG. 6B). Furthermore, after the voltage is applied even when the actuator is zipped/unzipped with external force, the actuator only draws very low steady state leakage current. Thus, the power requirement of these actuators is quite low with majority of the power required for self-operation of the high voltage DC-to-DC converter. Thus, these actuators are powered with a small battery and operate these in an untethered manner.

In some embodiments, the wearable system further comprises a silicone pad grounding the electrostatically-controlled actuator. In some embodiments, the glove includes an integrated electrostatic actuator with a silicone pad grounding and a wirelessly (Bluetooth) operated battery powered wrist form factor controller. In some embodiments, a computing device is caused to perform the one or more input commands in an artificial-reality environment.

In some embodiments, the force satisfying the force threshold is predicted based on a determination that a user's finger is in proximity to a virtual keyboard in the artificial-reality environment. In some embodiments, to simulate a virtual keyboard, these actuators are activated as soon as the fingers are in close proximity to the virtual keyboard in AR/VR and endogenously provide the haptic feedback of a key press. In some embodiments, the high voltage amplifier is a high voltage DC-DC converter.

In some embodiments, electrostatic zipping actuator is grounded to the finger as a programmable key for AR/VR applications. In some embodiments, the unzipped state of the ES actuator is where the dielectric fluid is distributed throughout the heat-sealed pouch (i.e., no voltage is provided). In some embodiments, the zipped state of the ES actuator is such that the dielectric fluid is pushed towards the distal finger phalange (i.e., a voltage is provided). In some embodiments, the finger pressing against the external surface causing the ES actuator to unzip due to the appreciable force exerted from the finger, thus, rendering the desired haptic key press sensation (i.e., contact between the electrodes caused by the voltage is broken).

One of the concerns that often comes up about electrostatic actuators, in general, is the requirement of unusually high voltages for their operation. However, what is overlooked is the fact that these operate at incredibly low currents. As per the IEC 62368 standard, devices that require less than 2 mA of current can potentially operate at any voltage and are not likely to cause any injury to the human in case of direct contact with the high voltage line. In some embodiments, these actuators only draw very small currents (<300 µA) for the first 100-200 ms and then close to zero current after that and therefore, follow class I safety standards (FIG. 6B). The power is only required when the actuator is turned on and then for as long as the actuator is used it does not consume any significant power. In some embodiments, the system includes a current limiting feature, which ensures that the current remains below the maximum allowable current and is cut off as soon as higher current levels are observed. So, these actuators are safe to be included in wearables from this perspective.

In some embodiments, the glove incorporates a well-insulated version of the actuator and a silicone grounding to ensure that only the desired key press haptic sensation is conveyed to the user. In some embodiments, the bottommost layer of the silicone pad isolates the fluid movement sensation from the finger pad and therefore, no haptic sensation is created as the actuator is turned on or off. In some embodiments, a second layer of silicone pad on top that only exists in the non-electrode portion of the actuator provides a step and ensures that there is space for the fluid to store when the actuator is pressed against an external surface. In some embodiments, the glove offers minimal encumbrance to finger articulation. In some embodiments, the control architecture for this glove includes a host PC from where the voltage commands for the actuator are sent to a wireless controller over Bluetooth.

In some embodiments, the electrostatically controlled actuators can be configured to serve a tri-sensing purposes, which means that they can be used as a contact sensor, a capacitive sensor, and a displacement sensor.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of adaptively controlling activation of different input elements, comprising:
   detecting that a representation of a user's finger is located within a predefined distance of a first input element;
   in response to detecting that the representation of the user's finger is located within the predefined distance of the first input element:
      obtaining information regarding a first amount of force needed to actuate the first input element; and
      causing adjustment of a physical characteristic of an actuator while it is associated with the first input element such that an input having the first amount of force directed to a component of the actuator would cause activation of the first input element;
   detecting that the representation of the user's finger is located within a predefined distance of a second input element that is distinct from the first input element; and
   in response to detecting that the representation of the user's finger is located within the predefined distance of the second input element:
      obtaining information regarding a second amount of force needed to actuate the second input element, the second amount of force being distinct from the first amount of force; and
      causing adjustment of the physical characteristic of the actuator while it is associated with the second input element such that an input having the second amount of force directed to the component of the actuator would cause activation of the second input element, wherein the second input element is different from the first input element.

2. The method of claim 1, comprising:
   while the actuator is associated with the first amount of force:
      detecting an input having the first amount of force applied by the user's finger to the component of the actuator; and
      activating the first input element to cause an input command to be performed.

3. The method of claim 2, comprising:
   in response to activating the first input element to cause the input command to be performed, displaying a result of the input command in an artificial-reality environment.

4. The method of claim 1, comprising:
   after activating the first input element and while the actuator is associated with the second amount of force:
      detecting an input having the second amount of force applied by the user's finger to the component of the actuator; and
   activating the second input element to cause a different input command, distinct from the input command, to be performed.

5. The method of claim 4, comprising:
   in response to activating the second input element to cause the different input command to be performed, displaying a result of the different input command in an artificial-reality environment.

6. The method of claim 1, wherein causing adjustment of the physical characteristic of the actuator includes:
   causing adjustment of a voltage provided to a portion of the component of the actuator.

7. The method of claim 6, further comprising:
   after the input having the first amount of force is no longer applied by the user's finger to the component of the actuator, providing a first haptic response to the user's finger via the component of the actuator; and
   after the input having the second amount of force is no longer applied by the user's finger to the component of the actuator, providing a second haptic response to the user's finger via the component of the actuator, the second haptic response being distinct from the first haptic response.

8. The method of claim 6, wherein:
   the component of the actuator is a bladder that includes a dielectric substance;
   the portion of the component of the actuator is coupled with two or more electrodes;
   the voltage is adjusted for at least one of the two or more electrodes; and
   the component of the actuator includes an additional portion to which force from the user's finger is applied.

9. The method of claim 8, wherein voltage is independently adjustable at each of the two or more electrodes to cause changes in an amount of force directed to the component of the actuator that would cause activation of a respective input element that is located within the predefined distance of a respective input element.

10. The method of claim 1, comprising:
   detecting that a representation of a different finger of the user is located within an additional predefined distance of a third input element that is distinct from the first and second input elements;
   in response to detecting that the representation of the user's different finger is located within the additional predefined distance of the third input element and while the actuator is associated with the first amount of force or the second amount of force:
      obtaining information regarding a third amount of force needed to actuate the third input element; and
      causing adjustment of a physical characteristic of another actuator while it is associated with the user's different finger such that an input having the third amount of force directed to a component of the other actuator would cause activation of the third input element.

11. The method of claim 1, wherein the first input element and the second input element are presented to the user as virtual keys within an artificial-reality environment.

12. The method of claim 1, wherein the first input element and the second input element is one of: a light switch, a keyboard key on a mobile device, a keyboard key on a detached keyboard, a keyboard key integrated into a housing of a laptop, a trackpad button, or a mouse button.

13. A non-transitory computer-readable storage medium including instructions that, when executed by one or more processors of a computing device, cause the computing device to:
   detect that a representation of a user's finger is located within a predefined distance of a first input element;
   in response to detecting that the representation of the user's finger is located within the predefined distance of the first input element:
      obtain information regarding a first amount of force needed to actuate the first input element; and
      cause adjustment of a physical characteristic of an actuator while it is associated with the first input element such that an input having the first amount of force directed to a component of the actuator would cause activation of the first input element;
   detect that the representation of the user's finger is located within a predefined distance of a second input element that is distinct from the first input element; and
   in response to detecting that the representation of the user's finger is located within the predefined distance of the second input element:
      obtain information regarding a second amount of force needed to actuate the second input element, the second amount of force being distinct from the first amount of force; and
      cause adjustment of the physical characteristic of the actuator while it is associated with the second input element such that an input having the second amount of force directed to the component of the actuator would cause activation of the second input element, wherein the second input element is different from the first input element.

14. A system comprising a computing device and a wearable glove with actuators, the wearable glove configured to be controlled by the computing device, the system configured to:
   detect that a representation of a user's finger is located within a predefined distance of a first input element;
   in response to detecting that the representation of the user's finger is located within the predefined distance of the first input element:
      obtain information regarding a first amount of force needed to actuate the first input element; and
      cause adjustment of a physical characteristic of an actuator while it is associated with the first input element such that an input having the first amount of force directed to a component of the actuator would cause activation of the first input element;
   detect that the representation of the user's finger is located within a predefined distance of a second input element that is distinct from the first input element; and
   in response to detecting that the representation of the user's finger is located within the predefined distance of the second input element:
      obtain information regarding a second amount of force needed to actuate the second input element, the second amount of force being distinct from the first amount of force; and
      cause adjustment of the physical characteristic of the actuator while it is associated with the second input element such that an input having the second amount of force directed to the component of the actuator would cause activation of the second input element, wherein the second input element is different from the first input element.

15. The non-transitory computer-readable storage medium of claim 13, wherein the instructions further cause the computing device to:
   in response to activating the first input element to cause an input command to be performed, display a result of the input command in an artificial-reality environment.

16. The non-transitory computer-readable storage medium of claim 13, wherein the instructions further cause the computing device to:
   in response to activating the second input element to cause a different input command to be performed, display a result of the different input command in an artificial-reality environment.

17. The non-transitory computer-readable storage medium of claim 13, wherein the instructions further cause the computing device to:
   after the input having the first amount of force is no longer applied by the user's finger to the component of the actuator, provide a first haptic response to the user's finger via the component of the actuator; and
   after the input having the second amount of force is no longer applied by the user's finger to the component of the actuator, provide a second haptic response to the user's finger via the component of the actuator, the second haptic response being distinct from the first haptic response.

18. The system of claim 14, wherein the system is further configured to:
   in response to activating the first input element to cause an input command to be performed, display a result of the input command in an artificial-reality environment.

19. The system of claim 14, wherein the system is further configured to:
   in response to activating the second input element to cause a different input command to be performed, display a result of the different input command in an artificial-reality environment.

20. The system of claim 14, wherein the system is further configured to:
- after the input having the first amount of force is no longer applied by the user's finger to the component of the actuator, provide a first haptic response to the user's finger via the component of the actuator; and
- after the input having the second amount of force is no longer applied by the user's finger to the component of the actuator, provide a second haptic response to the user's finger via the component of the actuator, the second haptic response being distinct from the first haptic response.

* * * * *